(12) United States Patent
Bertin et al.

(10) Patent No.: US 7,835,170 B2
(45) Date of Patent: Nov. 16, 2010

(54) MEMORY ELEMENTS AND CROSS POINT SWITCHES AND ARRAYS OF SAME USING NONVOLATILE NANOTUBE BLOCKS

(75) Inventors: Claude L. Bertin, Venice, FL (US); X. M. Henry Huang, Cupertino, CA (US); Thomas Rueckes, Rockport, MA (US); Ramesh Sivarajan, Shrewsbury, MA (US)

(73) Assignee: Nantero, Inc., Woburn, MA (US)

( * ) Notice: Subject to any disclaimer, the term of this patent is extended or adjusted under 35 U.S.C. 154(b) by 655 days.

(21) Appl. No.: 11/835,613

(22) Filed: Aug. 8, 2007

(65) Prior Publication Data
US 2008/0142850 A1 Jun. 19, 2008

Related U.S. Application Data

(63) Continuation-in-part of application No. 11/280,786, filed on Nov. 15, 2005, now Pat. No. 7,781,862, and a continuation-in-part of application No. 11/280,599, filed on Nov. 15, 2005, now Pat. No. 7,394,687, and a continuation-in-part of application No. 11/274,967, filed on Nov. 15, 2005, now Pat. No. 7,479,654.

(60) Provisional application No. 60/918,388, filed on Mar. 16, 2007, provisional application No. 60/855,109, filed on Oct. 27, 2006, provisional application No. 60/840,586, filed on Aug. 28, 2006, provisional application No. 60/836,343, filed on Aug. 8, 2006, provisional application No. 60/836,437, filed on Aug. 8, 2006, provisional application No. 60/692,891, filed on Jun. 22, 2005, provisional application No. 60/692,765, filed on Jun. 22, 2005, provisional application No. 60/692,918, filed on Jun. 22, 2005, provisional application No. 60/679,029, filed on May 9, 2005.

(51) Int. Cl.
*G11C 11/00* (2006.01)

(52) U.S. Cl. ................ 365/148; 365/151; 977/943
(58) Field of Classification Search ................ 365/148, 365/151; 977/943
See application file for complete search history.

(56) References Cited

U.S. PATENT DOCUMENTS
6,057,637 A 5/2000 Zettl et al.
(Continued)

FOREIGN PATENT DOCUMENTS
EP 0036802 3/1981
(Continued)

OTHER PUBLICATIONS

Bachtold et al., "Logic Circuits Based on Carbon Nanotubes," published 2003. Physica, pp. 42-46.*
(Continued)

*Primary Examiner*—Dang T Nguyen
*Assistant Examiner*—Alexander Sofocleous
(74) *Attorney, Agent, or Firm*—Wilmer Cutler Pickering Hale and Dorr LLP

(57) ABSTRACT

Under one aspect, a covered nanotube switch includes: (a) a nanotube element including an unaligned plurality of nanotubes, the nanotube element having a top surface, a bottom surface, and side surfaces; (b) first and second terminals in contact with the nanotube element, wherein the first terminal is disposed on and substantially covers the entire top surface of the nanotube element, and wherein the second terminal contacts at least a portion of the bottom surface of the nanotube element; and (c) control circuitry capable of applying electrical stimulus to the first and second terminals. The nanotube element can switch between a plurality of electronic states in response to a corresponding plurality of electrical stimuli applied by the control circuitry to the first and second terminals. For each different electronic state, the nanotube element provides an electrical pathway of different resistance between the first and second terminals.

21 Claims, 46 Drawing Sheets

U.S. PATENT DOCUMENTS

| | | | |
|---|---|---|---|
| 6,128,214 A | 10/2000 | Kuekes et al. | |
| 6,256,767 B1 | 7/2001 | Kuekes et al. | |
| 6,277,318 B1 | 8/2001 | Bower et al. | |
| 6,314,019 B1 | 11/2001 | Kuekes et al. | |
| 6,342,276 B1 | 1/2002 | You | |
| 6,409,567 B1 | 6/2002 | Amey, Jr. et al. | |
| 6,422,450 B1 | 7/2002 | Zhou et al. | |
| 6,423,583 B1 | 7/2002 | Avouris et al. | |
| 6,445,006 B1 | 9/2002 | Brandes et al. | |
| 6,495,116 B1 | 12/2002 | Herman | |
| 6,495,258 B1 | 12/2002 | Chen et al. | |
| 6,515,339 B2 | 2/2003 | Shin et al. | |
| 6,528,020 B1 | 3/2003 | Dai et al. | |
| 6,548,841 B2 | 4/2003 | Frazier et al. | |
| 6,630,772 B1 | 10/2003 | Bower et al. | |
| 6,645,628 B2 | 11/2003 | Shiffler, Jr. et al. | |
| 6,706,402 B2 | 3/2004 | Rueckes et al. | |
| 6,707,098 B2 | 3/2004 | Hofmann et al. | |
| 6,759,693 B2 | 7/2004 | Vogeli et al. | |
| 6,803,840 B2 | 10/2004 | Hunt et al. | |
| 6,808,746 B1 | 10/2004 | Dai et al. | |
| 6,809,465 B2 | 10/2004 | Jin | |
| 6,833,558 B2 | 12/2004 | Lee et al. | |
| 6,858,197 B1 | 2/2005 | Delzeit | |
| 6,863,942 B2 | 3/2005 | Ren et al. | |
| 6,888,773 B2 | 5/2005 | Morimoto | |
| 6,889,216 B2 * | 5/2005 | Nugent | 706/15 |
| 6,890,780 B2 | 5/2005 | Lee | |
| 6,894,359 B2 | 5/2005 | Bradley et al. | |
| 6,899,945 B2 | 5/2005 | Smalley et al. | |
| 6,905,892 B2 | 6/2005 | Esmark et al. | |
| 6,918,284 B2 | 7/2005 | Snow et al. | |
| 6,919,592 B2 | 7/2005 | Segal et al. | |
| 6,919,740 B2 | 7/2005 | Snider | |
| 6,921,575 B2 | 7/2005 | Horiuchi et al. | |
| 6,924,538 B2 | 8/2005 | Jaiprakash et al. | |
| 6,946,410 B2 | 9/2005 | French et al. | |
| 6,955,937 B1 | 10/2005 | Burke et al. | |
| 6,969,651 B1 | 11/2005 | Lu et al. | |
| 6,990,009 B2 | 1/2006 | Bertin et al. | |
| 6,995,649 B2 | 2/2006 | Nugent | |
| 7,015,500 B2 * | 3/2006 | Choi et al. | 257/40 |
| 7,057,402 B2 | 6/2006 | Cole et al. | |
| 7,095,645 B2 * | 8/2006 | Pinkerton et al. | 365/151 |
| 7,115,901 B2 | 10/2006 | Bertin et al. | |
| 7,115,960 B2 | 10/2006 | Bertin et al. | |
| 7,161,403 B2 | 1/2007 | Bertin et al. | |
| 7,566,478 B2 * | 7/2009 | Ward et al. | 427/249.1 |
| 2001/0004979 A1 | 6/2001 | Han et al. | |
| 2001/0023986 A1 | 9/2001 | Mancevski | |
| 2002/0160111 A1 | 10/2002 | Sun et al. | |
| 2002/0175390 A1 | 11/2002 | Goldstein et al. | |
| 2003/0004058 A1 | 1/2003 | Li et al. | |
| 2003/0122111 A1 | 7/2003 | Glatkowski | |
| 2003/0177450 A1 | 9/2003 | Nugent | |
| 2003/0200521 A1 | 10/2003 | DeHon et al. | |
| 2004/0005723 A1 | 1/2004 | Empedocles et al. | |
| 2004/0007528 A1 | 1/2004 | Bakajin et al. | |
| 2004/0023253 A1 | 2/2004 | Kunwar et al. | |
| 2004/0031975 A1 | 2/2004 | Kern et al. | |
| 2004/0041154 A1 * | 3/2004 | Watanabe et al. | 257/77 |
| 2004/0043527 A1 | 3/2004 | Bradley et al. | |
| 2004/0071949 A1 | 4/2004 | Glatkowski et al. | |
| 2004/0099438 A1 | 5/2004 | Arthur et al. | |
| 2004/0104129 A1 | 6/2004 | Gu et al. | |
| 2004/0132070 A1 | 7/2004 | Star et al. | |
| 2004/0181630 A1 | 9/2004 | Jaiprakash et al. | |
| 2004/0253167 A1 | 12/2004 | Silva et al. | |
| 2004/0265550 A1 | 12/2004 | Glatkowski et al. | |
| 2004/0266106 A1 | 12/2004 | Lee | |
| 2005/0036365 A1 | 2/2005 | Bertin et al. | |
| 2005/0053525 A1 | 3/2005 | Segal et al. | |
| 2005/0056877 A1 | 3/2005 | Rueckes et al. | |
| 2005/0095938 A1 | 5/2005 | Rosenberger et al. | |
| 2005/0212014 A1 | 9/2005 | Horibe et al. | |
| 2006/0183278 A1 | 8/2006 | Bertin et al. | |
| 2006/0237537 A1 | 10/2006 | Empedocles et al. | |
| 2006/0250843 A1 | 11/2006 | Bertin et al. | |
| 2006/0250856 A1 | 11/2006 | Bertin et al. | |
| 2006/0258122 A1 | 11/2006 | Whitefield et al. | |
| 2006/0264053 A1 | 11/2006 | Yates | |
| 2006/0281256 A1 | 12/2006 | Carter et al. | |
| 2006/0281287 A1 | 12/2006 | Yates et al. | |
| 2006/0292716 A1 | 12/2006 | Gu et al. | |
| 2007/0004191 A1 | 1/2007 | Gu et al. | |
| 2008/0012047 A1 | 1/2008 | Bertin et al. | |
| 2008/0142850 A1 | 6/2008 | Bertin et al. | |
| 2008/0157126 A1 | 7/2008 | Bertin et al. | |
| 2008/0159042 A1 | 7/2008 | Bertin et al. | |

FOREIGN PATENT DOCUMENTS

| | | |
|---|---|---|
| GB | 2364933 | 2/2002 |
| JP | 57113296 | 7/1982 |
| JP | 2000-203821 | 7/2000 |
| JP | 2001-035362 A2 | 2/2001 |
| JP | 2004-090208 A2 | 3/2004 |
| WO | WO 98/39250 A1 | 9/1998 |
| WO | WO 99/65821 A1 | 12/1999 |
| WO | WO-0048195 A1 | 8/2000 |
| WO | WO-01/03208 A1 | 1/2001 |
| WO | WO-02/45113 A1 | 6/2002 |
| WO | WO-02/48701 A2 | 6/2002 |
| WO | WO-03/016901 A1 | 2/2003 |
| WO | WO-03/034142 A1 | 4/2003 |
| WO | WO-2006/122111 | 11/2006 |

OTHER PUBLICATIONS

Chiang et al., "Purification and Characterization of Single-Wall Carbon Nanotubes (SWNTs) Obtained from the Gas-Phase Decomposition of Co (HiPco Process)," published 2001. J. Phys. Chem. B, vol. 105, pp. 8297-8301.*

Cui, J.B. et al., "Carbon nanotube memory devices of high charge storage stability," Applied Physics Letters, vol. 81, No. 17, Oct. 21, 2002, pp. 3260-3262.

Derycke, V. et al., "Controlling doping and carrier injection in carbon nanotube transistors", Applied Physics Letters, vol. 80, No. 15, pp. 2773-2775, Apr. 15, 2002.

Fuhrer, M.S., et al., "High-Mobility Nanotube Transistor Memory," Nano Letters, 2002, vol. 2, No. 7, pp. 755-759.

Javey, A. et al., "High-k dielectrics for advanced carbon-nanotube transistors and logic gates", Nature Materials, vol. 1, pp. 241-246, Dec. 2002.

Kahn, et al., "Solubilization of Oxidized Single-Walled Carbon Nanotubes in Organic and Aqueous Solvents through Organic Derivatization," Nano Letters, 2002, vol. 2, No. 11, 1215-1218, 4 pages.

Langer, et al., "Electrical Resistance of a Carbon Nanotube Bundle," J. Mater. Res., vol. 9, No. 4, Apr. 1994, 6 pages.

Niu, Chunming et al., "High Power Electrochemical Capacitors Based on Carbon Nanotube Electrodes," Appl. Phys. Lett. 70(11), Mar. 17, 1997, pp. 1480-1482.

Novak, J.P. et al., "Nerve agent detection using networks of single-walled carbon nanotubes," Applied Physics Letters, vol. 83, No. 19, Nov. 10, 2003, pp. 4026-4028.

Pradhan, et al., "Electrical Bistability and Memory Phenomenon in Carbon Nanotube-Conjugated Polymer Matrixes," J. Phys. Chem. B, 2006, vol. 110, No. 16, pp. 8274-8277, 4 pages.

Snow, E.S. et al., "Random networks of carbon nanotubes as an electronic material," Applied Physics Letters, vol. 82, No. 13, Mar. 31, 2003, pp. 2145-2147.

Star, A. et al., "Nanoelectronic Carbon Dioxide Sensors," Adv. Mater. 2004, 16, No. 22, Nov. 18, pp. 2049-2052.

Star, A. et al., "Nanotube Optoelectronic Memory Devices," Nano Letters, 2004, vol. 4, No. 9, pp. 1587-1591.

Supplementary European Search Report for EP07840799, completion date of Jan. 25, 2010, 11 pages.

Zhou, Y. et al., "p-Channel, n-Channel Thin Film Transistors and p-n Diodes Based on Single Wall Carbon Nanotube Networks," Nano Letters, 2004, vol. 4, No. 10, pp. 2031-2035.

International Search Report for International Application No. PCT/US07/75520, Mar. 4, 2008 (2 pages).

Ago et al., "Workfunction of Purified and Oxidised Carbon Nanotubes," Synthetic Metals, vol. 103, pp. 2494-2495 (1999).

Ajayan, P. M. et al., "Applications of Carbon Nanotubes", Carbon Nanotubes, vol. 80, pp. 391-425, 2001.

Avouris, P., et al., "Carbon Nanotube Electronics," Chemical Physics, 2002, vol. 284, pp. 429-445.

Banerjee et al., "Functionalization of Carbon Nanotubes with a Metal-Containing Molecular Complex," Nano Letters, vol. 2, No. 1, pp. 49-53 (2002).

Berhan, L. et al., "Mechanical properties of nanotube sheets: Alterations in joint morphology and achievable moduli in manufacturable materials", Journal of Applied Physics, vol. 95, No. 8, pp. 4335-4345, Apr. 15, 2004.

Bonard, J. M. et al., "Monodisperse Multiwall Carbon Nanotubes Obtained with Ferritin as Catalyst", Nano Letters, vol. 2, No. 6, pp. 665-667, 2002.

Cassell, A. M. et al., "Large Scale CVD Synthesis of Single-Walled Carbon Nanotubes", J. Phys. Chem. B, pp. 6484-6492, 1999.

Chen, B. et al., "Heterogeneous Single-Walled Carbon Nanotbue Catalyst Discovery and Optimization", Chem. Mater., vol. 14, pp. 1891-1896, 2002.

Chen, J., et al, "Self-aligned Carbon Nanotube Transistors with Charge Transfer Doping," Applied Physics Letters (2005) 86:123108-1-3.

Chen, J., et al, "Self-aligned Carbon Nanotube Transistors with Novel Chemicsl Doping," IEDM (2004) 04:695-698.

Cheng, H M., "Large-scale and low-cost synthesis of single-walled carbon nanotubes by the catalytic pyrolysis of hydrocarbons", Applied Physics Letters, vol. 72, No. 25, pp. 3282-3284, Jun. 22, 1998.

Chiang, et al., "Purification and Characterization of Single-Wall Carbon Nanotubes," 2001. J. Phys. Chem. B, vol. 105, pp. 1157-1161.

Collins, P. G. et al., "Engineering Carbon Nanotubes and Nanotube Circuits Using Electrical Breakdown", Science, vol. 292, pp. 706-709, Apr. 27, 2001.

Dai, H. et al., "Controlled Chemical Routes to Nanotube Artchitectures, Physics, and Devices", J. Phys. Chem. B, vol. 103, pp. 1126-11255, 1999.

Delzeit et al., "Multilayered metal catalysts for controlling the density of single-walled carbon nanotubes growth," Chemical Physics letters, vol. 348, pp. 368-374, Nov. 16, 2001.

Derycke, V., et al., "Carbon Nanotube Inter- and Intramolecular Logic Gates," Nano Letters, Sep. 2001, vol. 1, No. 9, pp. 453-456.

Desai et al., "Freestanding Carbon Nanotube Specific Fabrication", Proc. of 2005, 5th IEEE Conf., Nanotech, Nagoya, Japan, pp. 1-4, Jul. 2005.

Duan, X. et al., "Nonvolatile Memory and Programmable Logic from Molecule-Gated Nanowires", Nano Letters, vol. 0, No. 0, pp. A-D, 2002.

Franklin, N. R. et al., "An Enhanced CVD Approach to Extensive Nanotube Networks with Directionality", Advanced Materials, 5 pages, 2000.

Haddon et al.,"Purification and Separation of Carbon Nanotubes," MRS Bulletin, , pp. 252-259, Apr. 2004.

Hafner, J. H. et al., "Catalytic growth of single-wall carbon nanotubes from metal particles", Chemical Physics Letters, vol. 296, pp. 195-202, Oct. 30, 1998.

Heinze, S. et al., "Carbon Nanotubes as Schottky Barrier Transistsors", Physical Review Letters, vol. 89, No. 10, pp. 16801-1-106801-4, 2002.

Homma, Y. et al., "Single Walled Carbon Nanotube Growth on Silicon Substrates Using Nanoparticle Catalysts", Jpn. J. Appl. Phys., vol. 41, Pt. 2, No. 1A/B, pp. L89-91, 2002.

Hone, J., "Phonons and Thermal Properties of Carbon Nanotubes", Carbon Nanotubes, Topics Appl. Phys., vol. 80, pp. 273-286, 2001.

Huang, Y., et al, "Logic Gates and Computation from Assembled Nanowire Building Blocks," Science (2001) 294(9):1313-1317.

International Search Authority, International Search Report for PCT/US2005/045316 mailed Sep. 6, 2006, 2 pages.

International Search Report and Written Opinion for International Patent Application PCT/US05/18467, mailed Oct. 1, 2007.

International Search Report, International Searching Authority, for International Application PCT/US05/18539, mailed Sep. 18, 2006, 4 pages.

Javey, A., et al., "Carbon Nanotube Transistor Arrays for Multistage Complementary Logic and Ring Oscillators," Nano Letters, 2002, vol. 2 , No. 9, pp. 929-932.

Jeong et al., "A new purification method of single-wall carbon nanotubes using H2S and O2 mixture gas," Chemical Physics Letters, vol. 344, pp. 18-22, Aug. 17, 2001.

Johnson, R. Colin, "IBM fellow unrolls blueprint for nano", EETimes, Mar. 6, 2006, 3 pages, http://www.eetimes.com/showArticle.jhtml?articleID=181500304.

Joselevich, E., "Vectorial Growth of Metallic and Semiconducting Single-Wall Carbon Nanotubes", Nano Letters, vol. 0, No. 0, A-E, 2002.

Kinaret, J. M. et al,, "A Carbon-nanotube-based nanorelay," Applied Physics Letters, Feb. 24, 2003, vol. 82, No. 8, pp. 1287-1289.

Kong, J. et al., "Chemical vapor deposition of methane for single-walled carbon nanotubes", Chemical Physics Letters, pp. 567-574, Aug. 14, 1998.

Kong, J. et al., "Nanotube Molecular Wires as Chemical Sensors," Science, 2000, vol. 287 pp. 622-625.

Kong, J. et al., "Quantum Interference and Ballistic Transmission in Nanotube Electron Waveguides", The American Physical Society, vol. 87, No. 10, pp. 106801-1-106801-4, Sep. 3, 2001.

Li, J. et al., "Carbon Nanotube Nanoelectrode Array for Ultrasensitive DNA Detection", Nano Letters, vol. 3, No. 5, pp. 597-602, 2003.

Li, Y. et al., "Growth of Single-Walled Carbon Nanotubes from Discrete Catalytic Nanoparticles of Various Sizes", J. Phys. Chem. B, vol. 105, pp. 11424-11431, 2001.

Li, Y. et al., "Preparation of Monodispersed Fe-Mo Nanoparticles as the Catalyst for CVD Synthesis of Carbon Nanotubes", Chem. Mater., vol. 13. pp. 1008-1014, 2001.

Lin, Y., et al, "Novel Carbon Nanotube FET Design with Tunable Polarity," IEDM (2004) 4:687-690.

Luyken, R. J. et al., "Concepts for hybrid CMOS-molecular non-volatile memories", Nanotechnology, vol. 14, pp. 273-276, 2003.

Martel, R., et al, "Carbon Nanotube Field-Effect Transistors and Logic Circuits," DAC 2002, Jun. 10-12, 2002, vol. 7.4, pp. 94-98.

Nerushev, O. A., et al., "Carbon nanotube films obtained by thermal chemical vapour deposition", J. Mater. Chem., vol. 11, pp. 1122-1132, 2001.

Onoa et al., "Bulk Production of singly dispersed carbon nanotubes with prescriped lengths", Nanotechnology, vol. 16, pp. 2799-2803, 2005.

Parikh, K. et al., "Flexible vapour sensors using single walled carbon nanotubes", Sensors and Actuators B, vol. 113, pp. 55-63, 2006.

Peigney, M. et al., "A Study of the Formation of Single- and Double-Walled Carbon Nanotubes by a CVD Method", J. Phys. Chem. B., vol. 105, pp. 9699-9710, 2001.

Qi, P. et al., "Toward Large Arrays of Multiplex Functionalization Carbon Nanotube Sensors for Highly Sensitive and Selective Molecular Detection," Nano Lett. 2003, vol. 3(3), pp. 347-351.

Radosavljevic, M. et al., "Nonvolatile Molecular Memory Elements Based on Ambipolar Nanotube Field Effect Transistors", Nano Letters, vol. 2, No. 7, pp. 761-764, 2002.

Rueckes, et al., "Carbon nanotube-based nonvolatile random access memory for molecular computing", Science, vol. 289, pp. 94-97, Jul. 7, 2000.

Shelimov et al., "Purification of single-wall carbon nanotubes by ultrasonically assisted filtration," Chemical Physics Letters, vol. 282, pp. 429-434, Jan. 23, 1998.

Sotiropoulou, S. et al., "Carbon nanotube array-based biosensor", Anal. Bioanal. Chem, vol. 375, pp. 103-105, 2003.

Valentini, L. et al., "Sensors for Sub-ppm $NO_2$ Gas Detection Based on Carbon Nanotube Thin Films," *Applied Physics Letters*, 2003, vol. 82(6), pp. 961-963.

Wind, S. J. et al., "Fabrication and Electrical Characterization of Top Gate Single-Wall Carbon Nanotube Field-Effect Transistors", 14 pages.

Wind, S., et al, "Vertical Scaling of Carbon Nanotube Field-Effect Transistors Using Top Gate Electrodes," Applied Physics Letters (2002), 80(20):3817-3819.

Zhang et al., "Formation of metal nanowires on suspended signel-walled carbon nanotubes", *Appl. Phys. Lett.*, vol. 77, p. 3015, Nov. 2000.

Zhang, Y. et al., "Metal coating on suspended carbon Nanotubes and its implication to metal-tube interaction", Chemical Physics Letters, vol. 331, pp. 35-41, 2000.

Zhang, Z. et al.,"Select Pathways to Carbon Nanotube Film Growth", Advanced Materials, 4 pages, Jun. 19, 2001.

Zhao, Y. P. et al., Frequency-dependent electrical transport in carbon nanotubes, Physical Review B., vol. 64, pp. 201402-1 to 201402-4, 2001.

\* cited by examiner

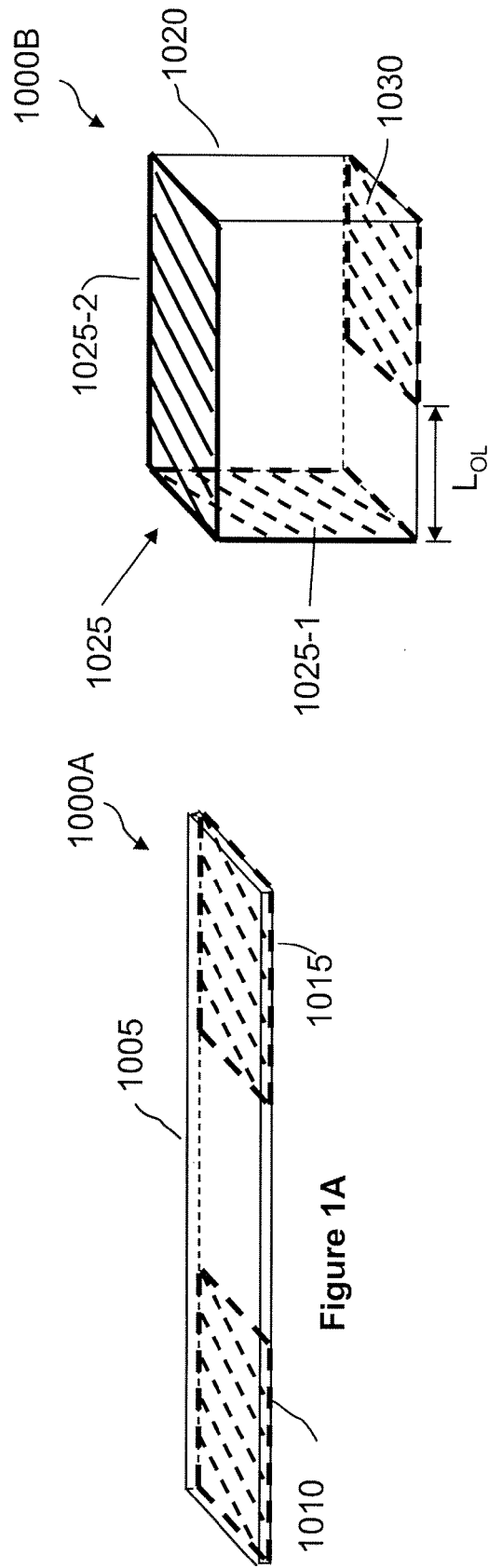
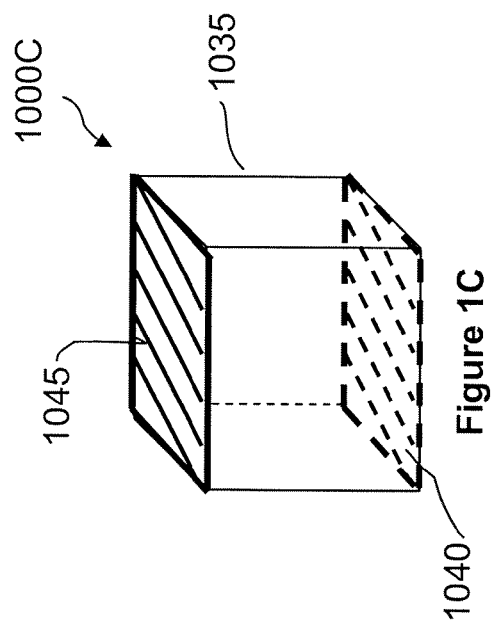
Figure 1A
Figure 1B
Figure 1C

| No | Type of NV NT Storage Node | Switch Number | Figure | Integration Level |
|---|---|---|---|---|
| 1 | 2-D_NV NT Switch | 2000 | 2A | Top Only |
| 2 | 2-D_NV NT Switch – $L_{SW-CH}$ < Contact Spacing | 3000 | 3 | Top Only |
| 3 | 2-D_NV NT Switch _ Insulated | 6000 | 6A | Any Level |
| 4 | 2-D_NV NT Switch _ Insulated | 6020 | 6B | Any Level |
| 5 | 2-D_NV NT Switch _ Insulated | 6040 | 6C | Any Level |
| 6 | 2-D_NV NT Switch _ Insulated | 6060 | 6D | Any Level |
| 7 | 2-D_NV NT Switch: $L_{SW-CH}$ < Contact Spacing _ Insulated | 7000 | 7A | Any Level |
| 8 | 2-D_NV NT Switch: $L_{SW-CH}$ < Contact Spacing _ Insulated | 7050 | 7B | Any Level |
| 9 | 3-D_NV NT Block Switch: $L_{OL}$ < Contact Spacing | 4000 | 4A | Top Only |
| 10 | 3-D_NV NT Block Switch: Insulated | 5000 | 5A | Any Level |
| 11 | 3-D_NV NT Block Switch: $L_{OL}$ < Contact Spacing _ Insulated | 8000 | 8A | Any Level |
| 12 | 3-D_NV NT Block Switch: $L_{OL}$ < Contact Spacing _ Insulated | 8020 | 8B | Any Level |
| 13 | 3-D_Enclosed NV NT Block Switch _ Insulated | 8050 | 8C | Any Level |

Fig. 8D

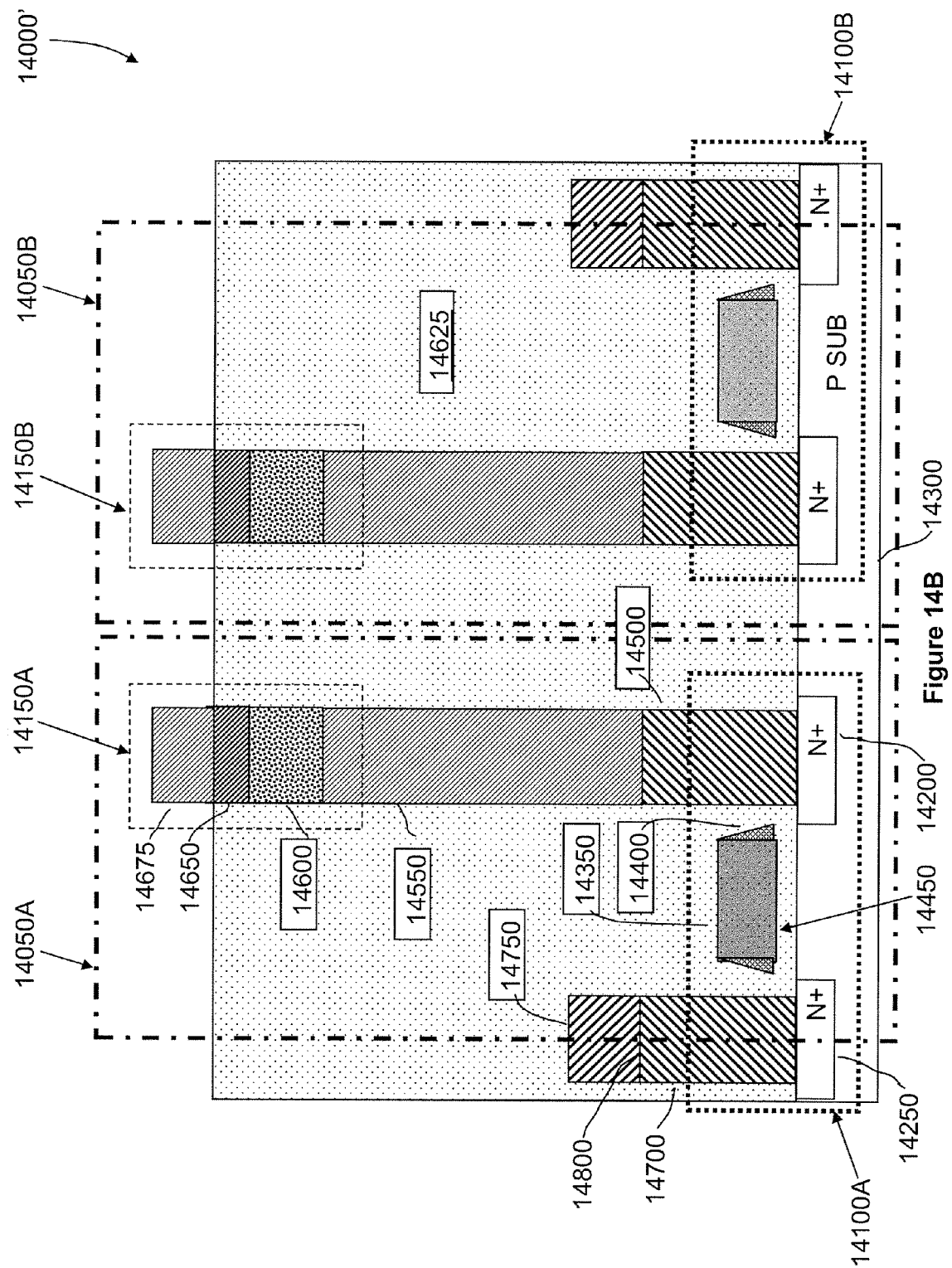

| NV NT Storage Node Type & Placement | At or Near Top of Array | | Fully Integrated Below BLs |
|---|---|---|---|
| | Self Aligned Studs | Non-Self Aligned Studs | |
| NV NT SWITCH | ≈ 20 F² (Table 1: Node #s 1-8) | > 40 F² | ≈ 12-15 F² (Node #s 3-8) |
| NV NT BLOCK SWITCH (TOP/SIDE, & BOTTOM CONTACTS) | ≈ 20 F² | > 40 F² (Table 1: Node #s 9, 11, & 12) | ≈ 12-15 F² (Node #s 11 & 12) |
| NV NT BLOCK SWITCH (TOP & BOTTOM CONTACTS) | ≈ 12-15 F² (Table 1: Node # 10) | > 30 F² | ≈ 6-8 F² (Node # 10) |
| ENCLOSED NV NT BLOCK SWITCH (TOP/ALL-SIDES & BOTTOM CONTACTS) | ≈ 15-20 F² (Table 1: Node # 13) | > 30 – 40 F² | ≈ 12-15 F² (Node # 13) |

Figure 20B

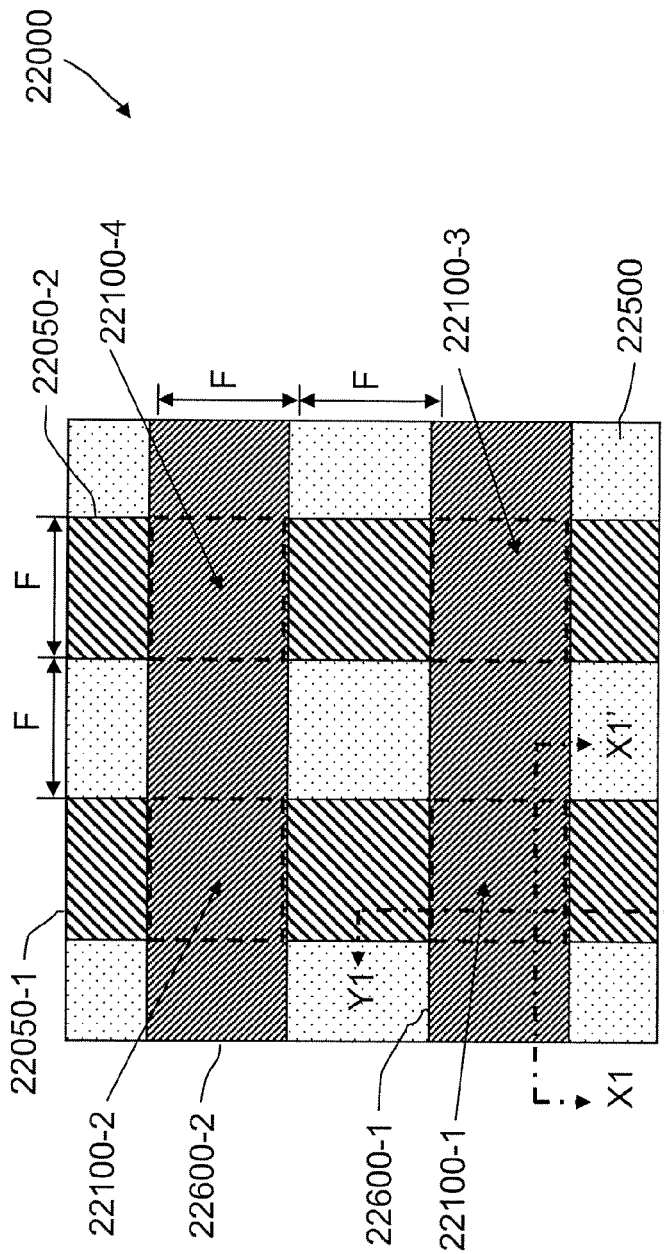
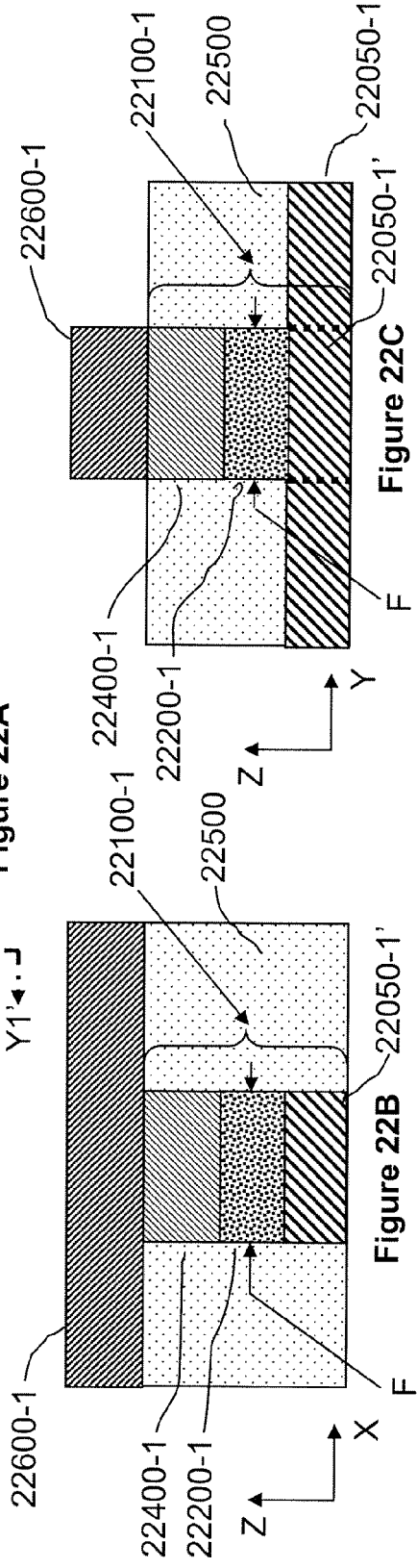
Figure 22A
Figure 22B
Figure 22C

| NV NT Block Switch(s) in ON State | NV Electrically Programmed Wiring (Routing) Connections (Single & Pairs of NV NT Block Switch(s) in an ON State) |
|---|---|
| 22100-1 | V-Wire 22050-1 & H-Wire 22600-1 |
| 22100-2 | V-Wire 22050-1 & H-Wire 22600-2 |
| 22100-3 | V-Wire 22050-2 & H-Wire 22600-1 |
| 22100-4 | V-Wire 22050-2 & H-Wire 22600-2 |
| 22100-1 & 22100-4 | V-Wire 22050-1 & H-Wire 22600-1 V-Wire 22050-2 & H-Wire 22600-2 |
| 22100-2 & 22100-3 | V-Wire 22050-1 & H-Wire 22600-2 V-Wire 22050-2 & H-Wire 22600-1 |
| 22100-1 & 22100-2 | H-Wire 22600-1 & 22600-2 and V-Wire 22050-1 |
| 22100-3 & 22100-4 | H-Wire 22600-1 & 22600-2 and V-Wire 22050-2 |
| 22100-1 & 22100-3 | V-Wires 22050-1 & 22050-2 and H-Wire 22600-1 |
| 22100-2 & 22100-4 | V-Wires 22050-1 & 22050-2 and H-Wire 22600-2 |

Figure 22D

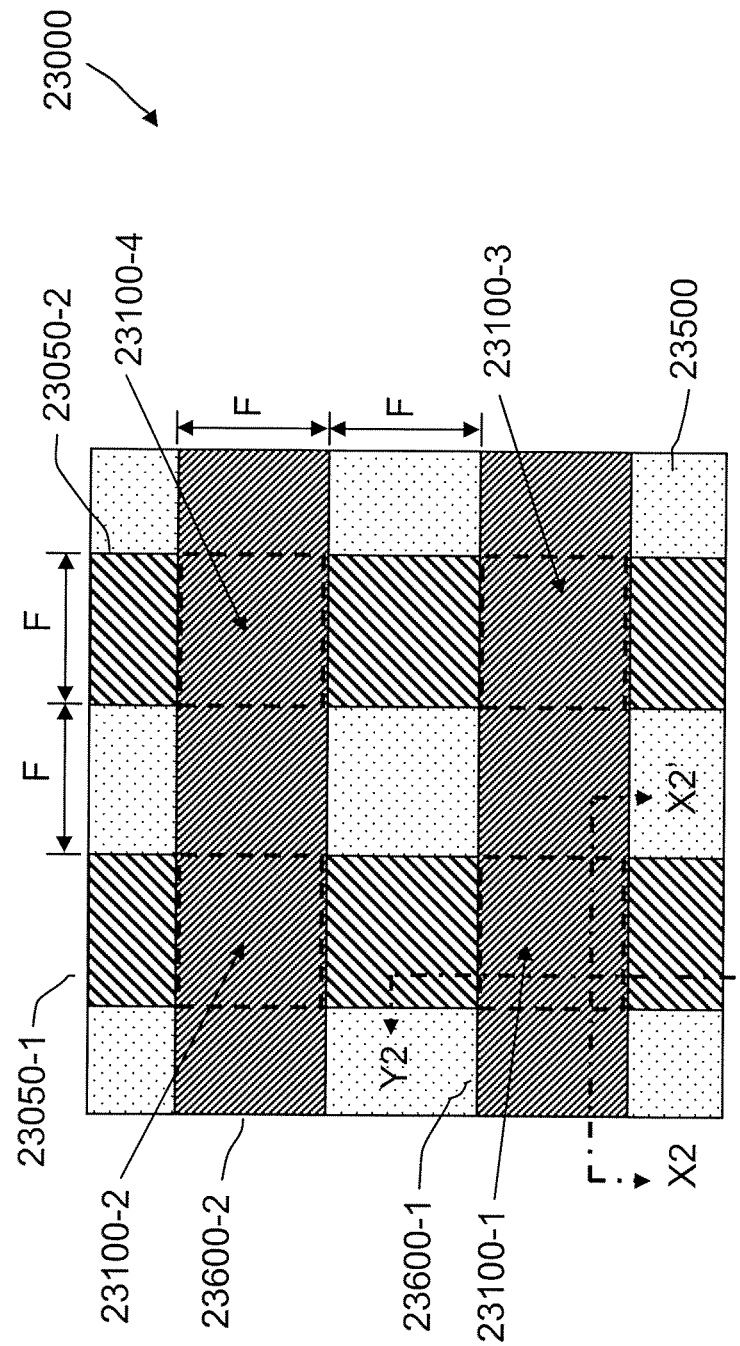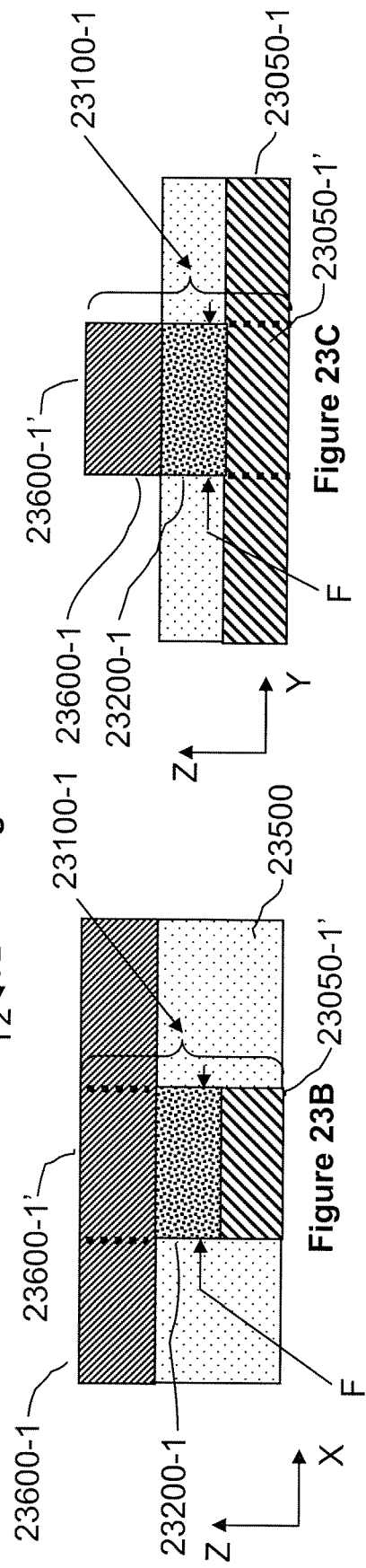
Figure 23A
Figure 23B
Figure 23C

MEMORY ELEMENTS AND CROSS POINT SWITCHES AND ARRAYS OF SAME USING NONVOLATILE NANOTUBE BLOCKS

CROSS-REFERENCE TO RELATED APPLICATIONS

This application claims the benefit under 35 U.S.C. §119 (e) of the following applications, the entire contents of which are incorporated herein by reference:

U.S. Provisional Patent Application No. 60/918,388, entitled "Memory Elements and Cross Point Switches and Arrays of Same Using Nonvolatile Nanotube Blocks," filed on Mar. 16, 2007;

U.S. Provisional Patent Application No. 60/855,109, entitled "Nonvolatile Nanotube Blocks," filed on Oct. 27, 2006;

U.S. Provisional Patent Application No. 60/840,586, entitled "Nonvolatile Nanotube Diode," filed on Aug. 28, 2006;

U.S. Provisional Patent Application No. 60/836,437, entitled "Nonvolatile Nanotube Diode," filed on Aug. 8, 2006;

U.S. Provisional Patent Application No. 60/836,343, entitled "Scalable Nonvolatile Nanotube Switches as Electronic Fuse Replacement Elements," filed on Aug. 8, 2006.

This application is a continuation-in-part of and claims priority under 35 U.S.C. §120 to the following applications, the entire contents of which are incorporated by reference:

U.S. patent application Ser. No. 11/280,786, entitled "Two-Terminal Nanotube Devices And Systems And Methods Of Making Same," filed Nov. 15, 2005;

U.S. patent application Ser. No. 11/274,967, entitled "Memory Arrays Using Nanotube Articles With Reprogrammable Resistance," filed Nov. 15, 2005; and U.S. patent application Ser. No. 11/280,599, entitled "Non-Volatile Shadow Latch Using A Nanotube Switch," filed Nov. 15, 2005.

This application is related to the following applications filed concurrently herewith, the entire contents of which are incorporated by reference:

U.S. patent application Ser. No. 11/835,612, filed Aug. 8, 2007, entitled "Nonvolatile Resistive Memories Having Scalable Two-Terminal Nanotube Switches;"

U.S. patent application Ser. No. 11/835,583, filed Aug. 8, 2007, entitled "Latch Circuits and Operation Circuits Having Scalable Nonvolatile Nanotube Switches as Electronic Fuse Replacement Elements;"

U.S. patent application Ser. No. 11/835,651, filed Aug. 8, 2007, entitled "Nonvolatile Nanotube Diodes and Nonvolatile Nanotube Blocks and Systems Using Same and Methods of Making Same;"

U.S. patent application Ser. No. 11/835,759, filed Aug. 8, 2007, entitled "Nonvolatile Nanotube Diodes and Nonvolatile Nanotube Blocks and Systems Using Same and Methods of Making Same;"

U.S. patent application Ser. No. 11/835,845, filed Aug. 8, 2007, entitled "Nonvolatile Nanotube Diodes and Nonvolatile Nanotube Blocks and Systems Using Same and Methods of Making Same."

U.S. patent application Ser. No. 11/835,852, filed Aug. 8, 2007, entitled "Nonvolatile Nanotube Diodes and Nonvolatile Nanotube Blocks and Systems Using Same and Methods of Making Same;"

U.S. patent application Ser. No. 11/835,856, filed Aug. 8, 2007, entitled "Nonvolatile Nanotube Diodes and Nonvolatile Nanotube Blocks and Systems Using Same and Methods of Making Same;" and U.S. patent application Ser. No. 11/835,865, filed Aug. 8, 2007, entitled "Nonvolatile Nanotube Diodes and Nonvolatile Nanotube Blocks and Systems Using Same and Methods of Making Same."

BACKGROUND

1. Technical Field

The present application is generally related to the field of switching devices and memory elements that include nanotube elements.

2. Discussion of Related Art

Digital logic circuits are used in personal computers, portable electronic devices such as personal organizers and calculators, electronic entertainment devices, and in control circuits for appliances, telephone switching systems, automobiles, aircraft and other items of manufacture. Digital logic circuits include logic and memory functions that may be stand-alone or may be combined (integrated) on the same chip. Ever-increasing amounts of logic and memory are required.

Important characteristics for logic circuit design are short time-to-market, brief error-free design cycles, and the ability to modify logic functions in a field environment to better match application requirements. Cross point switch matrices have been useful in meeting such these requirements. However, cross point switch matrix densities need to be higher and ease of integration needs to be improved.

There is an ever-increasing demand for ever-denser memories that enable larger memory functions, both stand alone and embedded, ranging from 100's of kbits to memories in excess of 1 Gbit. These larger memories require increasingly higher densities, sold in increasing volumes, at lower cost per bit, operating at higher speed, and dissipating less power. These requirements challenging the semiconductor industry to rapidly reduce geometries using improved process features. Increased memory density requires smaller cells which include smaller select transistors and smaller storage nodes. Power dissipation per bit is reduced by using smaller cell sizes.

Integrated circuits constructed from either bipolar or FET switching elements are typically volatile. They only maintain their internal logical state while power is applied to the device. When power is removed, the internal state is lost unless some type of non-volatile memory circuit, such as EEPROM (electrically erasable programmable read-only memory), is added internal or external to the device to maintain the logical state. Even if non-volatile memory is utilized to maintain the logical state, additional circuitry is necessary to transfer the digital logic state to the memory before power is lost, and to restore the state of the individual logic circuits when power is restored to the device. Alternative solutions to avoid losing information in volatile digital circuits, such as battery backup, also add cost and complexity to digital designs.

Devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul., 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

U.S. Pat. No. 6,919,592, entitled "Electromechanical Memory Array Using Nanotube Ribbons and Method for Making Same" discloses, among other things, electromechanical circuits, such as memory cells, in which circuits include a structure having electrically conductive traces and supports extending from a surface of a substrate. Nanotube ribbons that can electromechanically deform, or switch are suspended by the supports that cross the electrically conductive traces. Each ribbon includes one or more nanotubes. The ribbons are typically formed from selectively removing material from a layer or matted fabric of nanotubes.

For example, as disclosed in U.S. Pat. No. 6,919,592, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As disclosed in U.S. Pat. No. 6,911,682, entitled "Electromechanical Three-Trace Junction Devices," three-trace architectures may be used for electromechanical memory cells, in which the two of the traces are electrodes to control the deflection of the ribbon.

The use of an electromechanical bi-stable device for digital information storage has also been suggested (ee U.S. Pat. No. 4,979,149, entitled "Non-volatile Memory Device Including a Micro-Mechanical Storage Element").

The creation and operation of bi-stable, nano-electro-mechanical switches based on carbon nanotubes (including mono-layers constructed thereof) and metal electrodes has been detailed in earlier patent applications having a common assignee as the present application, for example in the incorporated patent references listed below.

SUMMARY

The present invention provides non-volatile memory elements and cross point switches and arrays of same using nonvolatile nanotube elements.

Under one aspect, a covered nanotube switch includes: (a) a nanotube element including an unaligned plurality of nanotubes, the nanotube element having a top surface, a bottom surface, and a plurality of side surfaces; (b) first and second conductive terminals in contact with the nanotube element, wherein the first conductive terminal is disposed on and substantially covering the entire top surface of the nanotube element, and wherein the second conductive terminal contacts at least a portion of the bottom surface of the nanotube element; and (c) control circuitry in electrical communication with and capable of applying electrical stimulus to the first and second conductive terminals, wherein the nanotube element is capable of switching between a plurality of electronic states in response to a corresponding plurality of electrical stimuli applied by the control circuitry to the first and second conductive terminals, and wherein, for each different electronic state of the plurality of electronic states, the nanotube element provides an electrical pathway of corresponding different resistance between the first and second conductive terminals.

One or more embodiments include one or more of the following features. The first conductive terminal is also disposed on and substantially covers at least one side surface of the plurality of side surfaces. The first conductive terminal is also disposed on and substantially covers the plurality of side surfaces. An insulator layer in contact with the bottom surface of the nanotube element, the insulator layer and the second conductive terminal together substantially covering the entire bottom surface of the nanotube element. An insulator layer in contact with at least one of the bottom surface of the nanotube element and one of the side surfaces of the nanotube element. The insulator layer includes one of $SiO_2$, $SiN$, and $Al_2O_3$. A passivation layer overlying at least the first conductive terminal, the passivation layer substantially sealing the first and second conductive terminals and the nanotube element to the environment. The passivation layer includes one of $SiO_2$, $SiN$, $Al_2O_3$, polyimide, phosphosilicate glass oxide, polyvinylidine fluoride, polypropylene carbonate, and polyethylene carbonate. The second conductive terminal contacts substantially the entire bottom surface of the nanotube element. The first and second conductive terminals each include a conductive material independently selected from the group consisting of Ru, Ti, Cr, Al, Al(Cu), Au, Pd, Pt, Ni, Ta, W, Cu, Mo, Ag, In, Ir, Pb, Sn, TiAu, TiCu, TiPd, PbIn, TiW, RuN, RuO, TiN, TaN, $CoSi_x$, and $TiSi_x$.

Under another aspect, a covered nanotube switch includes: (a) a nanotube element including an unaligned plurality of nanotubes, the nanotube element having top and bottom surfaces; (b) first and second conductive terminals in contact with the nanotube element and in spaced relation to each other; (c) a first insulator layer in contact with the top surface of the nanotube element; (d) a second insulator layer in contact with the bottom surface of the nanotube element, wherein the first and second conductive terminals and the first and second insulator layers together substantially surround the nanotube element; and (e) control circuitry in electrical communication with and capable of applying electrical stimulus to the first and second conductive terminals, wherein the nanotube element is capable of switching between a plurality of electronic states in response to a corresponding plurality of electrical stimuli applied by the control circuitry to the first and second conductive terminals, and wherein, for each different electronic state of the plurality of electronic states, the nanotube element provides an electrical pathway of corresponding different resistance between the first and second conductive terminals.

One or more embodiments include one or more of the following features. At least a portion of the first insulator layer is separated from the top surface of the nanotube element by a gap. At least a portion of the second insulator layer is separated from the bottom surface of the nanotube element by a gap. The first and second conductive terminals contact the bottom surface of the nanotube element and wherein the first insulator layer contacts the entire top surface of the nanotube element. The first and second conductive terminals contact the top surface of the nanotube element. The first conductive terminal contacts the bottom surface of the nanotube element and the second conductive terminal contacts the top surface of the nanotube element. The first and second insulator layers each include an insulative material independently selected from the group consisting of $SiO_2$, $SiN$, and $Al_2O_3$. The first and second conductive terminals each include a conductive material independently selected from the group consisting of Ru, Ti, Cr, Al, Al(Cu), Au, Pd, Pt, Ni, Ta, W, Cu, Mo, Ag, In, Ir, Pb, Sn, TiAu, TiCu, TiPd, PbIn, TiW, RuN, RuO, TiN, TaN, CoSi$_x$, and TiSi$_x$.

Under another aspect, a covered nanotube switch includes: (a) a nanotube element including an unaligned plurality of nanotubes, the nanotube element having top and bottom surfaces; (b) first and second conductive terminals in contact with the nanotube element and in spaced relation to each other; (c) a first insulator layer arranged over and in spaced relation to the top surface of the nanotube element; (d) a second insulator layer arranged under and in spaced relation to the bottom surface of the nanotube element, wherein the first and second conductive terminals and the first and second insulator layers together substantially surround the nanotube element; and (e) control circuitry in electrical communication with and capable of applying electrical stimulus to the first and second conductive terminals, wherein the nanotube element is capable of switching between a plurality of electronic states in response to a corresponding plurality of electrical stimuli applied by the control circuitry to the first and second conductive terminals, and wherein, for each different electronic state of the plurality of electronic states, the nanotube element provides an electrical pathway of corresponding different resistance between the first and second conductive terminals.

One or more embodiments include one or more of the following geatures. The first and second insulator layers each include an insulative material independently selected from the group consisting of SiO$_2$, SiN, and Al$_2$O$_3$. The first and second conductive terminals each include a conductive material independently selected from the group consisting of Ru, Ti, Cr, Al, Al(Cu), Au, Pd, Pt, Ni, Ta, W, Cu, Mo, Ag, In, Ir, Pb, Sn, TiAu, TiCu, TiPd, PbIn, TiW, RuN, RuO, TiN, TaN, CoSi$_x$, and TiSi$_x$.

BRIEF DESCRIPTION OF THE DRAWINGS

In the drawings:

FIGS. 1A-1C are perspective drawings of an embodiment of a two terminal nonvolatile nanotube switch (NV NT switch) with bottom contact locations on each end, and two terminal nonvolatile nanotube block switches (NV NT block switches) with combined top/side and bottom contact locations and another with top and bottom contact locations.

FIG. 8D is a summary of the embodiments of NV NT switches and NV NT block switches described in FIGS. 2A-8C that may be used as nonvolatile nanotube storage nodes in memory array cells.

FIG. 14B illustrates a cross section of the memory array cell embodiment illustrated in FIG. 14A.

FIG. 20B shows a comparison of estimated cell areas as a function of the type of nonvolatile nanotube storage node selected and the integration means used, according to some embodiments.

FIGS. 22A-22C illustrate a plan view and two corresponding cross sections of embodiments of cross point switches formed using a first type of top and bottom contact terminal nonvolatile nanotube block switches.

FIG. 22D shows an embodiment nonvolatile electrically programmed wire routing connections corresponding to various ON and OFF combination of nonvolatile nanotube block switches illustrated in FIGS. 22A-22C.

FIGS. 23A-23C illustrate a plan view and two corresponding cross sections of embodiments of cross point switches formed using a second type of top and bottom contact terminal nonvolatile nanotube block switches.

DETAILED DESCRIPTION

Figure 2A:
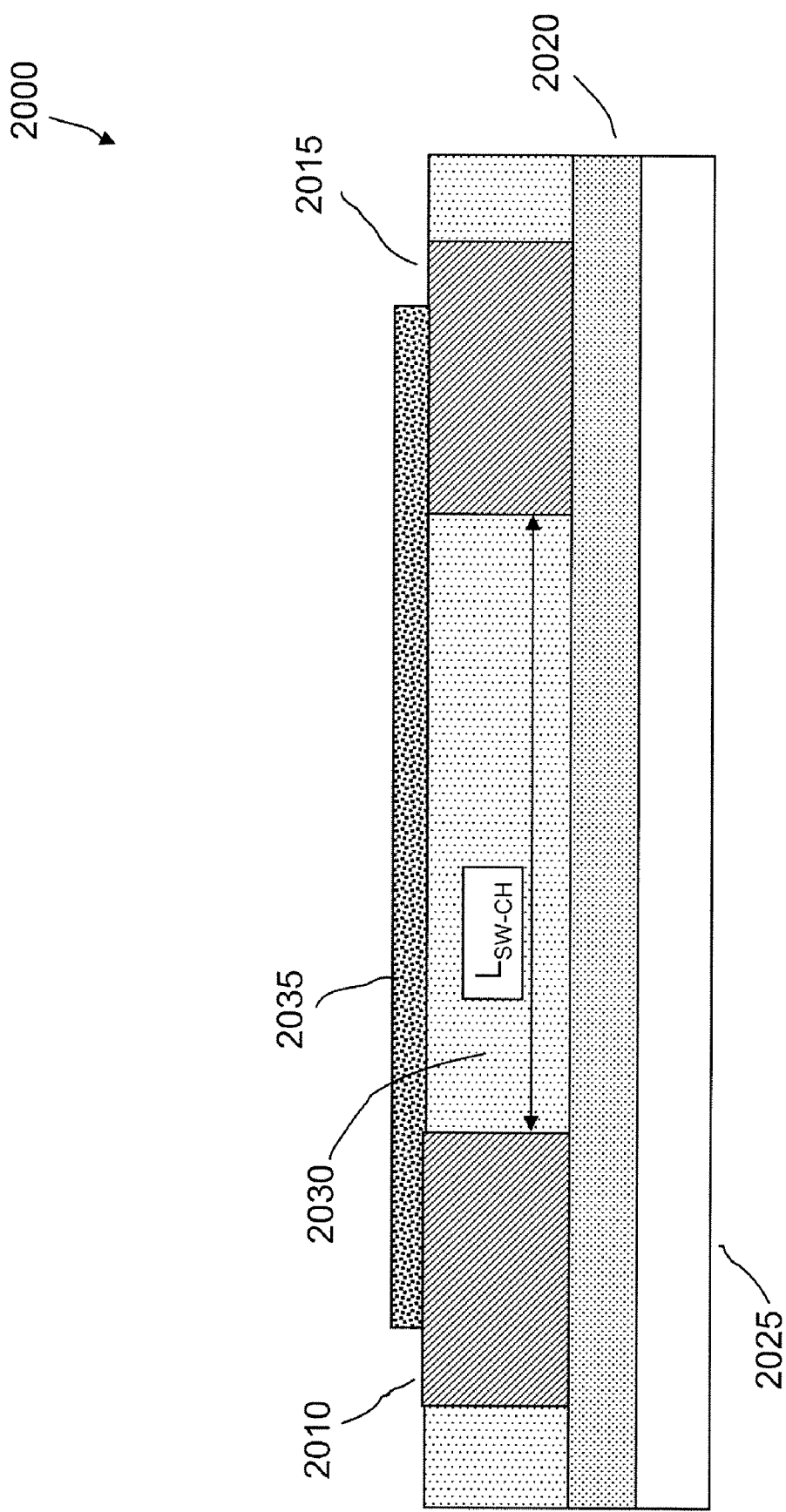
FIG. 2A illustrates an embodiment of a NV NT switch in an essentially horizontal orientation with two bottom contact terminals, each on opposite ends of a patterned nanotube channel element.

Embodiments of the invention provide memory elements and crosspoint switches and arrays of same using non-volatile nanotube blocks. The memory cells and cross point switches include two-terminal nanotube switches, which include a nanotube element such as a nanotube block, in electrical communication with two terminals. The switches are capable of repeated toggling between first and second states in response to electrical stimulus at the two terminals, and thus are capable of storing a memory state or of providing a reprogrammable electrical connection. The use of nanotube "blocks," as contrasted with relatively thin (e.g., 0.5-10 nm) nanotube films, enables the fabrication of relatively high density memory and cross point switch arrays.

Some embodiments provide 2-D cell structures and enhanced 3-D cell structures that enable dense nonvolatile memory arrays that include two terminal nonvolatile nanotube storage nodes. The nodes include 2-D nanotube switches referred to as nonvolatile nanotube switches (NV NT switches) and/or 3-D nanotube switches referred to as nonvolatile nanotube block switches (NV NT block switches). The nodes also include corresponding select transistors such as NMOS FETs (NFETs) that can write logic 1 and 0 states for multiple cycles, read stored logic states, and hold logic states without power applied to the memory node. Some embodiments are scalable to large memory array structures and/or are compatible with CMOS circuit manufacture. While some embodiments combine NMOS FETs with carbon nanotubes, it should be noted that based on the principle of duality in semiconductor devices, PMOS FETs may replace NMOS FETs, along with corresponding changes in the polarity of applied voltages. It should also be noted that two terminal NV NT switch and NV NT block switch operation is independent of the current flow direction through the nanotube and independent of the voltage polarity applied to the respective ends (terminals) of the nanotube. It should be further noted that a CMOS select device consisting of both NFET and PFET devices may also be used instead of NMOS or PFET FET select transistors.

3-D NV NT block switches may be used as nonvolatile nanotube storage nodes in memory cells and as nonvolatile cross point switches in cross point switch matrix applications. In some embodiments, NV NT block switches may be as small as F×F on each side, where F is a minimum technology node dimension, as described in greater detail in U.S. patent application Ser. Nos. 11/835,651, 11/835,759, 11/835,845, 11/835,852, 11/835,856, and 11/835,865, all filed Aug. 8, 2007, entitled "Nonvolatile Nanotube Diodes and Nonvolatile Nanotube Blocks and Systems Using Same and Methods of Making Same."

It should be noted that nanotube-based nonvolatile memory arrays may also be configured as NAND and NOR arrays in PLA, FPGA, and PLD configurations, and that wire routing may also be configured using nanotube-based nonvolatile cross point switches in cross point switch matrices.

Field programmable logic may be reconfigured multiple-times using a combination of nanotube-based nonvolatile memory arrays and cross point switch matrices to form stand-alone and embedded logic functions as well.

2-Dimensional (2-D) Horizontally-Oriented NV NT Switches and 3-Dimensional (3-D) NV NT Block Switches Examples of two-terminal 2-D nonvolatile nanotube switches (NV NT switches) and two terminal 3-D nonvolatile nanotube block switches (NV NT block switches) are described in corresponding Figures and are summarized in FIG. 8D, which is described further below. NV NT switches or NV NT block switches may be formed at or near the top surface of memory arrays for ease of integration, or may be formed in cells close to select transistors for high density (small footprint) as described further below.

For ease of integration, memory cells may use nonvolatile nanotube storage nodes with NV NT switches or NV NT block switches formed (fabricated) at or near a top surface above substantially pre-wired memory cells in which select transistors (typically NFETs) are connected to array word lines (WLs) and bit lines (BLs). A stud interconnects the source of the NFET select transistor to a first terminal of a NV NT switch or NV NT block switch, while a second terminal is connected to a reference array line also referred to as a secondary word line (WWL).

NV NT switches or NV NT block switches at or near the top surface of memory arrays facilitate nanotube switch integration because nearly all growth, deposition, and etch steps required by the semiconductor structure have been completed prior to nanotube deposition and patterning. Integrating nanotube switch structures near the end of the fabrication cycle enables rapid sample preparation since the memory arrays may be conventionally pre-formed to the stage where only nanotube switch formation is needed to complete fabrication. However, in some embodiments, memory cell areas may be substantially larger (50 to 100% or more) in area than the minimum size capable of fabrication using a given technology node F, for example in embodiments where bit lines (BLs) are placed adjacent to NFET select devices instead of over select devices to enable a stud connection between a source of the NFET select transistor and a corresponding switch terminal that is placed above the bit line array in the integrated structure.

Figure 3:
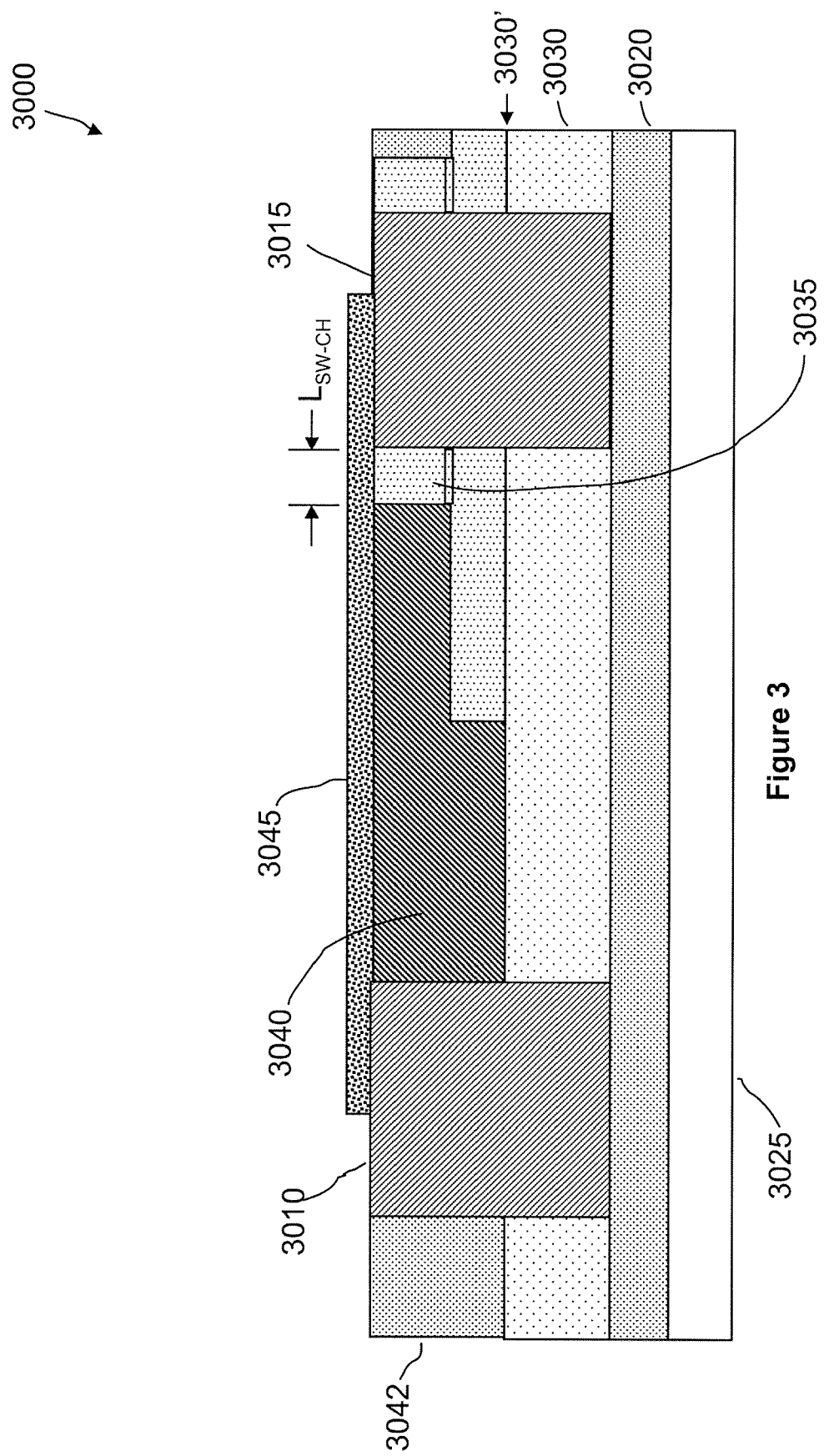
FIG. 3 illustrates an embodiment of a NV NT switch in an essentially horizontal orientation with two bottom contact terminals, each on opposite ends of a patterned nanotube channel element, in which the switch channel length is less than the spacing between contact terminals.
Figure 4A:
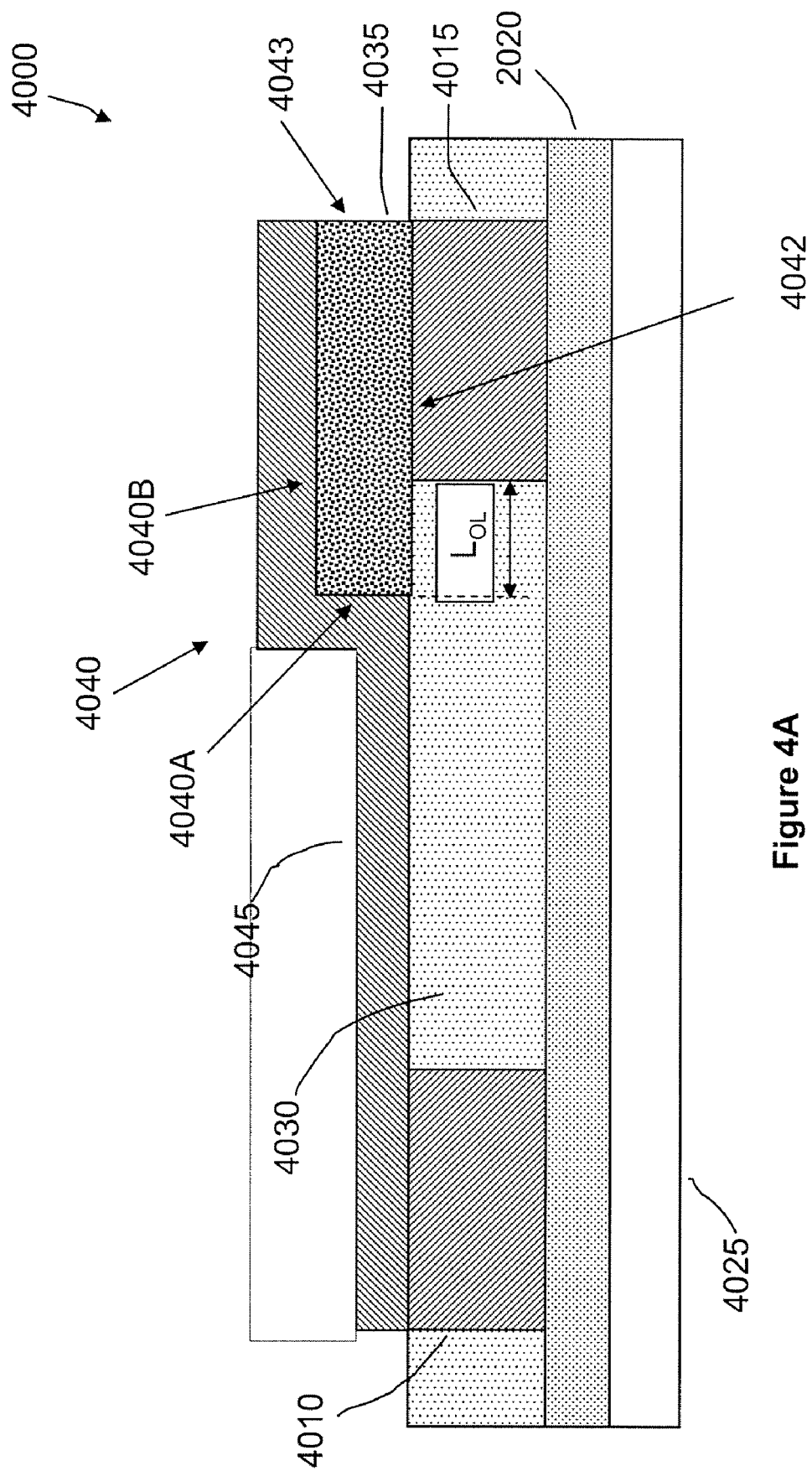
FIG. 4A illustrates an embodiment of a two terminal NV NT block switch of mixed vertical and horizontal orientation, with a bottom contact terminal to a nonvolatile nanotube block (NV NT block) and a combined top and side contact terminal to the NV NT block with an essentially horizontal extension to a second bottom contact terminal.

NV NT switches or NV NT block switches at or near the top surface of memory arrays may be left unpassivated and may be hermetically sealed in a package, tested under typical conditions, and also evaluated for tolerance to harsh environments such as high temperatures and high radiation. Examples of unpassivated switches are illustrated in FIGS. 2A, 3, and 4A described further below.

NV NT switches or NV NT block switches at or near the top surface of memory arrays may be passivated and packaged using conventional packaging means. Such passivated packaged chips may be tested under typical conditions and also evaluated for tolerance to harsh environments such as high temperatures and high radiation. Examples of passivated switches are illustrated in FIGS. 5A, 6A-6D, 7A-7B, 8A-8C as described further below.

Figure 5A:
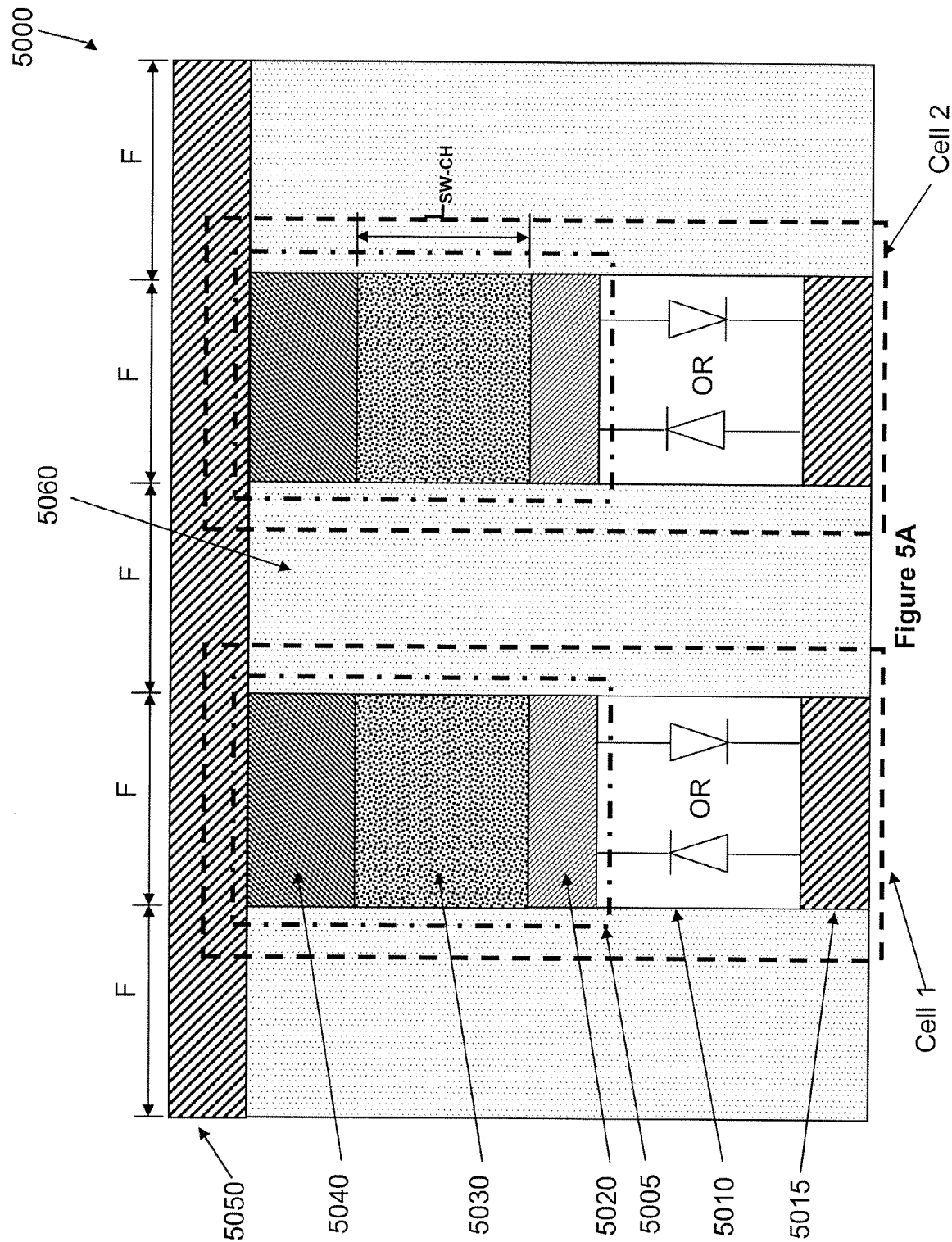
FIG. 5A illustrates an embodiment having a pair of two terminal NV NT block switches of vertical orientation, with a bottom contact terminal and a top contact terminal to a nonvolatile nanotube block (NV NT block).

Passivated NV NT switches or NV NT block switches may also be integrated near an NFET select transistor, below the bit line, to achieve dense memory cells. NV NT block switches with top and bottom contacts, such as illustrated in FIG. 5A, may be integrated in memory cells that are, e.g., 6-8$F^2$ in density, where F is a minimum technology node. Memory cell size (footprint) estimates based on the nanotube switches summarized in FIG. 8D are described in FIG. 20B, as described in greater detail below.

2-D NV NT Switch and 3D NV NT Block Switch Structures

FIGS. 1A-1C illustrate perspective drawings of a thin non-volatile nanotube element (NV NT element) and thicker non-volatile nanotube elements referred to a nonvolatile nanotube blocks (NV NT blocks) with various contact locations. The combination of NV NT elements and contacts form two dimensional (2-D) NV NT switches and the combination of NV NT blocks and contacts form three dimensional (3-D) NV NT block switches as illustrated in FIGS. 1A-1C. 3-D NV NT block switches may be used instead of NV NT switches as nonvolatile nanotube storage nodes (NV NT storage nodes) in memory array cells as well as cross point switches for fabrication advantages and denser memory cell and cross point switch arrays as illustrated further below. NV NT switches and NV NT block switches illustrated in FIGS. 1A-1C are an exemplary subset of possible switch configurations, some embodiments of which are described in, e.g., U.S. patent application Ser. Nos. 11/835,651, 11/835,759, 11/835,845, 11/835,852, 11/835,856 an 11/835,865, entitled "Nonvolatile Nanotube Diodes and Nonvolatile Nanotube Blocks and Systems Using Same and Methods of Making Same," all filed Aug. 8, 2007.

NV NT switch 1000A illustrated in perspective drawing in FIG. 1A shows a NV NT switch with relatively thin (e.g., about 0.5 nm to less than 10 nm) nonvolatile nanotube element 1005 and bottom contact locations 1010 and 1015. Contact locations illustrate where terminals (not shown) contact the surface of nanotube element 1005 as described further below and in U.S. patent application Ser. No. 11/280,786.

NV NT block switch 1000B illustrated in perspective drawing in FIG. 1B shows a NV NT block switch with NV NT block 1020 (e.g., typically 10 nm or greater in any given dimension) with a bottom contact location 1030 and a top/side contact location 1025 including top contact location 1025-2 and side contact location 1025-1. Edges of bottom contact location 1030 and side contact location 1025-1 are separated by an overlap distance $L_{OL}$. Contact locations illustrate where terminals (not shown) contact the surface of NV NT block 1020 as described further below and in U.S. patent application Ser. Nos. 11/835,651, 11/835,759, 11/835,845, 11/835,852, 11/835,856, and 11/835,865, all filed Aug. 8, 2007, entitled "Nonvolatile Nanotube Diodes and Nonvolatile Nanotube Blocks and Systems Using Same and Methods of Making Same."

NV NT block switch 1000C illustrated in perspective drawing in FIG. 1C shows a NV NT block switch with NV NT block 1035 (e.g., 10 nm or greater in any given dimension) with a bottom contact location 1040 and a top contact location 1045. Contact locations illustrate where terminals (not shown) contact the surface of NV NT block 1035 as described further below and in U.S. patent application Ser. No. 11/835,651, 11/835,759, 11/835,845, 11/835,852, 11/835,856, and 11/835,865, all filed Aug. 8, 2007, entitled "Nonvolatile Nanotube Diodes and Nonvolatile Nanotube Blocks and Systems Using Same and Methods of Making Same." 3-D NV NT block switch 1000C occupies a relatively small area (has a relatively small footprint) relative to other embodiments of 3-D NV NT block switches and 2-D NV NT switches.

NV NT switch 1000A corresponds to NV NT switch 2000 illustrated in FIG. 2A further below, where nanotube element 1005A corresponds to nanotube element 2035, contact location 1010 corresponds to the location of contact terminal 2010, and contact location 1015 corresponds to the location of contact terminal 2015.

FIG. 2A, described in more detail in U.S. patent application Ser. No. 11/280,786, illustrates NV NT Switch 2000 including patterned nanotube element 2035 on insulator 2030, which is on the surface of combined insulator and wiring layer 2020, which is supported by substrate 2025. Patterned nanotube element 2035 is a nanofabric on a planar surface, and partially overlaps and contacts terminals (conductive elements) 2010 and 2015. Contact terminals 2010 and 2015 are deposited and patterned directly onto combined insulator and wiring layer 2020, which is on substrate 2025, prior to patterned nanotube element 2035 formation. The nonvolatile nanotube switch channel length $L_{SW-CH}$ is the separation between contact terminals 2010 and 2015. Substrate 2025 may be an insulator such as ceramic or glass, a semiconductor, or an organic rigid or flexible substrate. Substrate 2025 may be also be organic, and may be flexible or stiff. Insulators 2020 and 2030 may be $SiO_2$, SiN, $Al_2O_3$, or another insulator material. Terminals 2010 and 2015 may be formed using a variety of contact and interconnect elemental metals such as Ru, Ti, Cr, Al, Al(Cu), Au, Pd, Ni, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$.

Figure 2B:
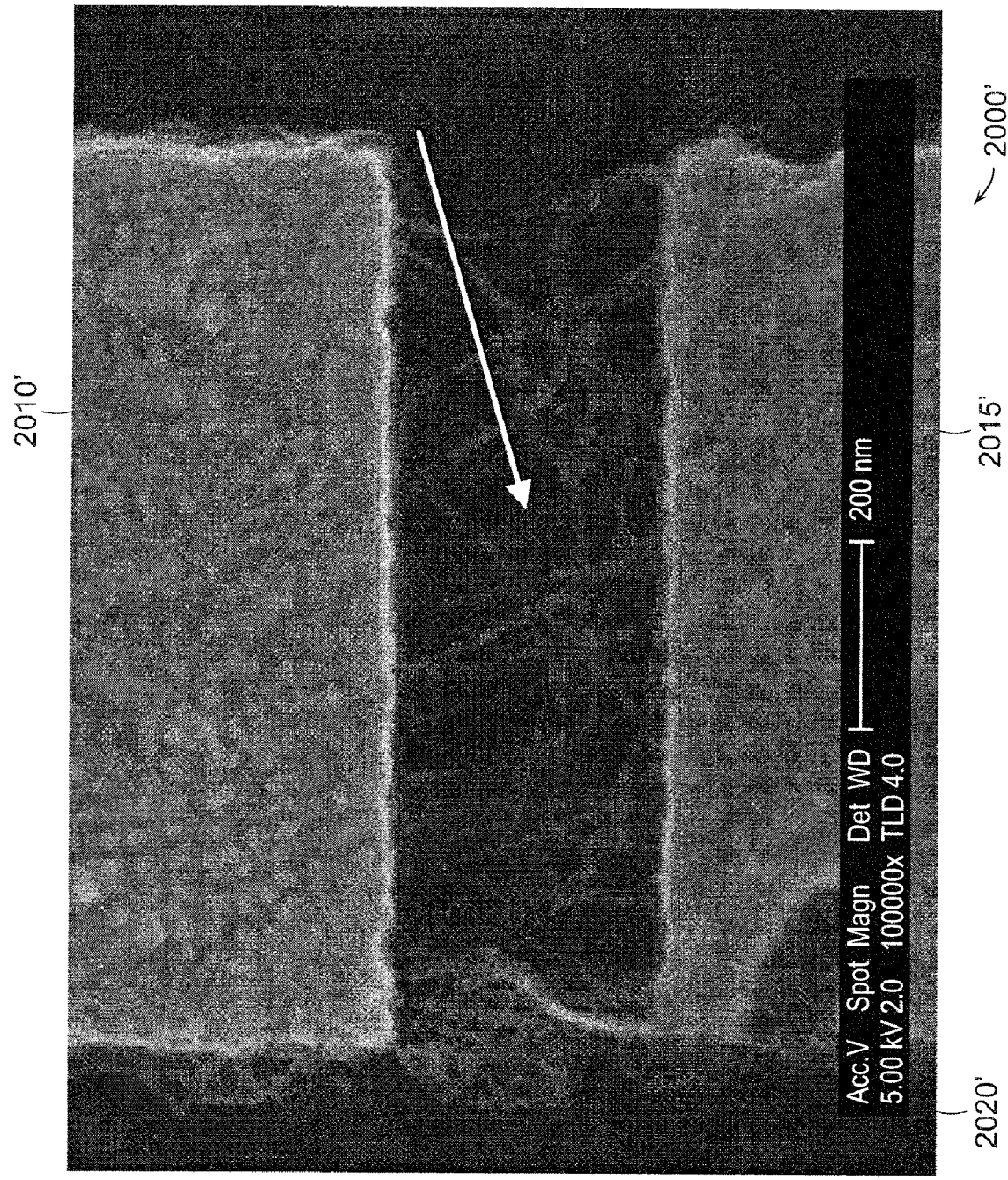
FIG. 2B illustrates an SEM view of an exemplary nonvolatile nanotube switch similar to the nonvolatile nanotube switch embodiment illustrated in FIG. 2A.

FIG. 2B, described in more detail in U.S. patent application Ser. No. 11/280,786, illustrates an SEM image of a nonvolatile nanotube switch 2000' prior to passivation and corresponds to nonvolatile nanotube switch 2000 in the cross sectional drawing in FIG. 2A. Nonvolatile nanotube switch 2000' includes nanofabric element 2035', contact terminals 2010' and 2015' corresponding to contact terminals 2010 and 2015, respectively, and an insulator 2020' corresponding to insulator and wiring layer 2020. Exemplary nonvolatile nanotube switches such as switch 2000' have been fabricated with channel lengths $L_{CHANNEL}$ in the range of 250 nm to 22 nm thereby reducing nonvolatile nanotube switch size and lowering programming voltages, as described in more detail in U.S. patent application Ser. No. 11/280,786, although other suitable channel lengths can be used.

Figure 2C:
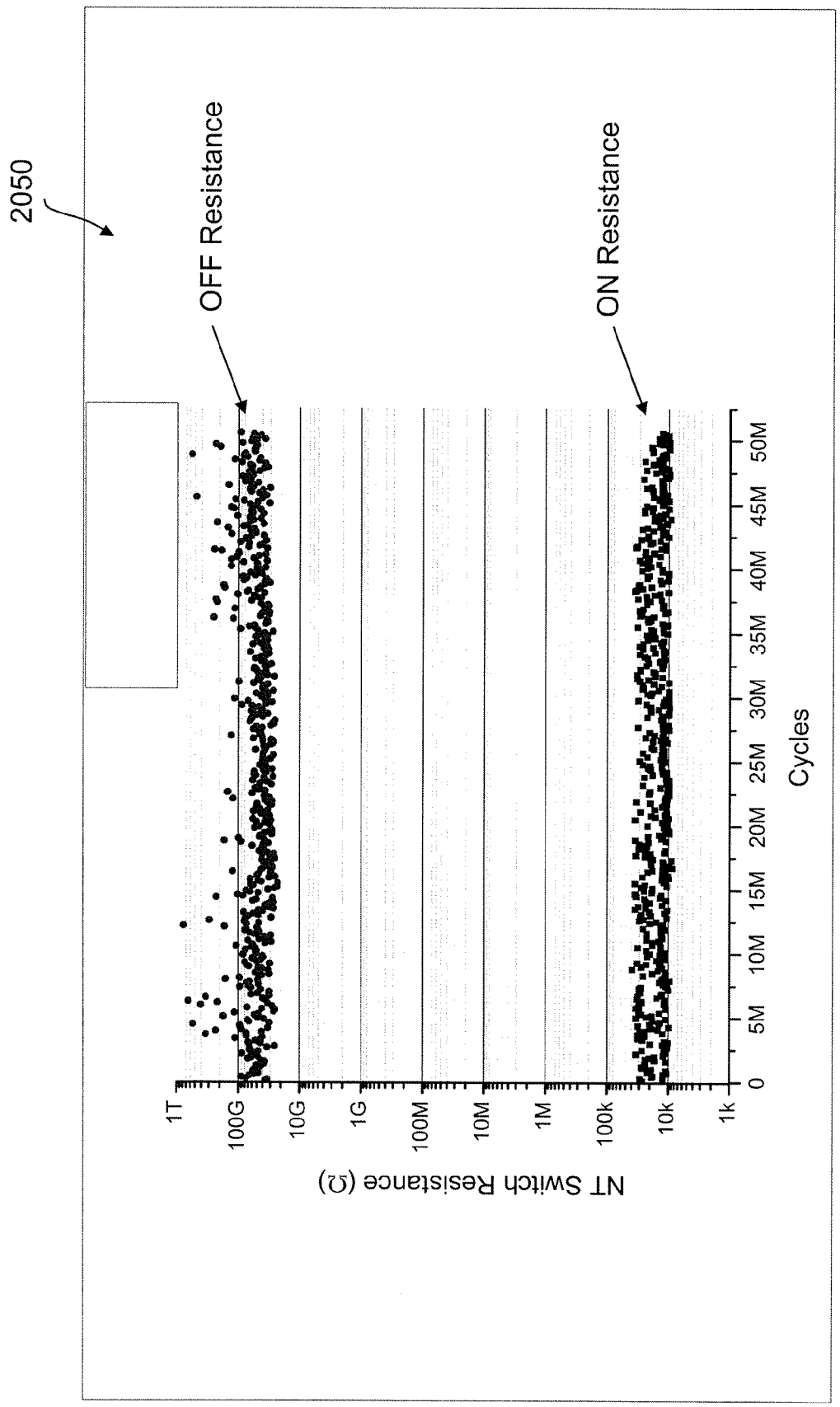
FIG. 2C illustrates the results of cycling data for an exemplary nonvolatile nanotube switch similar to FIG. 2B.

Laboratory testing of individual nonvolatile nanotube switches, described in more detail in U.S. patent application Ser. No. 11/280,786 illustrates that nonvolatile nanotube switches such as switch 2000 illustrated in a cross sectional drawing in FIG. 2A and corresponding to SEM micrograph of NV NT switch 2000' illustrated in FIG. 2B has been cycled more than 50 million times between ON and OFF resistance states as illustrated by graph 2050 in FIG. 2C. The conducting (ON) state resistance is typically in the range of 10 kOhms to 50 kOhms, while the nonconducting (OFF) state resistance typically exceeds 1 GOhm, for a greater than five orders of magnitude separation of resistance values between conducting and nonconducting ON and OFF switch states, respectively. Testing of individual nonvolatile nanotube switches with shorter channel lengths, 50 nm for example, has resulted in lower write 0 and write 1 voltage levels such as 4-5 volts instead of 8 to 10 volts as illustrated in U.S. patent application Ser. No. 11/280,786.

FIG. 3 illustrates NV NT Switch 3000, a modification of NV NT switch 2000 illustrated in FIG. 2A, including patterned nanotube element 3045 supported by and in contact with contact terminals 3010 and 3015, contact terminal extension 3040 in physical and electrical contact with terminal 3010, and insulator 3035. Insulator 3042 completes the planarized structure but is typically not in contact with patterned nanotube element 3045. NV NT switch 3000 has approximately the same overall dimensions as NV NT switch 2000, except that insulators 3030 and 3035 and extended contact terminal 3040 have been added to the basic NV NT switch 2000 structure using known preferred methods of fabrication to reduce NV NT switch 3000 channel length to shorter $L_{SW-CH}$ as illustrated in FIG. 3. Shorter $L_{SW-CH}$ channel length may reduce NV NT switch 3000 operating voltage, as described in U.S. patent application Ser. No. 11/280,786, because $L_{SW-CH}$ length may be in the 5 to 50 nm length range, for example, while contact terminals 3010 and 3015 may be separated by 150 to 250 nm, for example. $L_{SW-CH}$ length is determined in part by the thickness of insulator 3035 as deposited on exposed upper regions of contact terminals 3010 and 3015 using known preferred sidewall spacer methods, such as those described in prior art U.S. Pat. No. 4,256,514 the entire contents of which are incorporated herein by reference. Exposed upper regions of contact terminals 3010 and 3015, between the top surface 3030' of insulator 3030 and the coplanar top surfaces of contact terminals 3010 and 3015, may be in the range of 10 to 500 nm, for example. The top surface 3030' of insulator 3030 may be formed by preferred industry methods of selective directional etch of insulator 3030 to a desired depth below the top surface of coplanar contact terminals 3010 and 3015. Insulator 3030 and contact terminals 3010 and 3030 are in contact with insulator and wiring layer 3020, which is on substrate 3025.

Insulator 3035 is deposited using known preferred industry methods to a thickness corresponding to a desired switch channel length $L_{SW-CH}$ such as 5 to 50 nm, for example, and then patterned using preferred methods.

Next, preferred methods deposit a conductor layer, and preferred methods such as chemical-mechanical polishing (CMP) are applied to combined insulator and conductor layer, such as those described in prior art U.S. Pat. No. 4,944,836 the entire contents of which are incorporated herein by reference. At this point in the process, $L_{SW-CH}$ is defined as shown in FIG. 3, contact terminal 3015 and contact terminal 3010 in contact with contact terminal extension 3040 are also defined.

Next, insulator 3042 is formed using preferred methods of deposition and planarization. Then, preferred methods pattern nanotube element 3045 as described in incorporated patent applications.

Substrate 3025 may be an insulator such as ceramic or glass, a semiconductor, or an organic rigid or flexible substrate. Substrate 3025 may be also be organic, and may be flexible or stiff. Insulators 3020, 3030, 3035, and 3042 may be $SiO_2$, SiN, $Al_2O_3$, or another insulator material. Contact terminals 3010 and 3015 and contact terminal extension 3040 may be formed using a variety of contact and interconnect elemental metals such as Ru, Ti, Cr, Al, Al(Cu), Au, Pd, Ni, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$.

NV NT switches 2000 and 3000 are illustrated without an overlying insulating protective layer. If NV NT switches are formed on the top layer of a semiconductor chip, then no insulation is required for chip operation. However, chips typically are mounted in hermetically sealed packages to ensure protection from mechanical handling and environmental contamination and moisture. If NV NT switches are to be integrated closer to the semiconductor substrate, or not hermetically sealed, then NV NT switches may be protected using insulating layers as described further below with respect to FIGS. 5A, 6A-6D, 7A, 7B, and 8A-8C.

FIG. 4A, described in more detail in U.S. Provisional Patent Application No. U.S. patent application Ser. Nos. 11/835,651, 11/835,759, 11/835,845, 11/835,852, 11/835, 856, and 11/835,865, all filed Aug. 8, 2007, entitled "Nonvolatile Nanotube Diodes and Nonvolatile Nanotube Blocks and Systems Using Same and Methods of Making Same," illustrates a NV NT block switch 4000 corresponding to 3-D NV NT block switch 1000B illustrated in FIG. 1B. Switch 4000 occupies approximately the same area as NV NT switches 2000 and 3000. NV NT block switch 4000 also features NV NT block overlap length $L_{OL}$ which is determined by the separation between bottom contact terminal 4015 and an edge of NV NT block 4035. NV NT block switch 4000 includes a combination of side/top contact 4040 formed by side surface contact 4040A and top surface contact 4040B and bottom surface contact 4042 formed by contact terminal 4015. Bottom surface contact 4042 corresponds to bottom surface contact location 1030 in NV NT block switch 1000B illustrated in perspective drawing in FIG. 1B; side/top surface contact 4040 corresponds to top/side surface contact location 1025, top surface contact 4040B corresponds to top surface contact location 1025-2; side surface contact 4040A corresponds to side surface location 1025-1; and NV NT block 4035 corresponds to NV NT block 1020. An effective overlap length $L_{OL}$ is the distance between the edges of bottom surface contact 4042 and side/top surface contact 4040 described further below. Contact terminal 4010 is connected to side/top surface contact 4040 by conductor 4045. Preferred methods of fabrication may be used to simultaneously deposit and pattern conductor 4045 and surface contact 4040, thereby forming combined conductor/contact 4045/4040 interconnect means. NV NT block side surfaces may be partially defined by preferred methods of directional etching the exposed portions of the nanotube block fabric using combined conductor/contact 4045/4040 as a mask. NV NT block 4035 side surface 4043 (and two other sides not visible in FIG. 4A) are exposed. Methods of etching nanotube fabric layers are described in the incorporated patent references.

Contact terminals 4010 and 4015 are deposited and patterned directly onto combined insulator and wiring layer 2020, which is on substrate 4025, prior to patterned nanotube block 4035 formation. Substrate 4025 may be an insulator such as ceramic or glass, a semiconductor, or an organic rigid or flexible substrate. Substrate 4025 may be also be organic, and may be flexible or stiff. Insulators 2020 and 4030 may be $SiO_2$, SiN, $Al_2O_3$, or another insulator material. Terminals 4010 and 4015 may be formed using a variety of contact and interconnect elemental metals such as Ru, Ti, Cr, Al, Al(Cu), Au, Pd, Ni, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$.

Figure 4B:
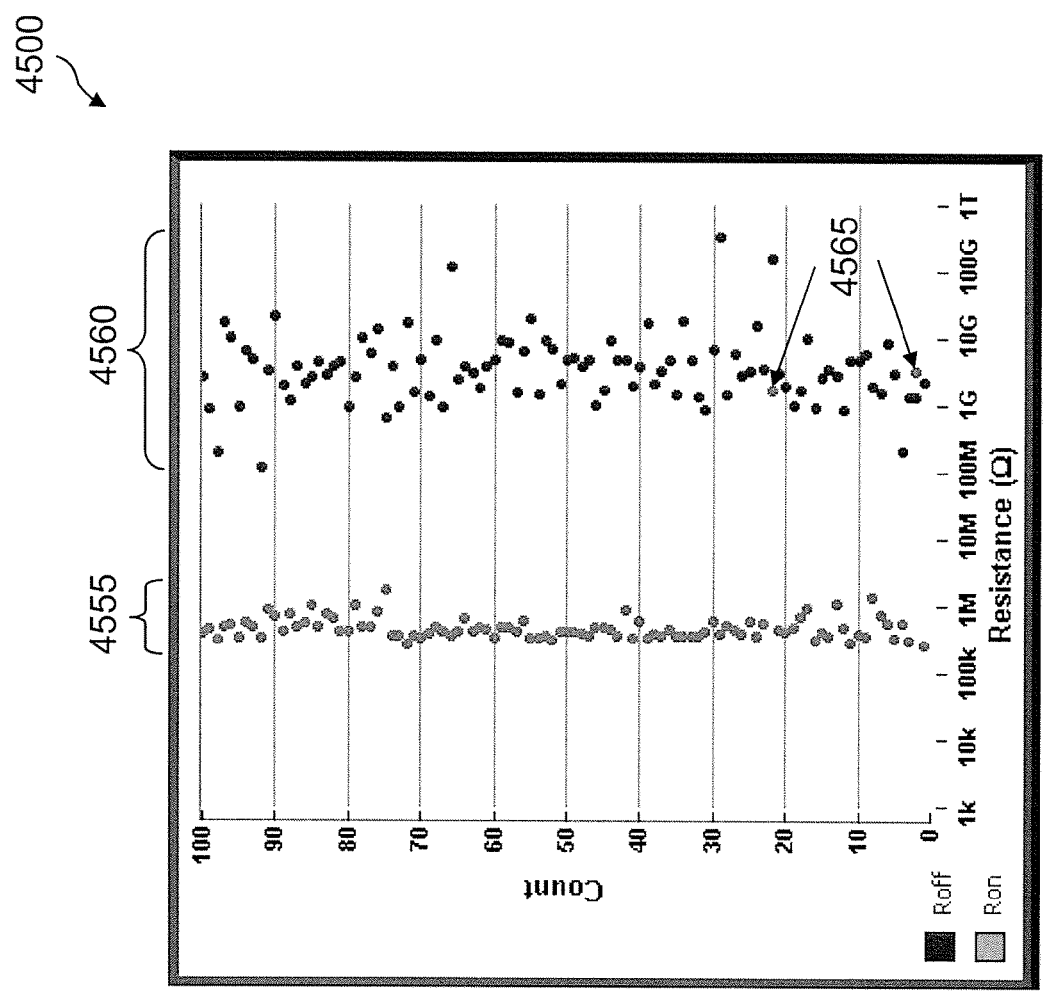
FIG. 4B illustrates the results of cycling data for an exemplary nonvolatile nanotube block switch similar to FIG. 4B.

Laboratory ON/OFF switching test results of an exemplary nonvolatile nanotube block switch corresponding to NV NT block switch 4000 are described with respect to graph 4500 illustrated in FIG. 4B, where write 0 corresponds to erase and results in a high resistance OFF state, and write 1 corresponds to program and results in a low resistance ON state. Test conditions and results are described in more detail in the incorporated patent references. Graph 4500 illustrates results of electrical tests that apply one write 0 voltage pulse of 6 volts, one write 1 voltage pulse of 6 V, and measure ON resistance at each ON/OFF cycle for 100 cycles. ON resistance values 4555 are typically in the 120 kOhm to 1 MOhm range and OFF resistance values 4560 are typically above 100 MOhms with most values above 1 GOhms. In two cases, ON resistance values 4565 exceeded 1 GOhm indicating failure to switch to the ON state.

FIG. 5A illustrates two identical memory cells, cell 1 and cell 2, of a 3-D diode-steering memory array described further in U.S. patent application Ser. Nos. 11/835,651, 11/835,759, 11/835,845, 11/835,852, 11/835,856, and 11/835,865, all filed Aug. 8, 2007, entitled "Nonvolatile Nanotube Diodes and Nonvolatile Nanotube Blocks and Systems Using Same and Methods of Making Same." Cell 1 (identical to cell 2) includes steering diode 5010 with one terminal in contact with NV NT block switch 5005 at bottom surface contact terminal 5020, and another diode 5010 terminal in contact with array wiring conductor 5015. NV NT block switch 5005 top contact 5040 is in contact with array wiring conductor 5050. NV NT block switch 5005 includes top contact 5040 in contact with NV NT block 5030 and bottom contact 5020 in contact with NV NT block 5030. NV NT block switch 5005 is embedded in dielectric 5060. NV NT block switch 5005 is relatively dense (occupies a relatively small footprint) because top and bottom contacts and NV NT block 5030 side surfaces can be defined by self-aligned trench preferred methods of fabrication described further in the incorporated patent references and may be used to form minimum NV NT storage node dimensions of F×F. While NV NT block switch 5005 is illustrated as integrated with diode 5010 select (steering) devices, NV NT block switch 5005 may be combined with NFET select devices to form relatively dense memory arrays as described further below with respect to FIGS. 18A-18C for example.

NV NT block switch 1000C illustrated further above in perspective drawing FIG. 1C illustrates NV NT block 1035 corresponding to NV NT block 5030 illustrated in FIG. 5A. Bottom contact location 1040 corresponds to bottom contact 5020 and top contact location 1045 corresponds to top contact 5040.

The lateral dimensions of NV NT block switch 5010 may be as small as minimum dimensions F×F. NV NT block 5030 lateral dimensions may be larger than the minimum dimension F; the NV NT block 5030 side dimensions need not be equal. Note also that the vertical (thickness) dimension of NV NT block switch 5010, as well as the other NV NT block switches described herein, is generally unconstrained by the minimum dimension F provided by the technology node. Instead, the vertical (thickness) dimension is related to the thickness of the nanotube fabric, which can be selected, e.g., to be sufficiently thick to substantially inhibit electrical contact between contacts 5020 and 5040, as described in greater detail in U.S. patent application Ser. Nos. 11/835,651, 11/835,759, 11/835,845, 11/835,852, 11/835,856, and 11/835,865, all filed Aug. 8, 2007, entitled "Nonvolatile Nanotube Diodes and Nonvolatile Nanotube Blocks and Systems Using Same and Methods of Making Same." Examples of contact and conductors materials include elemental metals such as Al, Au, W, Ta, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides such as TiN, oxides, or silicides such as RuN, RuO, TiN, TaN, $CoSi_x$ and $TiSi_x$. Insulators may be $SiO_2$, SiN, $Al_2O_3$, or another insulator material.

Figure 5B:
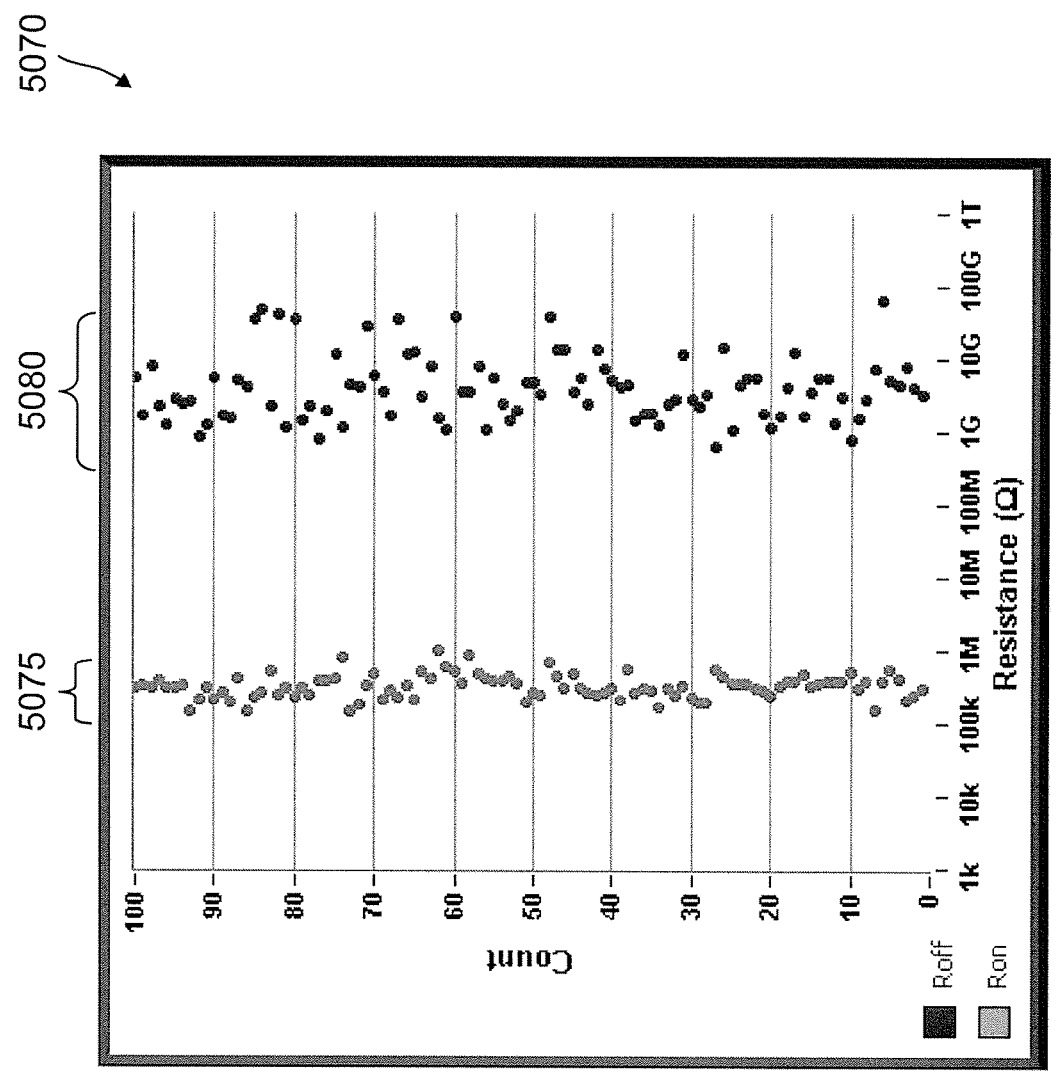
FIG. 5B illustrates the results of cycling data for an exemplary nonvolatile nanotube block switch similar to FIG. 5A.

Laboratory ON/OFF switching test results of a nonvolatile nanotube block switch corresponding to NV NT block switch 5000 are described with respect to graph 5070 illustrated in FIG. 5B, where write 0 corresponds to erase and results in a high resistance OFF state, and write 1 corresponds to program and results in a low resistance ON state. Test conditions and results are described in more detail in the incorporated patent references. Graph 5070 illustrates results of electrical tests that apply one write 0 voltage pulse of 6 volts, one write 1 voltage pulse of 6 V, and measure ON resistance at each ON/OFF cycle for 100 cycles. ON resistance values 5075 are typically in the 120 kOhm to 1 MOhm range and OFF resistance values 5080 are typically above 100 MOhms with most values above 1 GOhm.

Insulators Applied to 2-D NV NT Switch and 3D NV NT Block Switch Structures

Some embodiments of NV NT switches and NV NT block switches may be formed on the top surface of a chip and packaged in a hermetically sealed environment without the use of insulators. Non-insulated NV NT switches illustrated further above with respect to FIGS. 2A and 3 for example are formed when nanotube elements are deposited and patterned on top surfaces of co-planar contact terminals and insulators. Examples of insulated NV NT switches and NV NT block switches are described further below.

For chips with NV NT switches that are packaged in non-hermetically sealed environments, then one or several insulator layers may be added to the NV NT switch structure. Also, for denser memory cells for example, NV NT switches may be integrated near a cell select transistor such as NFET, close to a silicon substrate and below bit line arrays wires for example. Therefore, multiple insulating layers may be used above NV NT switches integrated in some memory array structures. Insulators may interact with nanotube elements to change electrical properties of NV NT switches such as voltage threshold and current values required for switching. Some insulators may enhance electrical characteristics by lowering threshold voltages and currents. Examples of NV NT switch insulator approaches are illustrated further below with respect to FIGS. 5A, 6A-6D, 7A, 7B, and 8A-8C. In some cases, adding one or more insulating layers may involve the use of one or more additional masking layers.

Some embodiments of NV NT block switches may be fabricated with a top contact to a conductor such that insulators are not in contact with the top surface of NV NT block structures as illustrated in FIGS. 1B and 1C, and FIGS. 4A and 5A. However, insulators may be in contact with some sidewall surfaces for NV NT block switch structures illustrated in FIGS. 4A and 5A. NV NT block switches operate with a wide variety of contact configurations such as top and bottom and top/side and bottom contacts as illustrated in FIGS. 4A-4B and 5A-5B, as well as and other contact configurations such as end-only, end and side-contacts, and other contact options illustrated further in the incorporated patent references.

Some embodiments of NV NT block switches may have contacts to conductors-only (no insulators) on five of six faces, leaving only a small portion of a bottom NV NT block region in contact with an underlying insulator by forming covered or enclosed (enrobed) NV NT block switches as illustrated further below with respect to FIG. 8C. Such covered or enclosed NV NT block switches may integrate more easily at various levels of assembly than NV NT switches and other (non-enclosed) NV NT block switches because of reduced sensitivity of nanotube electrical characteristics to various insulators commonly used in integrated circuit processes and structures. In other words, covered or enclosed NV NT block switches may be compatible with a broader range of insulators used in integrated circuit manufacturing. However, in some embodiments, covered or enclosed NV NT block switches may be less dense (have a larger footprint) than NV NT block switch 5000 with top and bottom contacts as illustrated in FIG. 5A.

Figure 6A:
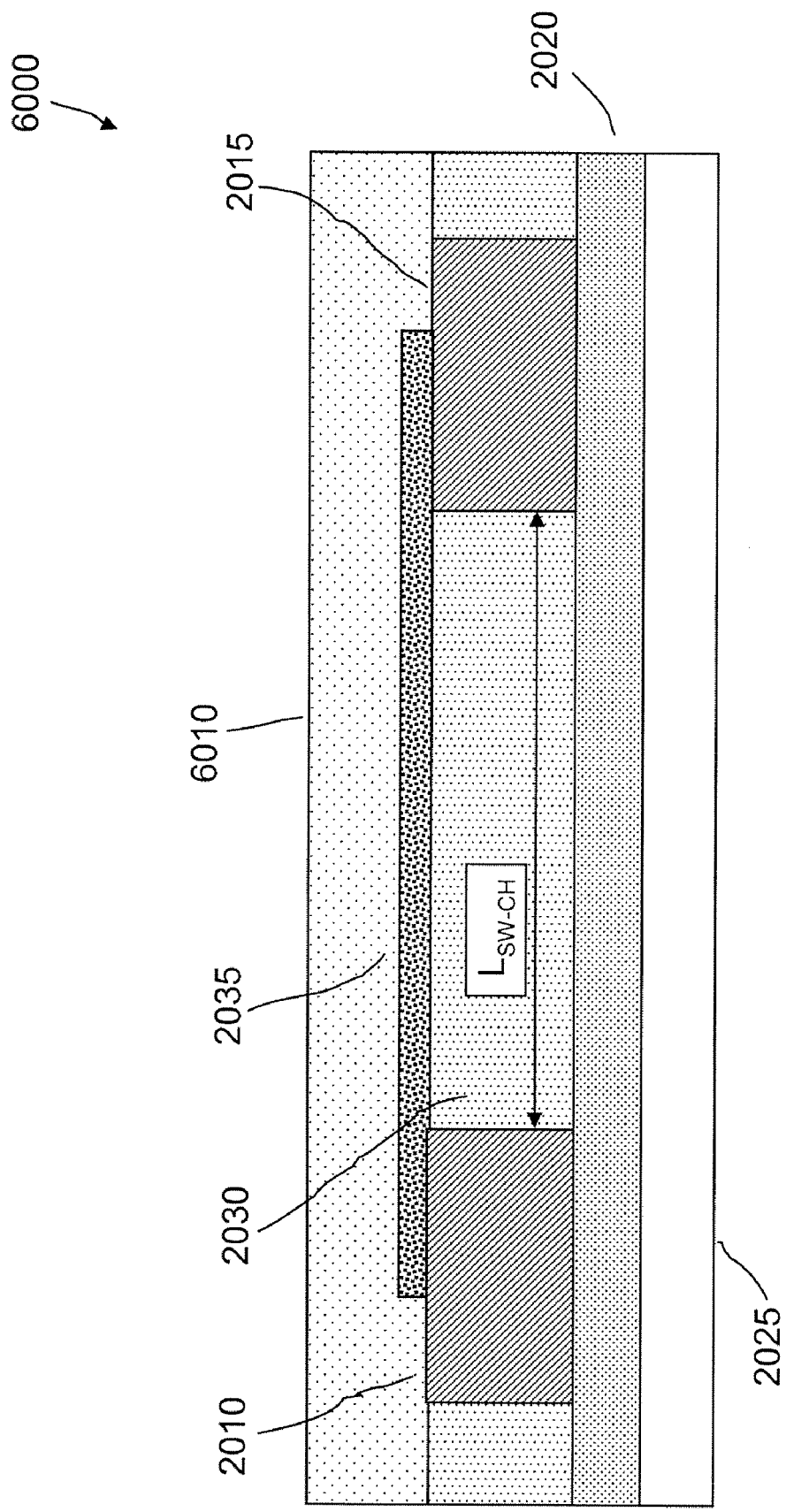
FIG. 6A illustrates the NV NT switch embodiment of FIG. 2A with the addition of a passivation layer.

FIG. 6A illustrates insulated NV NT switch 6000 formed by the addition of insulator 6010 to NV NT switch 2000 illustrated in FIG. 2A. Patterned nanotube element 2035 may be in contact with underlying insulator 2030 and overlying insulator 6010. Preferred passivation layers as described further below and in the incorporated patent references may be used as insulators 6010 and 2030 in NV NT switch 6000.

Passivation layers may have some or all of the following properties. First, the passivation layer may form an effective moisture barrier, substantially preventing exposure of the nanotubes to water. Second, the passivation film may not interfere with, and, preferably, enhance the switching mechanism of the memory device. Third, the passivation film may be compatible with other insulators, conductors, and semiconductors with respect to the preferred process flow used to form the integrated structure.

Passivation layers may be formed from any appropriate material known in the CMOS industry, including, but not limited to: $SiO_2$, SiN, $Al_2O_3$, polyimide, and other insulating materials such as PSG (Phosphosilicate glass) oxide, LTO (planarizing low temperature oxide) oxide, sputtered oxide or nitride, flowfill oxide, CVD (chemical vapor deposition) of oxide and nitride, ALD (atomic layer deposition) oxides. PVDF (Polyvinylidene Fluoride) insulating material may also be used. Combinations of these insulators, or other suitable insulators, may also be used.

Insulators 6010 and 2030 may also be formed using preferred methods to deposit and pattern sacrificial polymer polypropylene carbonate (PPC) dissolved in one or more organic solvents such as NMP or cyclohexanone available in the industry. A description of the properties of polypropylene carbonate may be found, for example, in referenced technical data available from the company Empower Materials, Inc. Other sacrificial polymers such as Unity™sacrificial polymer and polyethylene carbonate sacrificial polymer may also be used. Information about Unity™ polymer is available from the supplier BFGoodrich, Cleveland, Ohio. Sacrificial polymer usage is further described in the incorporated patent references. These materials may also be used in conjunction with other materials, i.e., PPC or Unity™ polymers with insulators such as $SiO_2$ as illustrated further in the incorporated patent references.

Figure 6B:
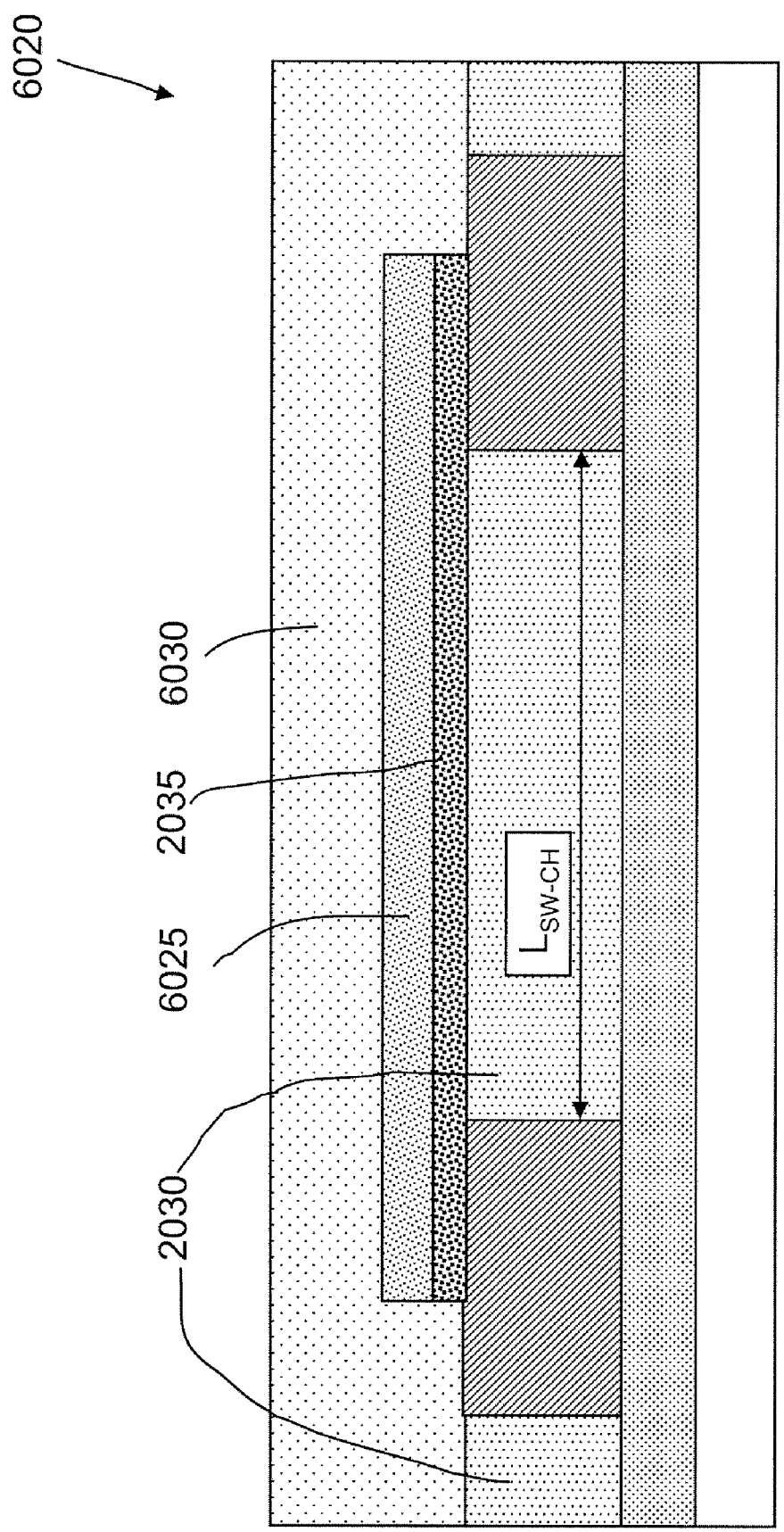
FIG. 6B illustrates the NV NT switch embodiment of FIG. 2A with the addition of two passivation layers.

FIG. 6B illustrates insulated NV NT switch 6020 formed by adding insulator 6025 in contact with patterned nanotube element 2035 and insulator 6030 in contact with insulator 6025, contact terminals 2010 and 2015, and portions of insulator 2030 to NV NT switch 2000 illustrated in FIG. 2A. Insulator 6025 may be formed by preferred methods of applying sacrificial polymers such as PPC and Unity described further above. Insulator 6030, may be formed by preferred methods of applying an insulator such as $SiO_2$ for example.

Figure 6C:
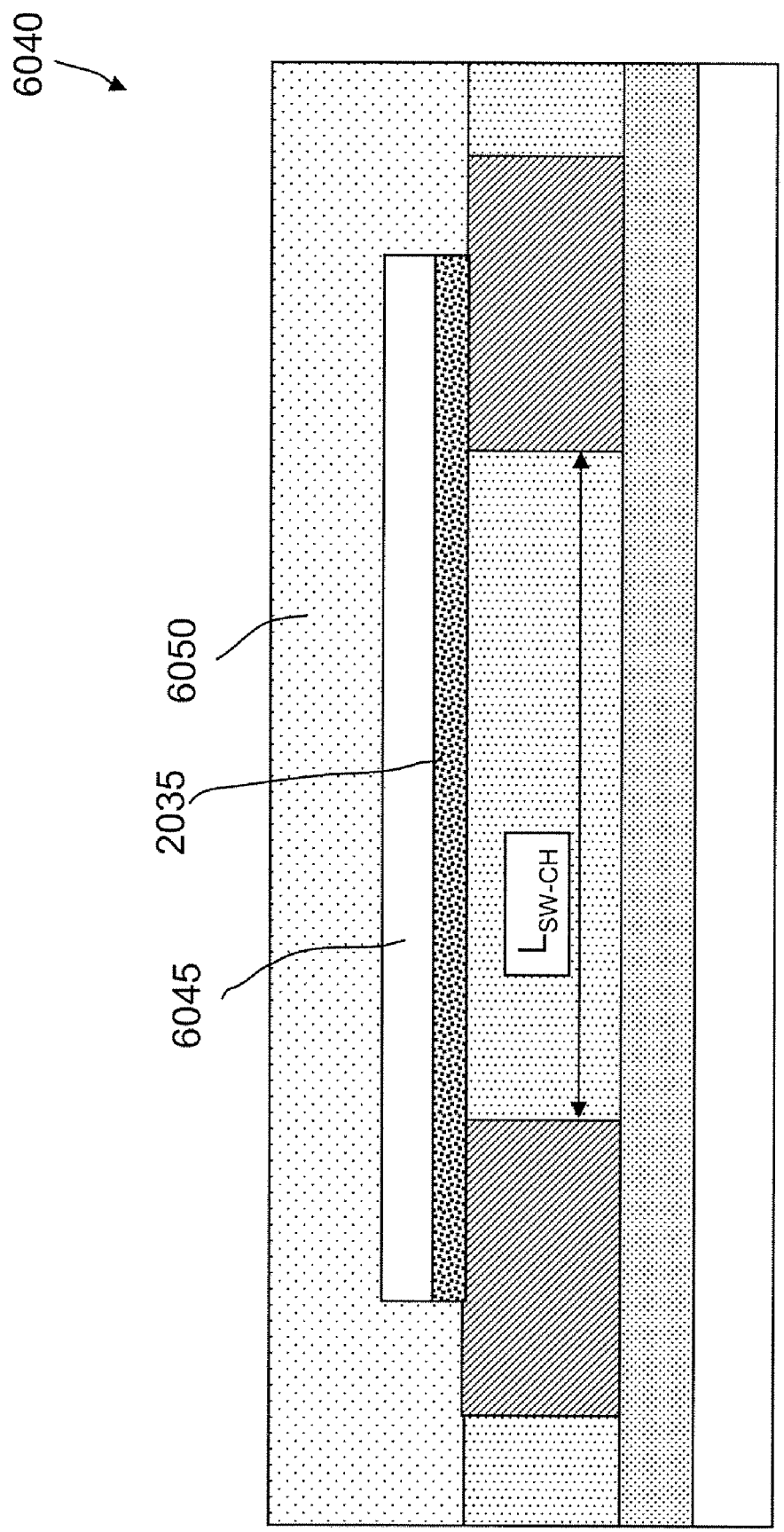
FIG. 6C illustrates the NV NT switch embodiment of FIG. 2A with the addition of a passivation layer and a gap region above the patterned nanotube element.

FIG. 6C illustrates insulated NV NT switch 6040 that corresponds to NV NT switch 6020. However, when forming NV NT switch 6040, insulator 6025 used in NV NT switch 6020 may be formed using a sacrificial polymer such as PPC or Unity described further above that can be evaporated through an insulating layer. FIG. 6C illustrates NV NT switch 6040 after evaporation of sacrificial polymer insulator 6025 through insulating layer 6050 ($SiO_2$ for example) to form gap region 6045 above patterned nanotube element 2035 as described in greater detail in the incorporated patent references.

Figure 6D:
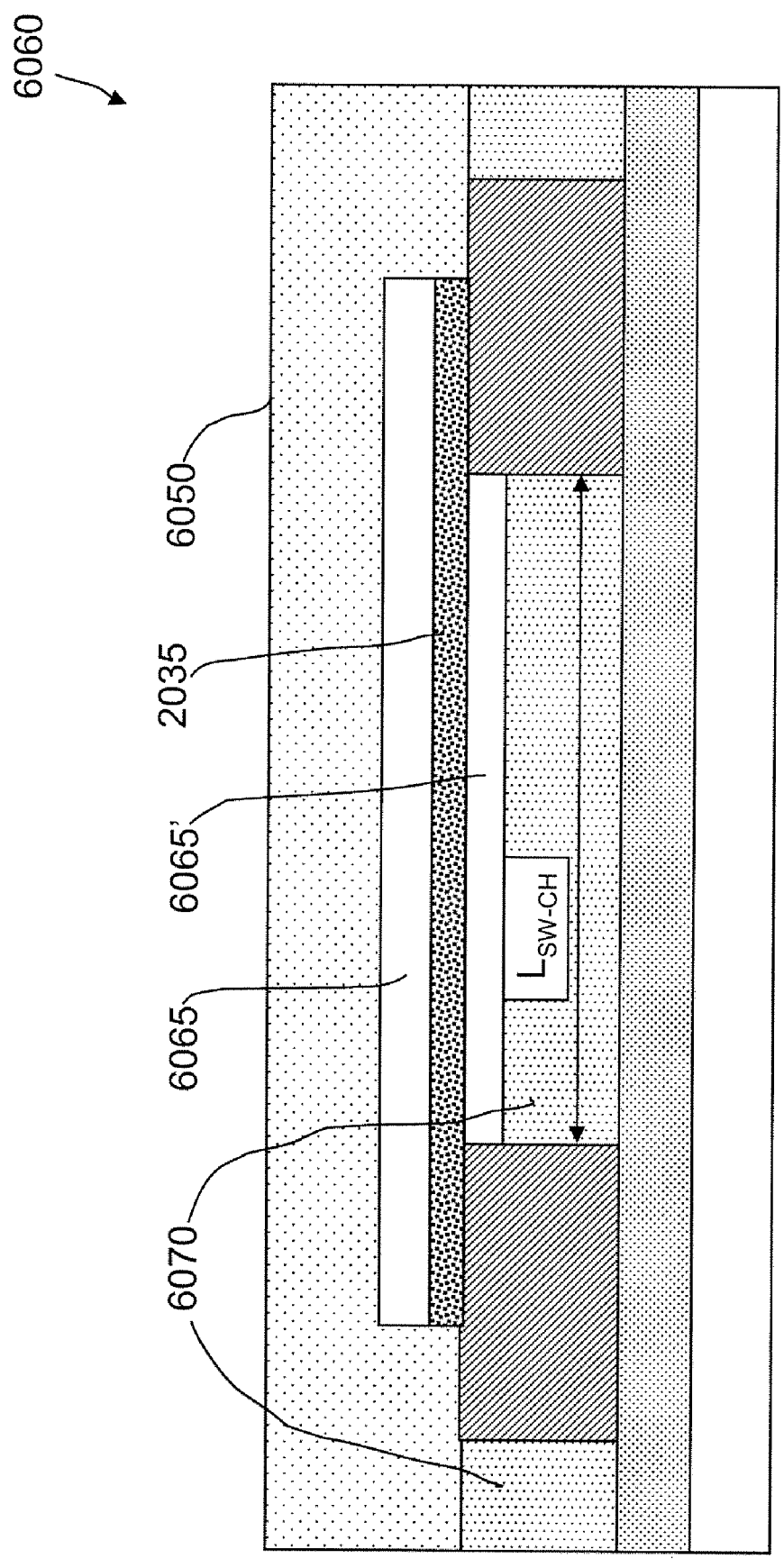
FIG. 6D illustrates the NV NT switch embodiment of FIG. 2A with the addition of a passivation layer and gap regions above and below the patterned nanotube element.

FIG. 6D illustrates insulated NV NT switch 6060 which corresponds to NV NT switch 6040. However, sacrificial insulators (not shown) have been evaporated through insulator 6050 to create gap region 6065 above patterned nanotube element 2035 and gap region 6065' below nanotube element 2035, embedded in insulator 6070 below patterned nanotube element 2035. Enhanced performance characteristics of NV NT switches having patterned nanotube elements with gap regions are described further in the incorporated patent references.

Figure 7A:
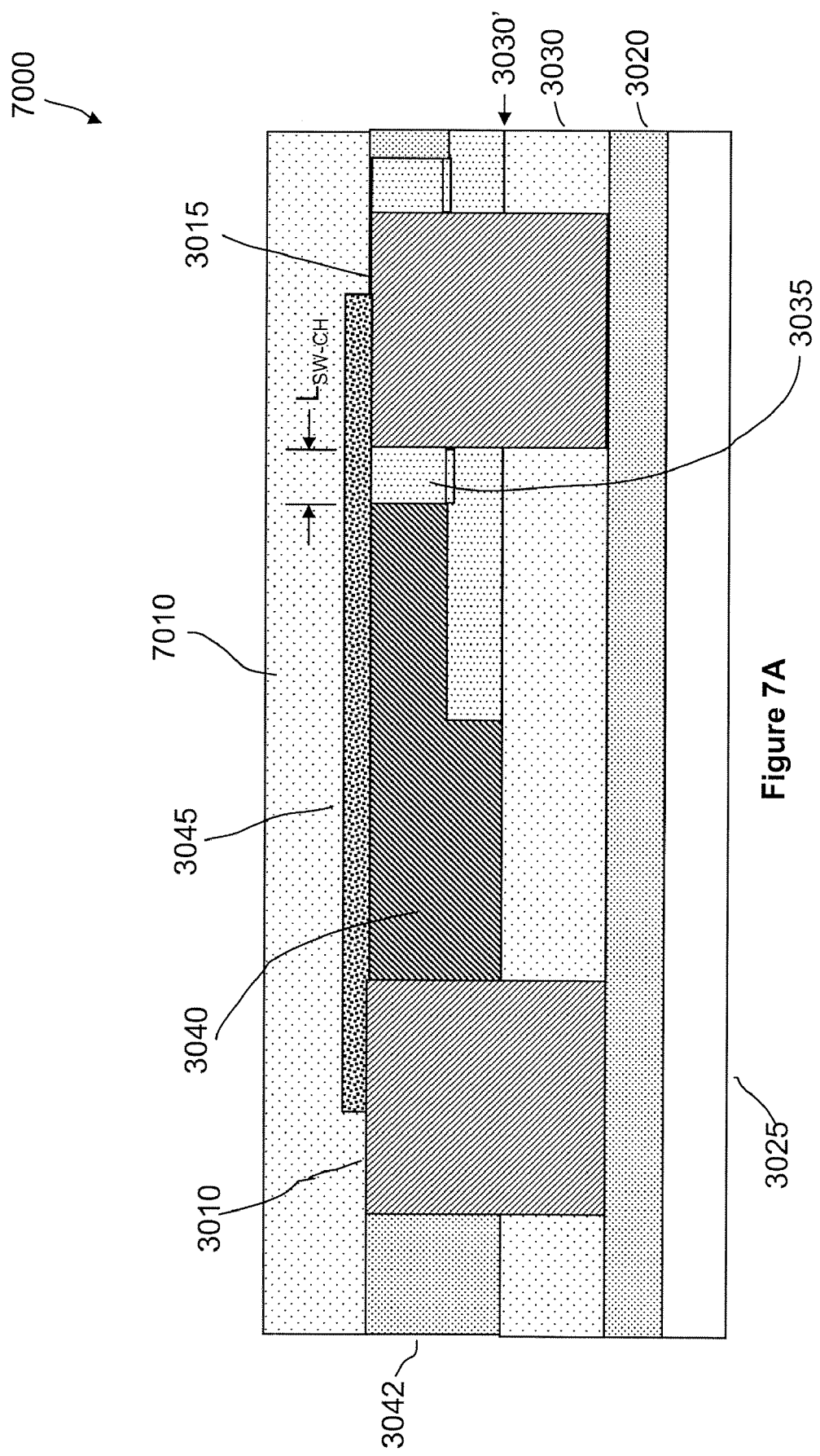
FIG. 7A illustrates the NV NT switch embodiment of FIG. 3 with the addition of a passivation layer.

FIG. 7A illustrates insulated NV NT Switch 7000 with self aligned channel length $L_{SW-CH}$ formed by adding insulator 7010 to NV NT switch 3000 illustrated in FIG. 3. Patterned nanotube element 3045 contacts underlying contact terminals 3010 and 3015, contact terminal extension 3040, and insulator 3035. Patterned nanotube element 3045 also contacts overlying insulator 7010. Passivation layers are described further above and also further below and in the incorporated patent references.

Figure 7B:
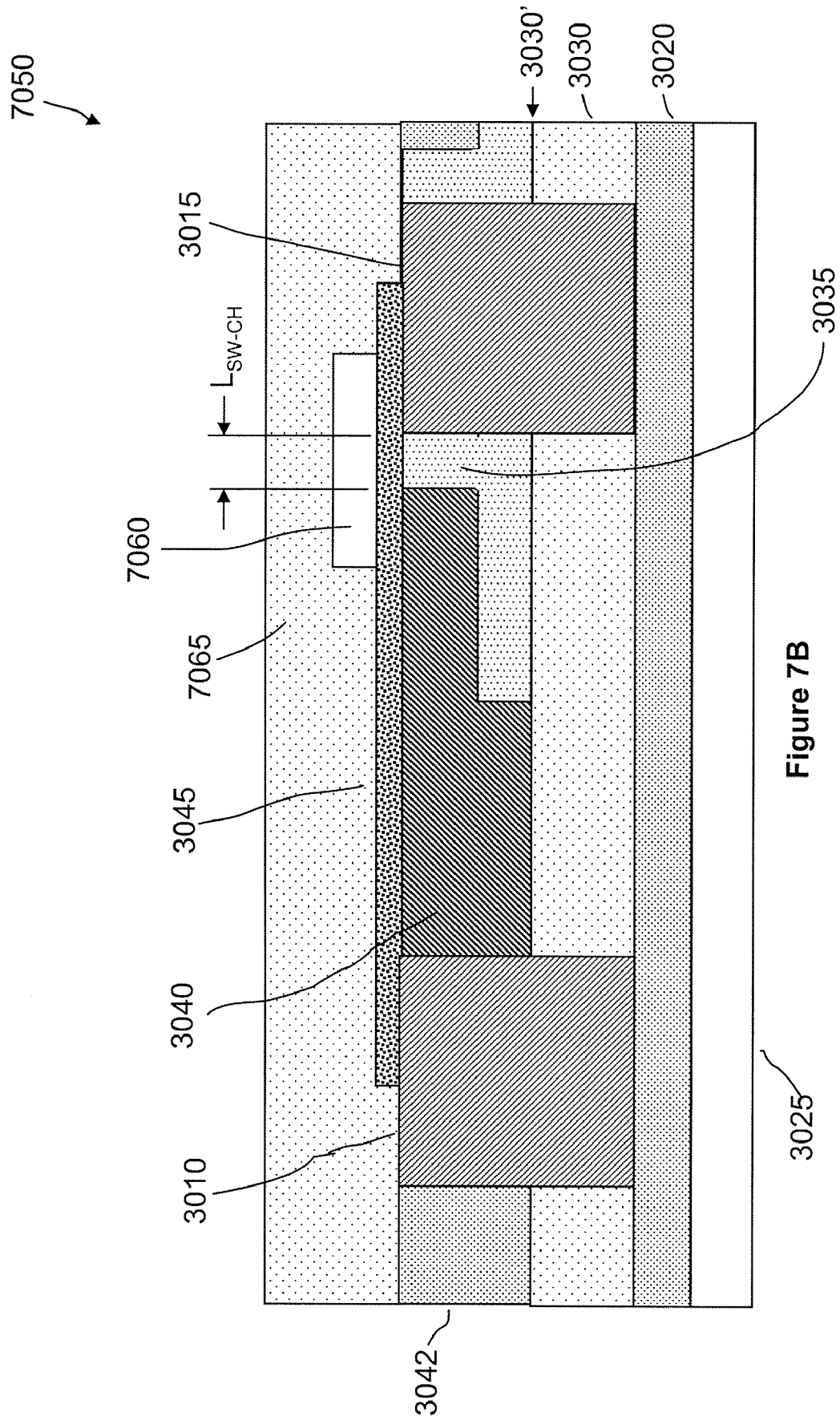
FIG. 7B illustrates the NV NT switch embodiment of FIG. 3 with the addition of a passivation layer and a gap region above the channel length portion of the patterned nanotube element.

FIG. 7B illustrates insulated NV NT switch 7050 which corresponds to NV NT switch 7000. However, a sacrificial insulator has been evaporated through insulator 7065, $SiO_2$ for example, to form gap 7060 above a portion of patterned nanotube 3045 positioned above the $L_{SW-CH}$ region and extending above the patterned nanotube element 3045 on both sides of the $L_{SW-CH}$ channel region. Examples of gap regions are described further above with respect to FIGS. 6A-6D and in greater detail in the incorporated patent references.

Figure 8A:
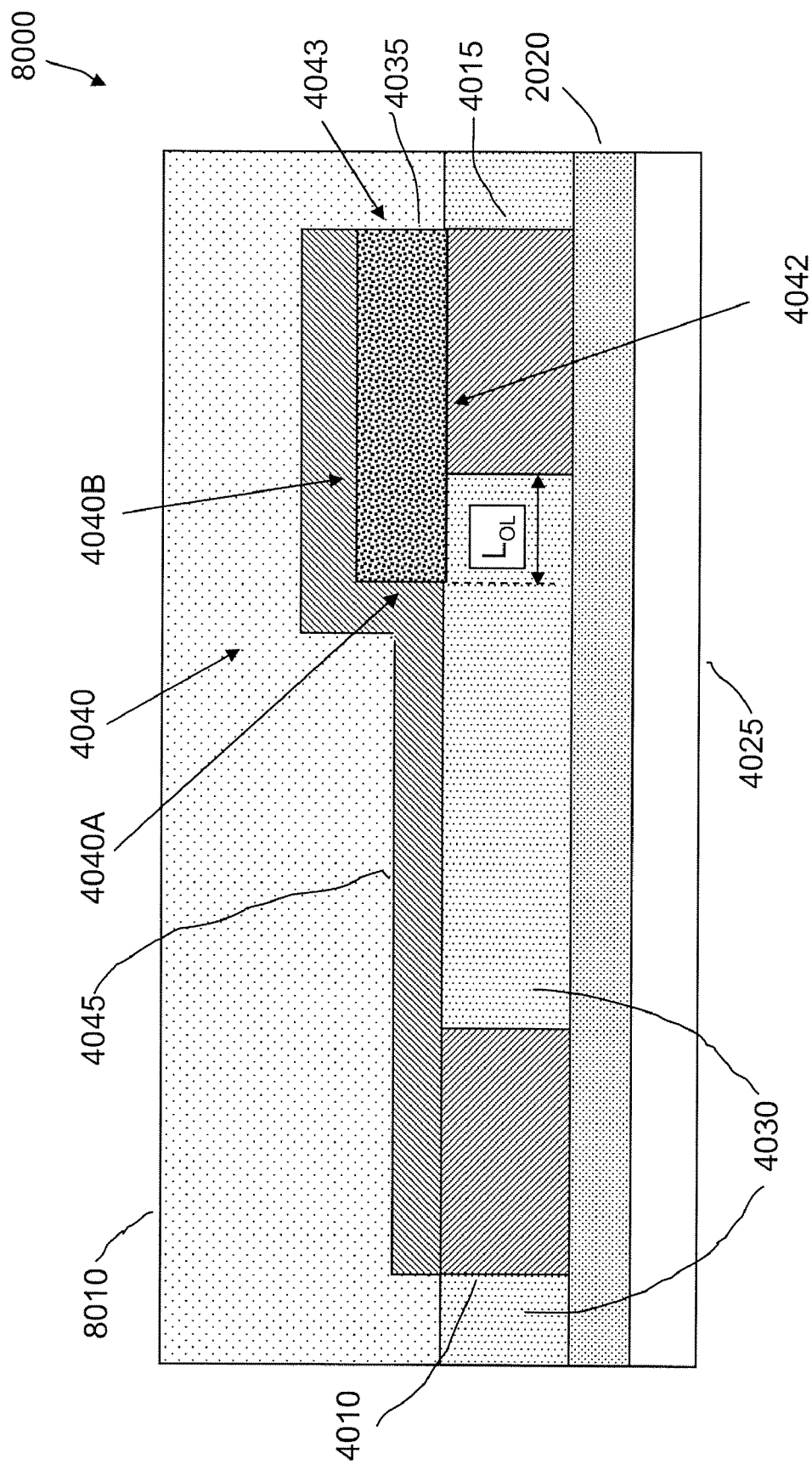
FIG. 8A illustrates the NV NT block switch embodiment of FIG. 4A with the addition of a passivation layer.

FIG. 8A illustrates an insulated NV NT block switch 8000 which is similar to non-insulated NV NT block switch 4000 illustrated further above in FIG. 4A. Insulated NV NT block switch 8000 may be used instead of NV NT switches illustrated in FIGS. 6A-6D and 7A and 7B in memory cells. NV NT block switch 8000 illustrated in FIG. 8A is formed by depositing insulator 8010 on the surface of NV NT block switch 4000 such that insulator 8010 is in contact with conductor 4045, including the contact 4040 region, exposed side surfaces such as side surface 4043 of NV NT block 4035, and insulator 4030. Insulator 8010 is not in contact with the top surface of NV NT block 4035 because contact 4040B is covered by conductor 4045, and is also not in contact with one side surface of NV NT block 4035 because contact 4040A is covered by conductor 4045. Insulator 8010 material may be similar to insulator 6010 material described further above with respect to FIG. 6A.

Figure 8B:
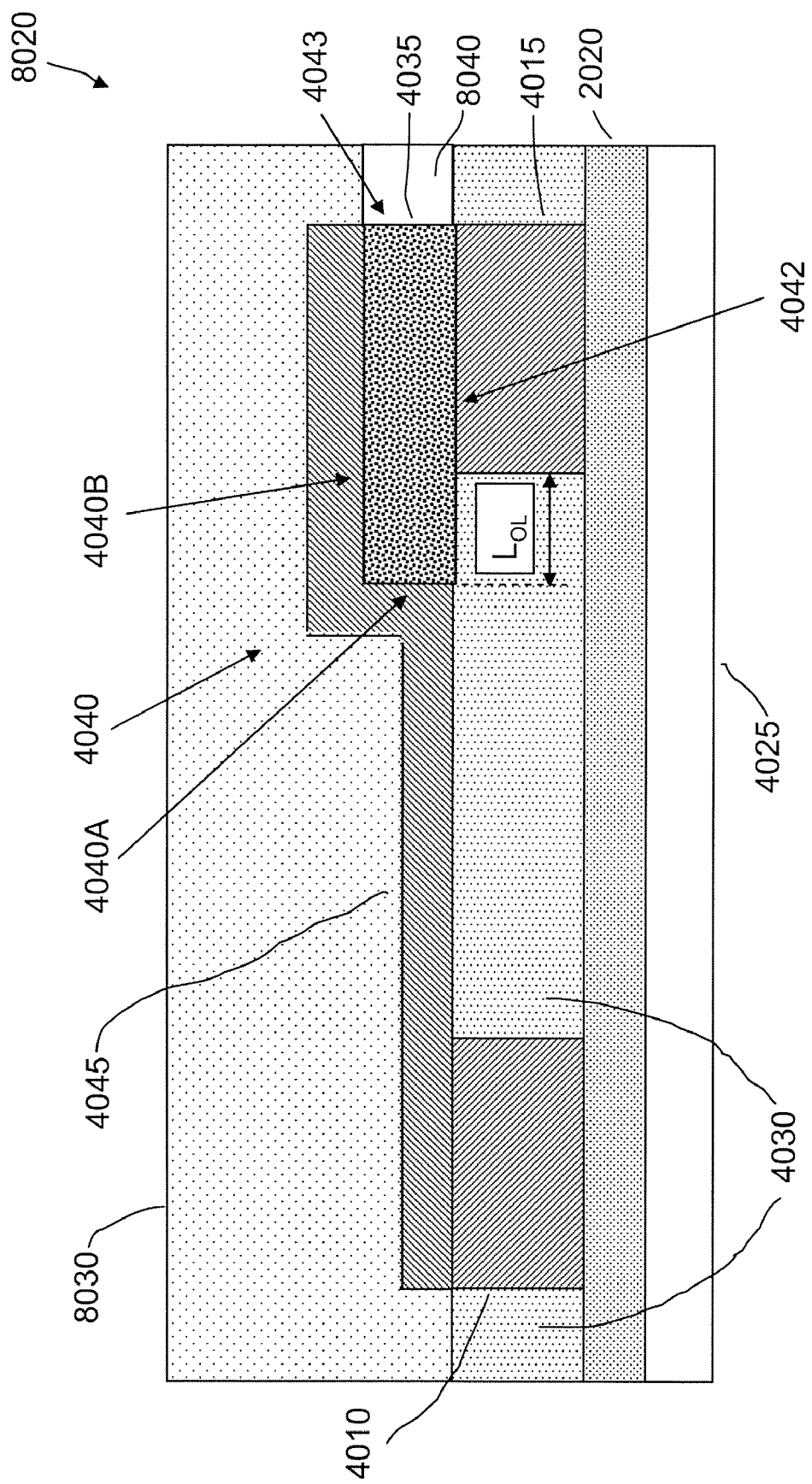
FIG. 8B illustrates the NV NT block switch embodiment of FIG. 4A with the addition of a passivation layer and a gap region adjacent side faces of the nonvolatile nanotube block region.

NV NT block switch 8020 illustrated in FIG. 8B is formed by including sacrificial polymer regions (not shown) similar to sacrificial regions described further above with respect to FIGS. 6A-6D and 7A-7B prior to forming insulator 8030. Such sacrificial polymer regions may remain in the insulator structure as illustrated in FIG. 6B further above, or may be evaporated through an insulator such as insulator 8030 to form gap regions such as illustrated in FIGS. 6C and 6D. Gap region 8040 prevents contact between insulator 8030 and exposed side surface 4043 of NV NT block 4035. Other NV NT block 4035 side surfaces (not visible in FIG. 8B) may include gap regions that prevent side surface contact between NV NT block 4035 and insulator 8030. Gap regions and preferred methods of fabrication are described further above with respect to FIGS. 6C, 6D, and 7B, and in the incorporated patent references.

NV NT block switches have been demonstrated to electrically operate (switch between ON and OFF states) in a wide variety of geometries and contact configurations such as top and bottom and top/side and bottom contacts as illustrated in FIGS. 4A and 5A, as well as other contact configurations such as end-only, end and side-contacts, and other contact options, such as those illustrated in U.S. patent application Ser. Nos. 11/835,651, 11/835,759, 11/835,845, 11/835,852, 11/835,856, and 11/835,865, all filed Aug. 8, 2007, entitled "Nonvolatile Nanotube Diodes and Nonvolatile Nanotube Blocks and Systems Using Same and Methods of Making Same." For flexibility and ease of integrating NV NT block switch-type configurations at nearly any level of semiconductor (or other type of) process flow with exposure to various materials and processes, it may be desirable to integrate NV NT block switches in such a way as to enhance conductor contacts and to reduce non-conductor (insulator) contacts to side/top/bottom surfaces (faces) of NV NT blocks regions. A covered or enclosed (e.g., enclosed by conductor contacts) NV NT block configuration enables covered or enclosed NV NT block switches with contacts to conductors-only (no insulators) on five of six NV NT block surfaces (faces), leaving only a small portion of a bottom NV NT block surface in contact with an underlying insulator as described further below with respect to FIG. 8C and referred to as overlap length $L_{OL}$.

Figure 8C:
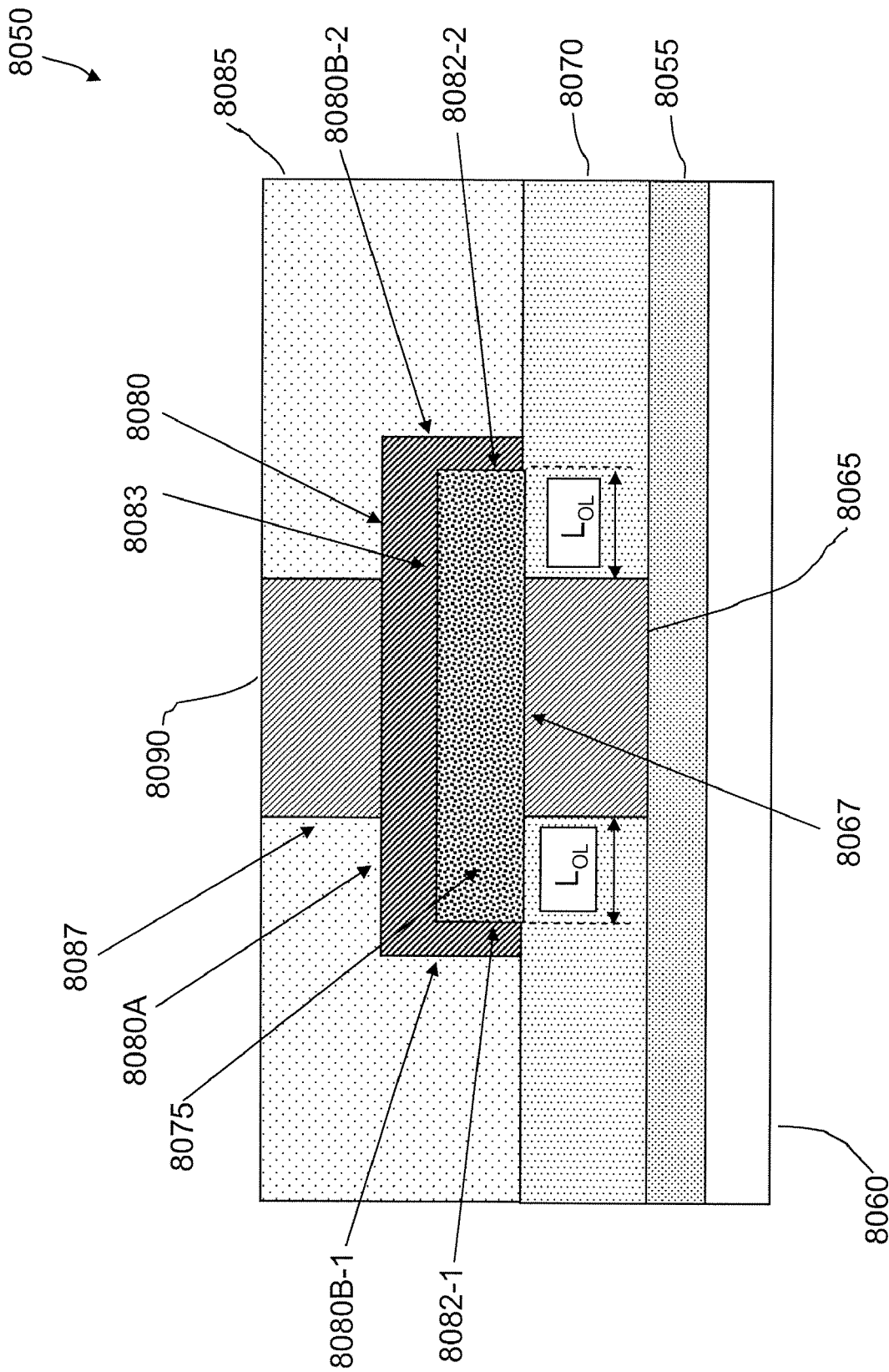
FIG. 8C illustrates an embodiment having a pair of two terminal NV NT block switches of vertical orientation, with a bottom contact terminal and a top contact terminal to a nonvolatile nanotube block (NV NT block), in which the top contact terminal is extended to include contact to all sides of the nonvolatile nanotube block.

FIG. 8C illustrates enclosed (enrobed) NV NT block switch 8050 cross section, which includes bottom contact terminal 8065 in contact with insulator and wiring layer 8055, which in turn is in contact with substrate 8060. The top surface of bottom contact terminal 8065 and insulator 8070 are coplanar. Bottom contact terminal 8065 contacts NV NT block 8075 at bottom contact 8067. NV NT block 8075 extends beyond the surface of bottom contact 8067 by an overlap distance $L_{OL}$ on all sides and is in contact with the top surface of insulator 8070. $L_{OL}$ may be on the order of 5 to 100 nm, for example. $L_{OL}$ may be determined by mask alignment or by self aligned techniques using known preferred sidewall spacer methods as described in prior art U.S. Pat. No. 4,256,514 combined with preferred methods such as chemical-mechanical polishing (CMP) techniques as described in prior art U.S. Pat. No. 4,944,836, as illustrated further above with respect to FIG. 3.

A conductor encloses NV NT block 8075 on the top surface and on all side surfaces thereby forming a top/side contact terminal 8080. Top portion 8080A of top/side contact terminal 8080 forms top contact 8083 with the top surface of NV NT block 8075. Preferred methods of fabrication may use top portion 8080A of top/side contact terminal 8080 as a masking layer when forming the sidewall surfaces of NV NT block 8075. Sidewall conductor regions 8080B-1, 8080B-2 of top/side contact terminal 8080, and other sidewall regions not visible in FIG. 8C, may be formed by preferred methods to deposit a conformal conductor layer and then directionally etching as shown in prior art U.S. Pat. No. 4,256,514 to form sidewall conductor regions 8080B-1 and 8080B-2. Preferred directional etch methods remove the remaining portions of conductor material on the surface of insulator 8070. Sidewall conductor regions 8080B-1 and 8080B-2 form sidewall contacts 8082-1 and 8082-2 to side surfaces of NV NT block 8075.

Preferred methods deposit insulator 8085. Next, preferred methods etch via hole 8087 to the top portion 8080A of top/side contact terminal 8080. Next, preferred methods deposit a conductor layer that fills via hole 8087. Then, preferred methods such as CMP described in the incorporated patent references planarize the surface forming conductor 8090 in contact with the top surface 8080A of top/side contact terminal 8080.

In some embodiments, enclosed NV NT block switch 8050 dimensions may be larger than the minimum dimension F by two-times the amount of the overlap length $L_{OL}$ ($2 L_{OL}$) and two-times the thickness of sidewall conductors regions 8080B-1 and 8080B-2. By way of example, if $L_{OL}$ is 5 to 50 nm and the sidewall conductor regions 8080B-1 and 8080B-2 are 5 to 50 nm, for example, then in some embodiments the minimum dimensions of enclosed NV NT block switch 8050 dimensions are F+20 nm in cross section to F+200 nm in cross section.

Examples of contact and conductors materials include elemental metals such as Al, Au, W, Ta, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides such as TiN, oxides, or silicides such as RuN, RuO, TiN, TaN, $CoSi_x$ and $TiSi_x$. Insulators may be $SiO_2$, SiN, $Al_2O_3$, or another insulator material.

Enclosed NV NT block switch 8050 may be combined with a select transistor such as an NFET to create memory cells as illustrated further below with respect to FIG. 19 for example.

FIG. 8D summarizes some embodiments of 2-D NV NT switches and 3-D NV NT block switches described further above with respect to FIGS. 2A-8C that may be used as nonvolatile nanotube storage nodes in memory arrays as described further below. Nonvolatile nanotube storage nodes numbered 1-13 in FIG. 8D correspond to 2-D and/or 3-D switch structures and includes a brief description, a switch number and corresponding Figure number, and integration level constraints, if any. Some embodiments of non-insulated switches may be limited to top-only placement, while some embodiments of insulated switches may be placed at any level of integration because the insulation protects the switches from subsequent process steps.

Memory Cells and Arrays of Same Using 3-D Nonvolatile Nanotube Block Switches as Storage Elements Some embodiments of NV NT switches and NV NT block switches may be integrated with NFET select transistors to form nonvolatile memory cells and arrays of same. Such nanotube switches may be placed at or near a top surface region above already partially formed cells that include NFET select devices connected to word lines (WLs) and bit lines (BLs) for ease of integration.

An exemplary 16 bit memory array was designed, fabricated and tested as described further below with respect to FIGS. 9A, 9B, 10A, 10B, and 11A-11C. Uninsulated NV NT block switches 4000 illustrated in FIG. 4A were fabricated on a top layer of a CMOS chip with one terminal electrically connected to sources of a corresponding with NFET select transistors to complete a nonvolatile 16 bit memory array with CMOS buffer circuits as described further below.

Various memory array cells using NV NT switches and NV NT block switches described further above and summarized in FIG. 8D are described further below with respect to FIGS. 12A, 12B, 13A, 13B, 14A, 14B, and 15. These memory cells use NV NT storage nodes formed of NV NT switches and NV NT block switches placed at or near a surface of the memory cell and above pre-wired word and bit line layers.

Various memory array cells using NV NT switches and NV NT block switches described further above and summarized in FIG. 8D are described further below with respect to FIGS. 16A, 16B, 17A, 17B, 18A, 18B, and 19. These memory cells use NV NT storage nodes formed of NV NT switches and NV NT block switches integrated within cells in close proximity to NFET select devices, with one terminal connected to the source of the NFET transistor, and below the bit line layer to enhance cell density.

Figure 20A:
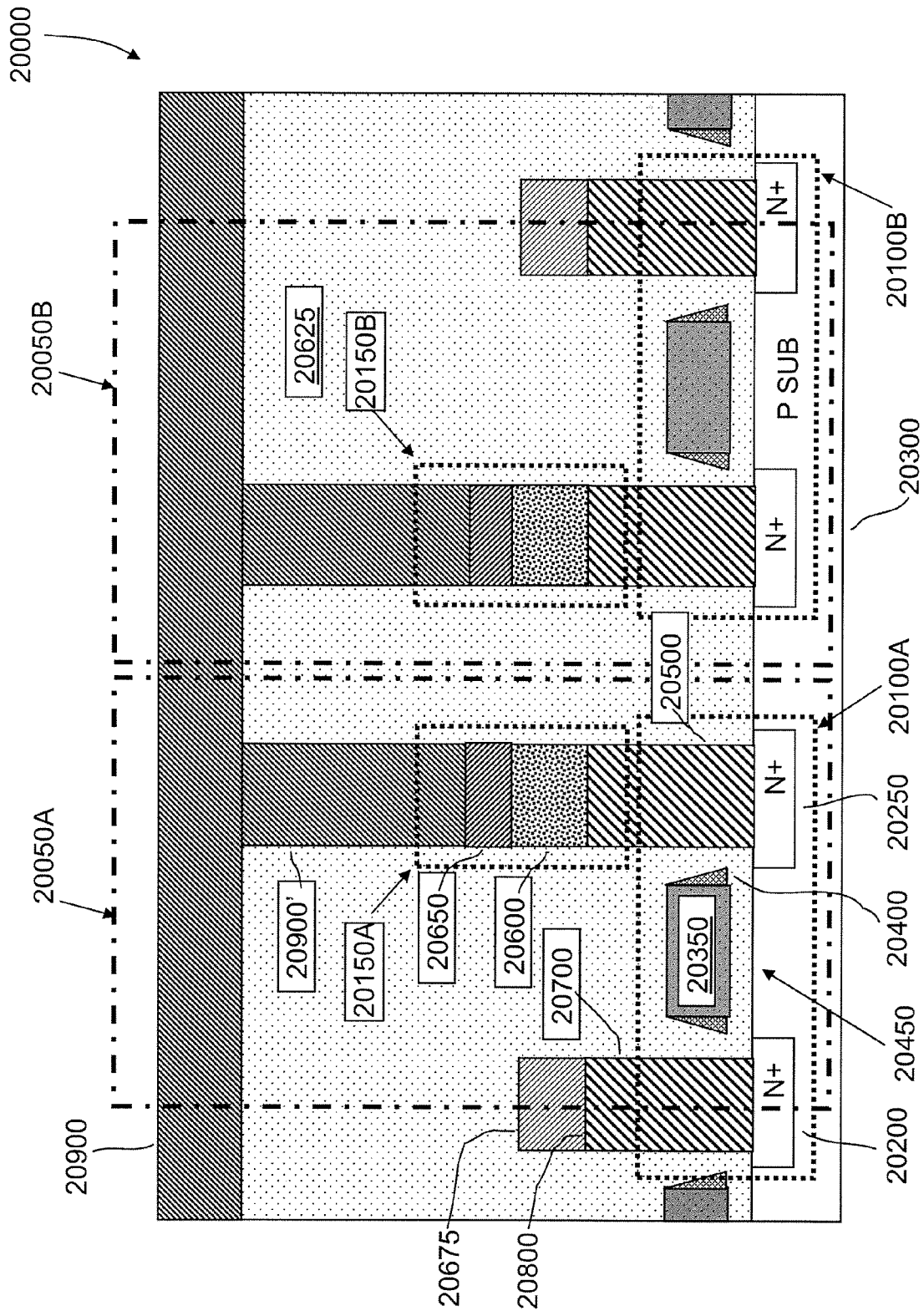
FIG. 20A illustrates a cross section of an embodiment of memory array cells with top and bottom contact terminal-type nonvolatile nanotube block switches used as nonvolatile nanotube storage nodes and integrated in the cell region in proximity to a corresponding select transistor and positioned between a bit line contact and a drain of a corresponding select transistor.

FIG. 20A illustrates a NV NT block switch storage node connected between bit line BL and NFET transistor drain. Such an integration scheme is enabled by the density of the NV NT block switches and the bidirectional nature of current flow of the NV NT block switch.

FIG. 20B illustrates the cell areas (footprints) of various NV NT storage nodes formed with NV NT switches or NV NT block switches. Cell areas are expressed in terms of the number of minimum squares of dimension F×F. For NV NT storage nodes located at or near a surface above pre-wired cell regions, cell areas depend on whether self-aligned or non-self aligned studs are used to contact the source of the NFET select transistor with one terminal of the NV NT switch or NV NT block switch. In some embodiments, NV NT block switches with top and bottom contacts (referred to as node #10) and integrated within the cell region, below the bit lines, have an estimated cell area in the range of $6-8F^2$.

Figure 9A:
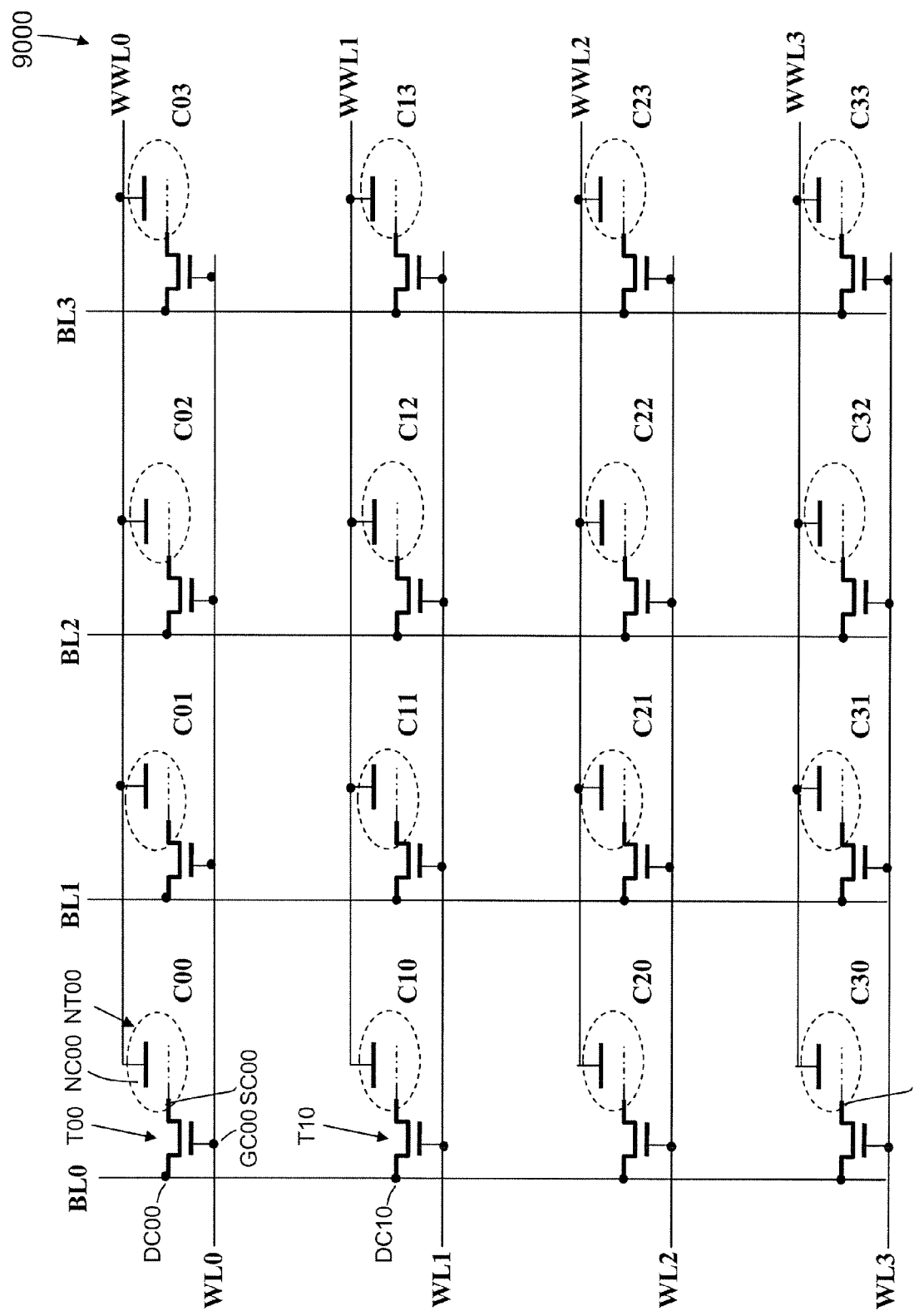
FIG. 9A illustrates an embodiment of a memory element schematic that may use nonvolatile nanotube switches or nonvolatile nanotube block switches as nonvolatile nanotube storage nodes for memory element cells.

16 Bit Memory Array Using NV NT Block Switches as Nonvolatile Nanotube Storage Nodes Nonvolatile memory array schematic 9000 includes a matrix of 16 nonvolatile storage cells C00, C10, ..., C33 as illustrated in FIG. 9A. Memory arrays are not limited to 16 cells and may have millions or billions of cells for example. Each memory cell illustrated in memory array schematic 9000, such as representative cell C00, includes a select transistor T00 that may be an NFET as shown, or may also be a PFET (not shown) or a CMOS transfer device (not shown) that includes both NFET and PFET devices, or other types of switching devices (not shown). Each cell, such as cell C00, also includes a nonvolatile nanotube storage node NT00. Nonvolatile nanotube storage node NT00 (NV NT storage node) may be formed using NV NT switch-types and NV NT block switch-types such as those illustrated further above and summarized in FIG. 8D.

Nonvolatile storage cells such as cell C00 are formed by connecting the source SC00 of a transistor such as NFET T00 to a first terminal of a NV NT storage node such as NV NT storage node NT00 illustrated in FIG. 9A. Examples of NV NT storage nodes are listed in FIG. 8D.

Figure 9B:
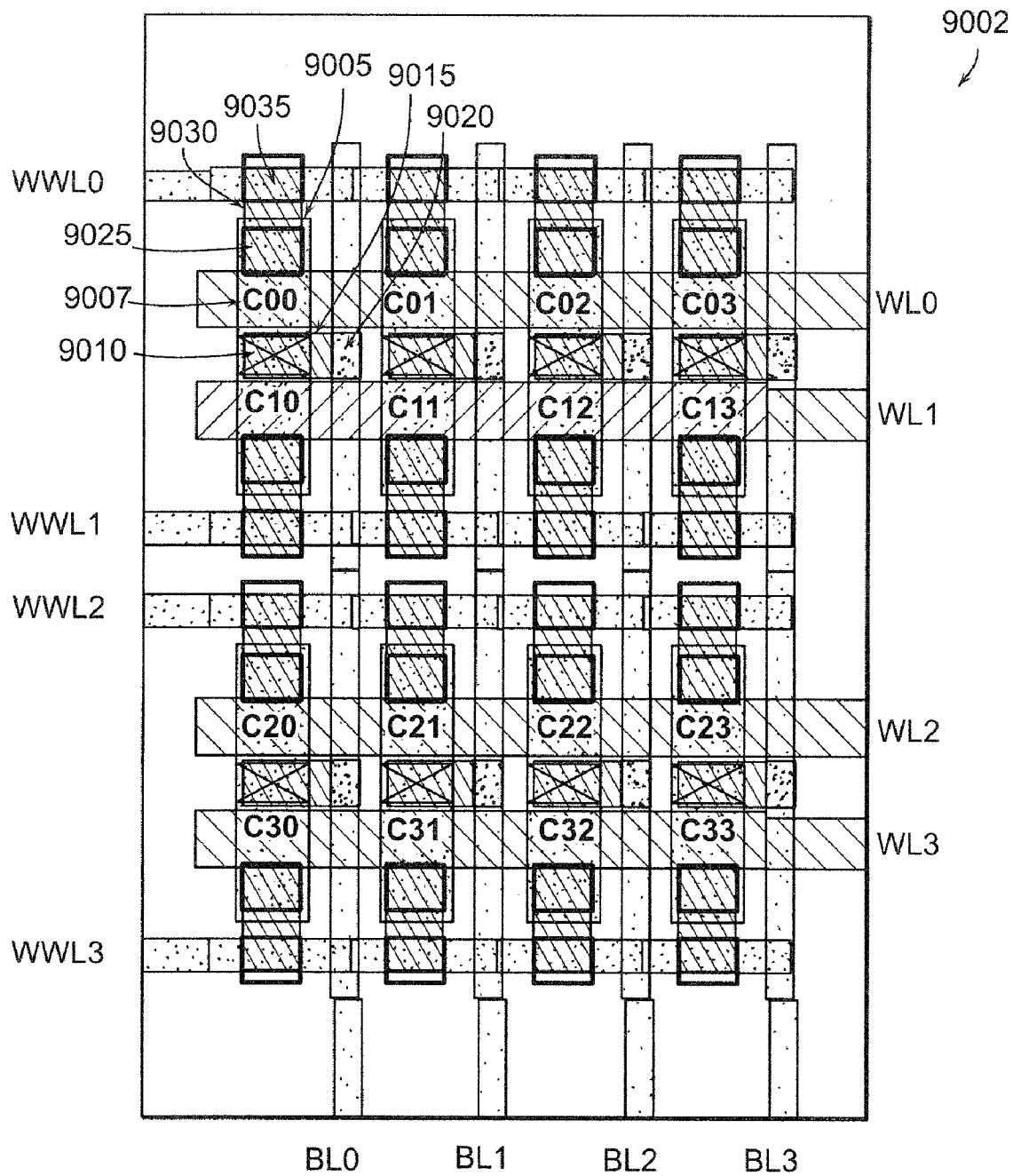
FIG. 9B illustrates a layout of an embodiment of a 16 bit memory array that includes NMOS FET select transistors and CMOS buffer and control circuits.

Memory array schematic 9000 is formed by connecting word lines WL0, WL1, WL2, and WL3 to corresponding gates of NFET select transistors in corresponding storage cells; connecting secondary word lines WWL0, WWL1, WWL2, and WWL3 to corresponding second terminals of NV NT storage nodes in corresponding storage cells; and connecting bit lines BL0, BL1, BL2, and BL3 to corresponding drain diffusions of corresponding NFET select transistors in corresponding nonvolatile storage cells as illustrated in FIGS. 9A and 9B. For example, word line WL0 is connected to the gate of NFET T00 by contact GC00; secondary word line WWL0 is connected to the second terminal of nonvolatile nanotube storage node NT00 by contact NC00; and bit line BL0 is connected to the drain of T00 by contact DC00.

Memory array layout 9002 illustrated in planar view in FIG. 9B is a layout (design) of an exemplary 16 bit memory array corresponding to memory array schematic 9000 using 250 nm CMOS design rules. Selected design workstation layout levels are highlighted.

Cells C00 and C10 of memory array layout 9002 illustrated in FIG. 9B are formed within the same FET region 9005 and share a common drain diffusion. Word line WL0 contacts the gate of the cell C00 select NFET transistor at contact 9007, which corresponds to contact GC00 between word line WL0 and the gate of NFET T00 in memory array schematic 9000 illustrated in FIG. 9A. Drain contact 9010 is shared by mirror-image cells C00 and C10C illustrated in FIG. 9B, and contacts conductor segment 9015 which in turn contacts bit line BL0 through contact 9020. Contact 9010 illustrated in FIG. 9B corresponds to drain contacts DC00 of NFET T00 and DC10 of NFET T01 illustrated in FIG. 9A. A first contact to nonvolatile nanotube storage node NT00 illustrated in FIG. 9A is connected to the source of NFET T00 by contact SC00. NV NT block switch 4000 illustrated in FIG. 4A (NV NT storage node number 9 in FIG. 8D) is placed above the source of the cell C00 select NFET with NV NT block 4035 bottom contact 4015 extended to contact the cell C00 NFET source diffusion as illustrated further below with respect to FIG. 13B. Combined upper/side contact 4040 to NV NT block 4035 is connected to (part of) conductor 4045 illustrated in FIG. 4A and corresponds to conductor segment 9030 in FIG. 9B. Conductor segment 9030 is also connected to second word line WWL0 by contact 9035, which corresponds to contact NC00 in FIG. 9A. All C10 NFET select devices and NV NT block switches are interconnected in a corresponding manner to those described with respect to cell C00. All other cells correspond to cell C00 or a mirror image of cell C00 as described further above.

Figure 10A:
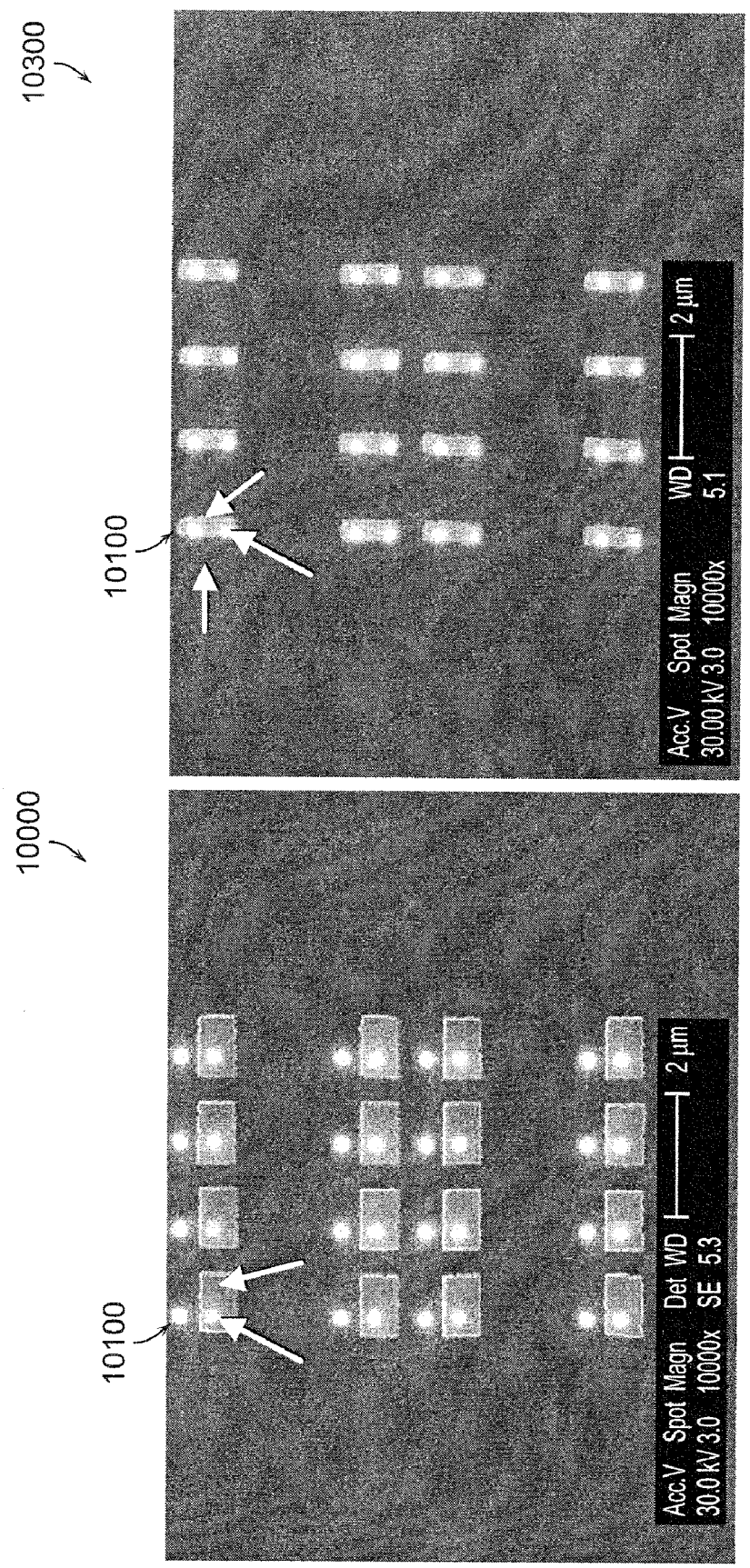
FIG. 10A shows a top SEM image of an exemplary fabricated 16 bit memory array region that corresponds to the layout of FIG. 9B and shows nonvolatile nanotube storage nodes formed using nonvolatile nanotube block switches.

SEM image 10000 illustrated in FIG. 10A shows a plan view of partially fabricated memory cells just prior to the formation of NV NT block switches corresponding to NV NT block switch 4000 illustrated in FIG. 4A, which are formed above underlying cell select transistors and array wiring corresponding to memory array layout 9200. A blanket (porous) nanotube fabric layer of approximately 40 nm thick deposited using preferred methods covers the surface insulator and wiring layer 10200 but is not visible in this SEM image due to insufficient contrast. However, a corresponding (porous) patterned nanotube block is illustrated further below by an SEM image in FIG. 10B. The blanket nanotube fabric layer was deposited using spray coating. However, a blanket nanotube fabric layer may also be formed by spin coating multiple individual nanotube fabric layers. Contact terminal 10100 illustrated in FIG. 10A corresponds to contact terminal 4010 illustrated in FIG. 4A and contact terminal 10150 corresponds to contact terminal 4015. The blanket nanotube fabric layer not visible in SEM image 10000 is in contact with the top coplanar surfaces of contact terminals 10100 and 10150 and with the top surface of insulator and wiring layer 10200, which corresponds to insulator and wiring layer 4030 in FIG. 4A. Patterned mask 10250 images on the surface of the blanket nanotube fabric layer and overlapping contact terminals 10150 are used to protect the underlying portion of the blanket nanotube fabric layer from an oxygen plasma etch step later in the process flow. Patterned mask images 10250 may be formed using $Al_2O_3$, or Ge, or any other compatible hard mask material.

Next, preferred methods etch the exposed portion of the blanket nanotube fabric layer in an oxygen plasma for example, as described further in the incorporated patent references. Next, preferred methods remove patterned mask 10250 images. Then, preferred methods form conductor segments 10400 shown in SEM image 10300 illustrated in FIG. 10A corresponding to conductor segment 9030 illustrated in FIG. 9B and conductor 4045 illustrated in FIG. 4A. Conductor segment 10400 also forms a top/side contact to the underlying NV NT block (not visible) corresponding to contact 4040 illustrated in FIG. 4A. In this example, conductor segment 10400 is formed of Ti/Pd of thickness 2/100 nm, although other metals may be used. Then, preferred methods etch remaining exposed regions of nanotube fabric using conductor segment 10400 as a mask layer to form NV NT block switches 10450 corresponding to NV NT block switch 4000 illustrated in FIG. 4A with conductor segment 10400 corresponding to combined top/side contact 4040 and conductor 4045, and bottom contact 10150 corresponding to bottom contact 4042, respectively.

At this point in the process, fabrication of the 16 bit memory array corresponding to 16 bit memory array layout 9002 is complete and SEM image 10300 of FIG. 10A shows a plan view of top layers. The NV NT block corresponding to NV NT block 4035 in FIG. 4A is not visible in SEM image 10300. However it is visible further below in FIG. 10B. Insulator and wiring layer 10200' corresponds to insulator and wiring layer 10200 but without the blanket nanotube fabric layer.

Figure 10B:
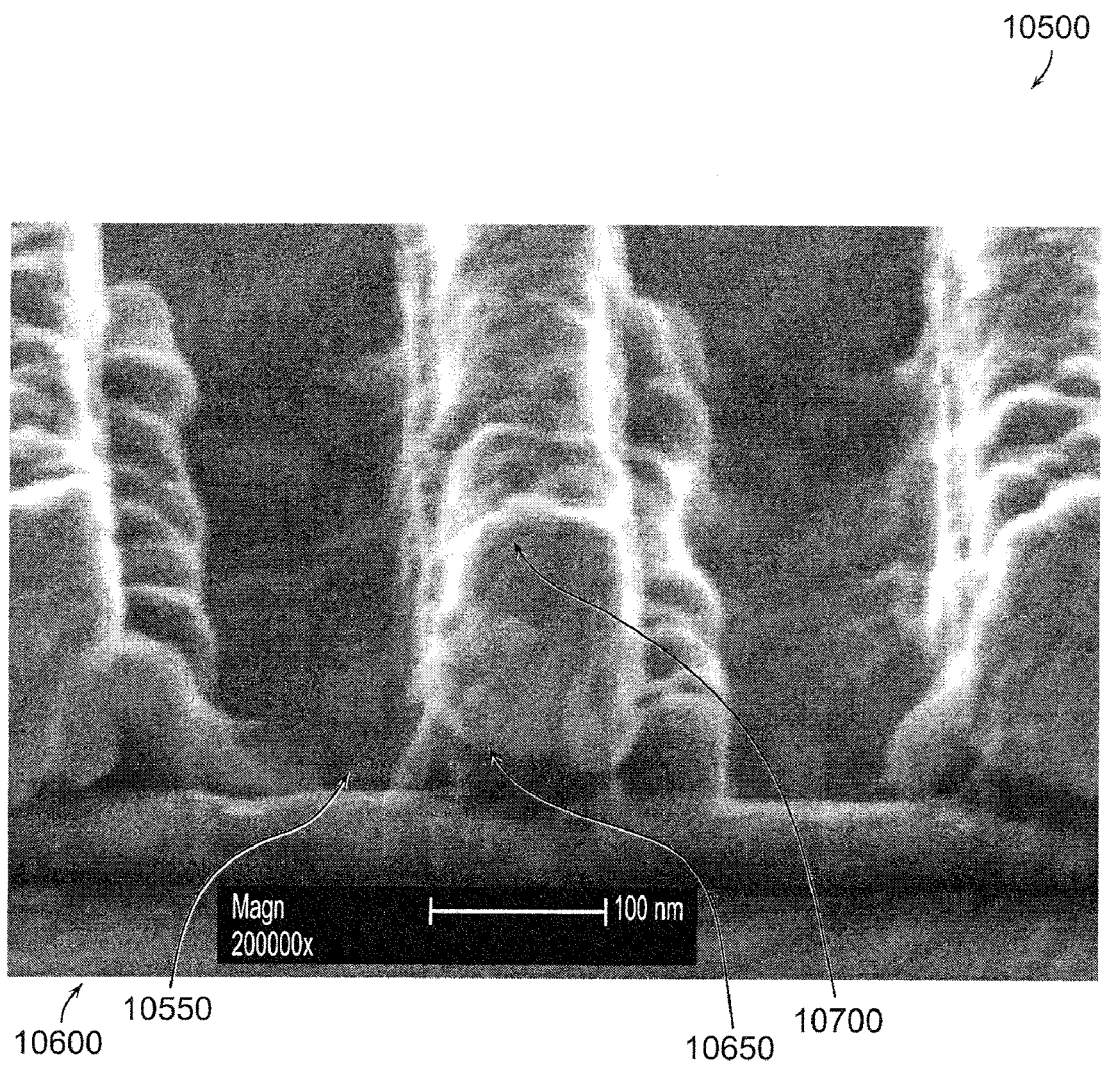
FIG. 10B shows a tilt angle SEM image of one of the exemplary nonvolatile nanotube block switches shown in of FIG. 10A.

SEM image 10500 illustrated in FIG. 10B illustrates an SEM tilt cross section image. Contact terminal 10550 on the surface of insulator and wiring layer 10600 corresponds to contact terminal 10150 in SEM image 10300 and forms a bottom contact to NV NT block 10650. Top contact terminal 10700 corresponds to that region of conductor segment 10400 in SEM image 10300 that forms a top contact to NV NT block 10650. NV NT block 10650 is approximately 25×80 nm in this example.

Test and characterization of the 16 bit memory array 9000 illustrated in schematically in FIG. 9A, in layout form with NV NT block switch storage devices illustrated in FIG. 9B, and in an SEM image 10300 of the NV NT block switch storage region formed on top layers of the 16 bit memory array structure as illustrated in FIG. 10A, is carried out based on ON/OFF state switching and resistance state readout. ON/OFF state switching results for NV NT block switches are illustrated by waveforms 4500 in FIG. 4B for switching using a single pulse of approximately 6 volts for transition between ON and OFF states. Write 0 operations switch NV NT block switches from ON to OFF or high resistance state and write 1 operations switch NV NT block switches from OFF to ON or low resistance state. As illustrated in FIG. 4B, ON resistance values are typically in the 100's of KOhm range, and OFF resistance values are typically in the giga-Ohm range. If multiple pulses are used for write 0 and write 1 operation, switching voltages may be lower than 6 volts for example. Write 0, write 1, and read voltage and current waveforms may be as described in U.S. patent application Ser. No. 11/280,786 and U.S. patent application Ser. Nos 11/835,651, 11/835,759, 11/835,845, 11/835,852, 11/835,856 and 11/835,865, entitled "Nonvolatile Nanotube Diodes and Nonvolatile Nanotube Blocks and Systems Using Same and Methods of Making Same," all filed Aug. 8, 2007.

16 bit memory array 9000 illustrated schematically in FIG. 9A and in layout in FIG. 9B has CMOS buffer circuits (not shown) between pads and word lines (WLs) and buffer circuits (not shown) between pads and bit lines (BLs) as fabricated. Second word lines (WWLs) are connected directly to pads without CMOS buffer circuits.

In operation, at relatively low voltages such as 5 volts for example, write 0, write 1, and read operations may be performed by word and bit lines with secondary word lines at a reference voltage such as ground. For higher voltages, greater than 5 volts for example, write 0 and write 1 pulses may be applied using secondary word lines with cells selected by a corresponding word line, thereby reducing the voltage across cell select transistors and CMOS buffer circuits. This ability to change applied voltage polarity and current direction is enabled by the bidirectional properties of NV NT block switches (also applies to NV NT switches) that switch regardless of the applied voltage polarity and current flow direction. As part of the 16 bit memory array 9000 characterization, write 0 and write 1 voltages to individual cells were varied over a wide range (schoomed) voltage values and therefore write 0 and write 1 pulses were applied using secondary word lines. Read operations used low voltage bit line discharge (typically less than 4 volts for example) with word lines activated and secondary word lines grounded.

Figure 11A:
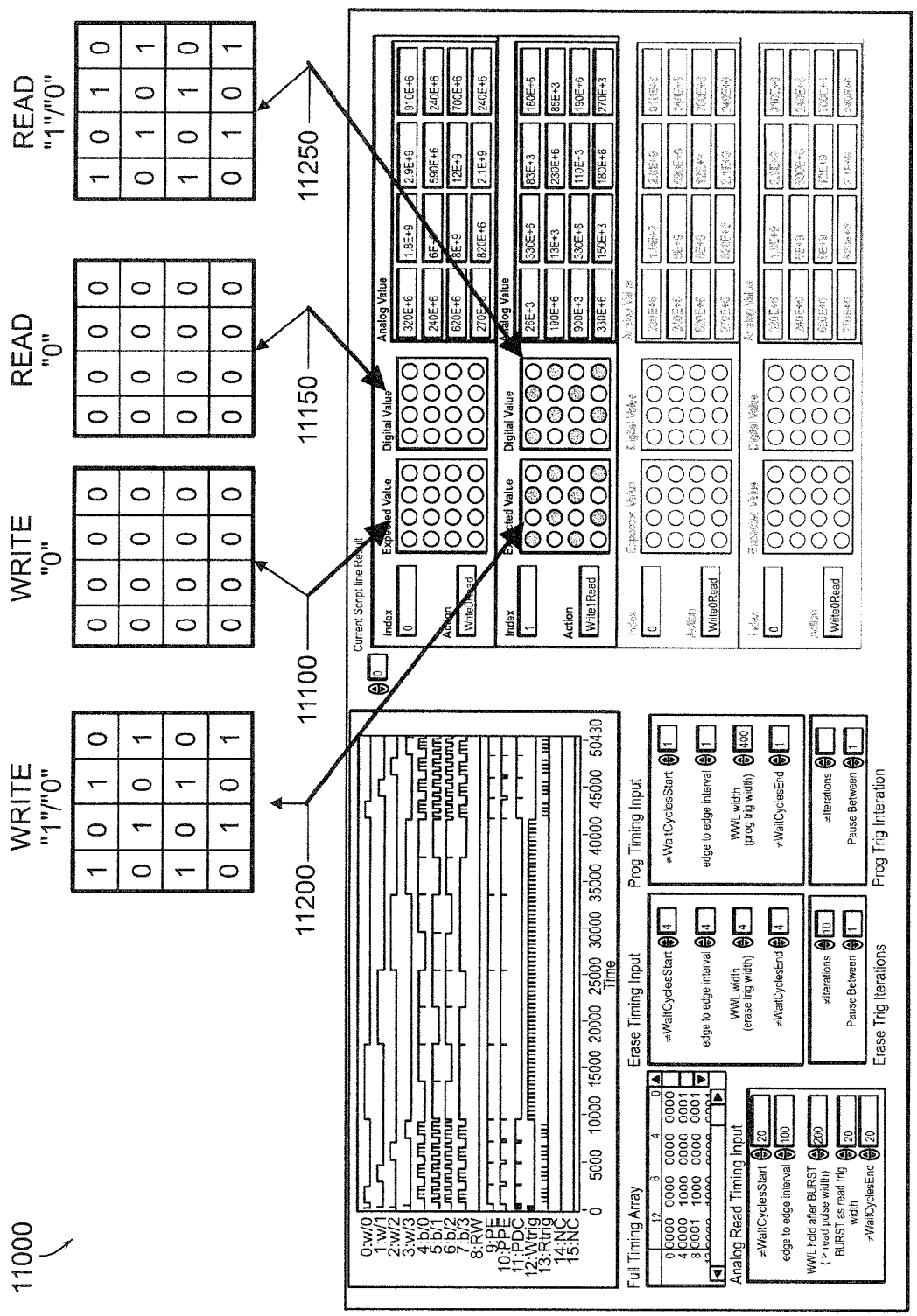
FIG. 11A shows test results of write 0 and write 1 memory operations performed on the exemplary 16 bit memory array illustrated in FIGS. 9A-10B.

Display readout 11000 illustrated in FIG. 11A shows the results of write 0, write 1, and read operations on an exemplary 16 bit memory array 9000 with NV NT block switches as described further above. For a write 0 operation, all four bits along a selected word line are erased simultaneously.

Hence, bit lines BL0, BL1, BL2, and BL3 are all held at zero volts and a selected word line such as word line WL0 is switched from 0 volts to a higher voltage such as 5 volts for example. Then, one or several voltage pulse/pulses is/are applied to corresponding secondary word line WWL0. The WWL0 pulse amplitude may be varied from 4 to 8 volts, for example. Corresponding NV NT block switch NT00 switches from ON to OFF, or remains in the OFF state. Write 0 operations are repeated with WL1 and WWL1, WL2 and WWL2, and WL3 and WWL3 until all bits are in on OFF state. Bit pattern 11100 illustrated in FIG. 11A represents a write 0 (OFF state) for each of the 16 bits in 16 bit memory array 9000 such that each bit is an OFF or high resistance state.

For a read operation, a bit line such as bit line BL0 is switched to a voltage less than 3 or 4 volts, for example, and a selected word line such as word line WL0 activates an NFET select transistor such as T00 to an ON state and connects BL0 through a corresponding NV NT block such as NT00 to corresponding secondary word line such as WWL0 which is grounded. If the corresponding NV NT block switch NT00 is in an OFF state, BL0 remains unchanged and a "0" or OFF state is detected. However, if corresponding NV NT block switch NT00 is in a "1" or ON state, then bit line BL0 voltage is reduced (droops) and a "1" state is detected. In this example, a read operation results in bit pattern 11150 where all bits are in a "0" or OFF state such that output bit pattern 11150 corresponds to input bit pattern 11100.

A write 1 operation is performed one bit at a time along a selected word line such as WL0 and corresponding secondary word line WWL0, for example. A logic "1" or low resistance state is written in cell C00 by holding bit line BL0 at zero volts, while bit lines BL1, BL2, and BL3 are held at a higher voltage such as 4 or 5 volts for example. Then, one or several voltage pulse/pulses is/are applied to corresponding secondary word line WWL0. The WWL0 pulse amplitude may be varied from 4 to 8 volts, for example, and cell C00 switches from a logic "0" high resistance state and stores a nonvolatile logic "1" or low resistance state on NT00. C01 is to store a zero in this example, therefore no pulses are applied since the entire array was erased prior to the write 0 operation as described further above with respect to write 0 operations.

The write 1 operation proceeds one bit at a time as described above with respect to the write 1 operation description further above until checkerboard pattern 11200 is written in memory array 9000. In this example, checkerboard pattern 11200 is applied to the pre-erased 16 bit memory array 9000. Then, a read operation results in a corresponding checkerboard bit pattern 11250, and the 16 bits in memory array 9000 remain stored in nonvolatile logic "0" or "1" state as illustrated by display readout 11000.

Individual NV NT block switches 10450 illustrated in FIG. 10A are switched between ON and OFF, low and high resistance states respectively, as a function of applied voltages as described further above. In a first case, described further below with respect to FIG. 11B, fast rise and fall times such as 2 ns are used. In a second case, described further below with respect to FIG. 11C, slow rise and fall times such as 10 us are used. In both cases 10 pulses were used for both write 0 and write 1 switching. Also, in both cases, hold time of 20 us for write 0 and 1 ms for write 1 are used. Generally, test conditions are similar to those described with respect to ON/OFF switching described with respect to FIGS. 4B and 5B and U.S. patent application Ser. No. 11/280,786 and U.S. patent application Ser. Nos. 11/835,651, 11/835,759, 11/835,845, 11/835,852, 11/835,856, and 11/835,865, all filed Aug. 8, 2007, entitled "Nonvolatile Nanotube Diodes and Nonvolatile Nanotube Blocks and Systems Using Same and Methods of Making Same."

Figure 11B:
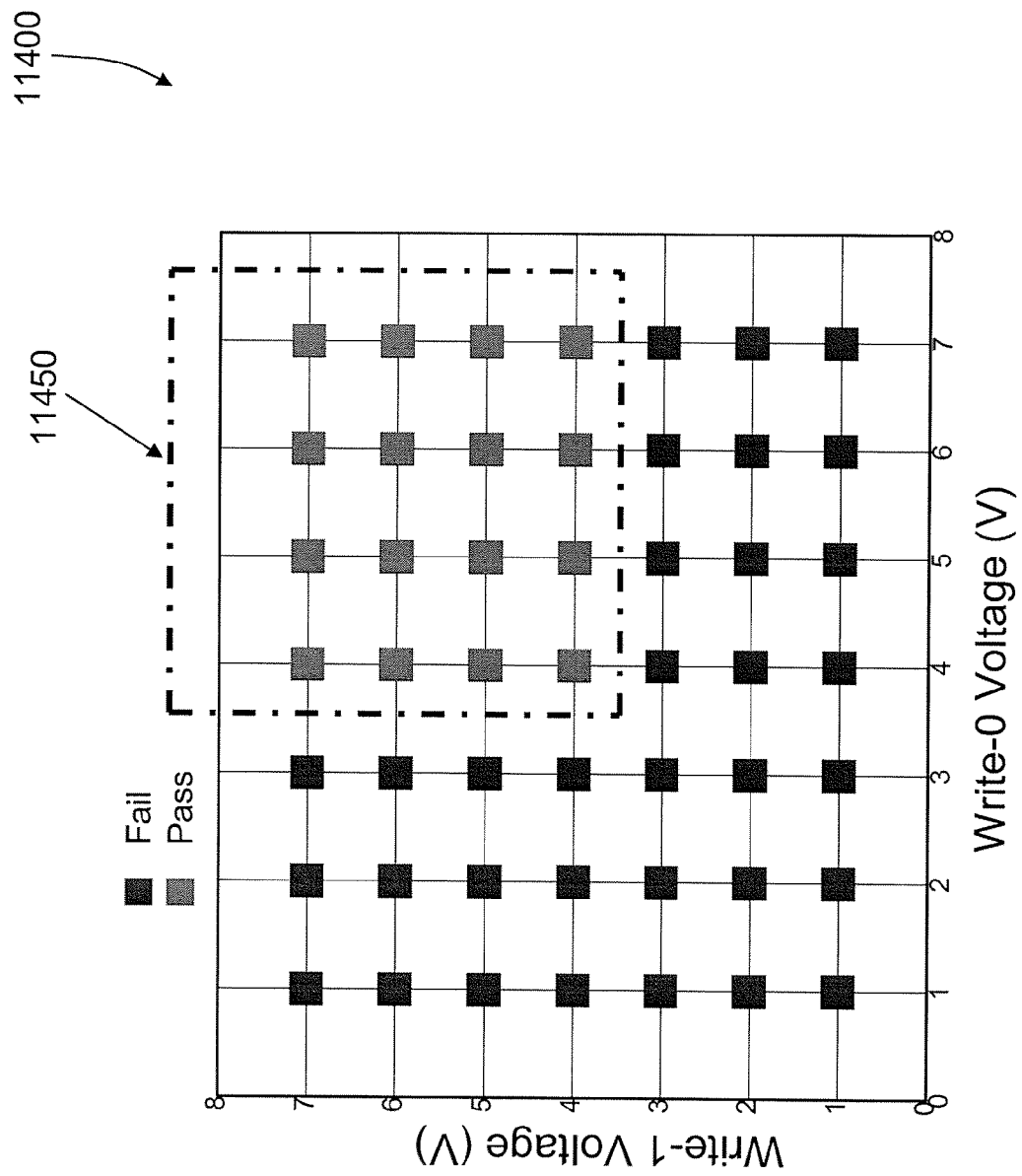
FIG. 11B shows a schmoo plot write 0 and write 1 operating voltages for individual bit (cell) locations in the exemplary 16 bit memory array illustrated in FIGS. 9A-10B.

Schmoo plot 11400 illustrated in FIG. 11B shows pass and fail regions for write 0 operations in a range of 1 to 7 volts along the horizontal axis and write 1 operations in a range of 1 to 7 volts in the vertical direction. Pass region 11450 shows that write 0 and write 1 operations with applied voltages of 4 volts and above result in successful switching of NV NT block switches similar to NV NT block switches 10450. Write 0 and write 1 voltages outside pass region 11450 are fails.

Figure 11C:
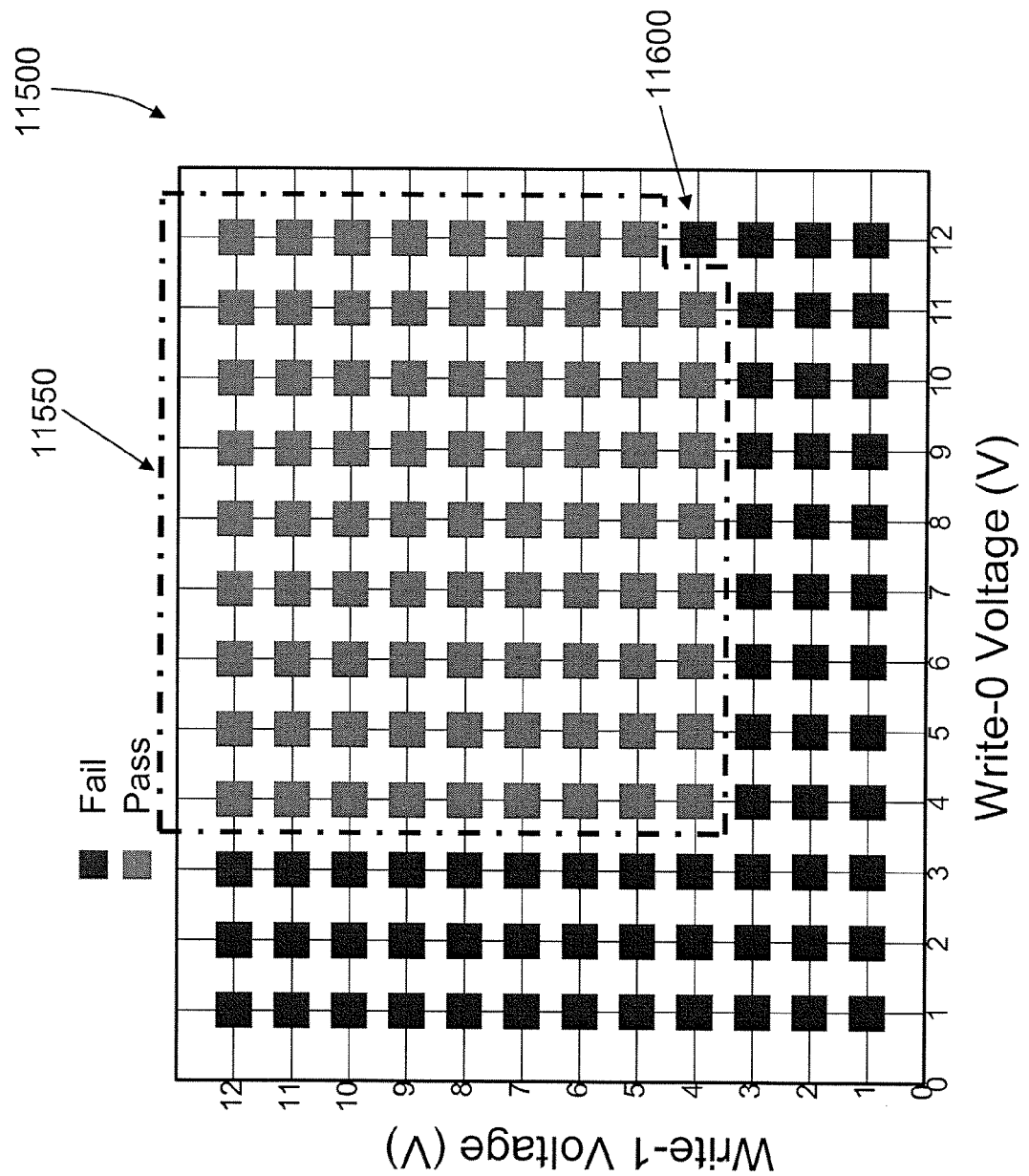
FIG. 11C shows another schmoo plot of write 0 and write 1 operating voltages for individual bit (cell) locations in the exemplary 16 bit memory array illustrated in FIGS. 9A-10B.

Schmoo plot 11500 illustrated in FIG. 11C shows pass and fail regions for write 0 operations in a range of 1 to 12 volts along the horizontal axis and write 1 operations in a range of 1 to 12 volts in the vertical direction. Pass region 11550 shows that write 0 and write 1 operations with applied voltages of 4 volts and above result in successful switching of NV NT block switches similar to NV NT block switches 10450. Write 0 and write 1 voltages outside pass region 11550 are fails. One exception is a NV NT block switch that, in some embodiments, switches at a minimum of 5 volts for the write 1 operation as indicated by location 11600.

Memory Arrays Using NV NT Switches or NV NT Block Switches as Nonvolatile Nanotube Storage Nodes with Bit Lines Adjacent to the NV Storage Node Location Memory arrays may be formed by interconnecting nonvolatile memory cells that include a select transistor such as an NFET, a nonvolatile nanotube storage node such as a NV NT switch or a NV NT block switch, and interconnects within the cell and between the cell and array lines such as word lines, bit lines, and secondary word lines as shown in memory array schematic 9000 illustrated in FIG. 9A. FIG. 8D summarizes various types of nonvolatile nanotube storage nodes 1-13, includes a brief description of each type of NV NT storage node, integration level within an integrated structure, and corresponding Figure numbers.

For ease of integration, some embodiments of nonvolatile nanotube storage nodes such as NV NT switches or NV NT block switches may be positioned at or near the top of the memory array structure, and optionally offset relative to memory array bit lines further below in the integrated structure, in order to facilitate a direct vertical connection between a first nonvolatile nanotube storage node and an underlying source of a corresponding NFET select transistor. That is, the NFET select transistor, stud connection to source and drain diffusions, and array lines such as word lines, bit lines, and secondary bit lines can be formed prior to the formation of the nonvolatile nanotube storage node, which can be formed at or near the end of the process flow. Nonvolatile nanotube storage nodes placed at or near the top of integrated structures provide enhanced flexibility in the selection of contact terminal metals and insulator options, as well as no-insulator options, that may enhance the electrical performance of the nonvolatile nanotube storage node. In some embodiments, however, cell areas may be somewhat larger, e.g., 50% to 100% larger, and in some configurations, more than 200% larger.

Memory cells with NV NT switches or NV NT block switches at or near the top of memory cells are described further below with respect to FIGS. 12A-15 with cell area summarized in FIG. 20B, which is described further below.

Memory Arrays Using NV NT Switches Placed Above the Array Wiring

Figure 12A:
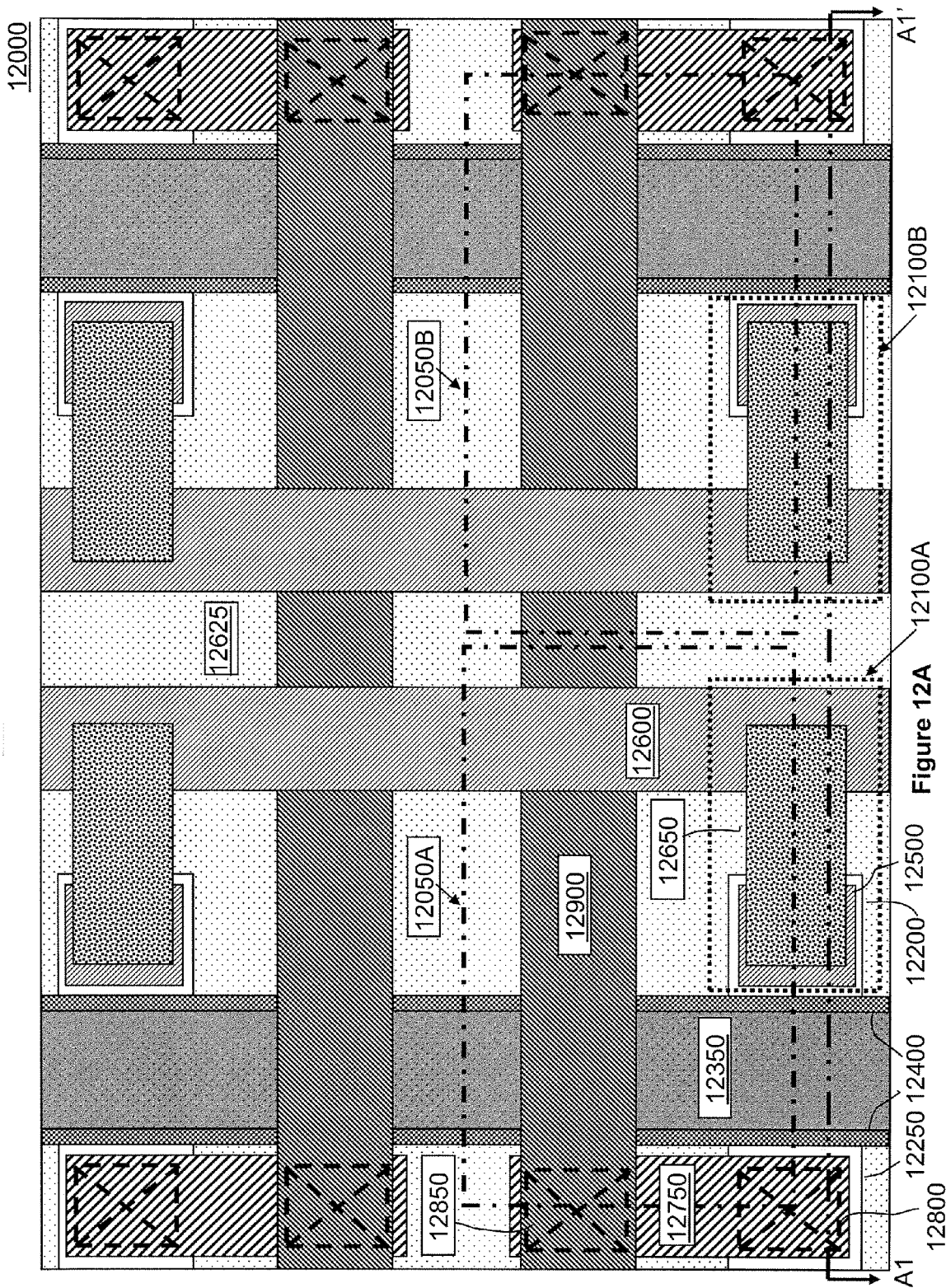
FIG. 12A illustrates a top view of an embodiment of four memory array cells with nonvolatile nanotube switches used as nonvolatile nanotube storage nodes and formed on the top surface of the cell region.
Figure 12B:
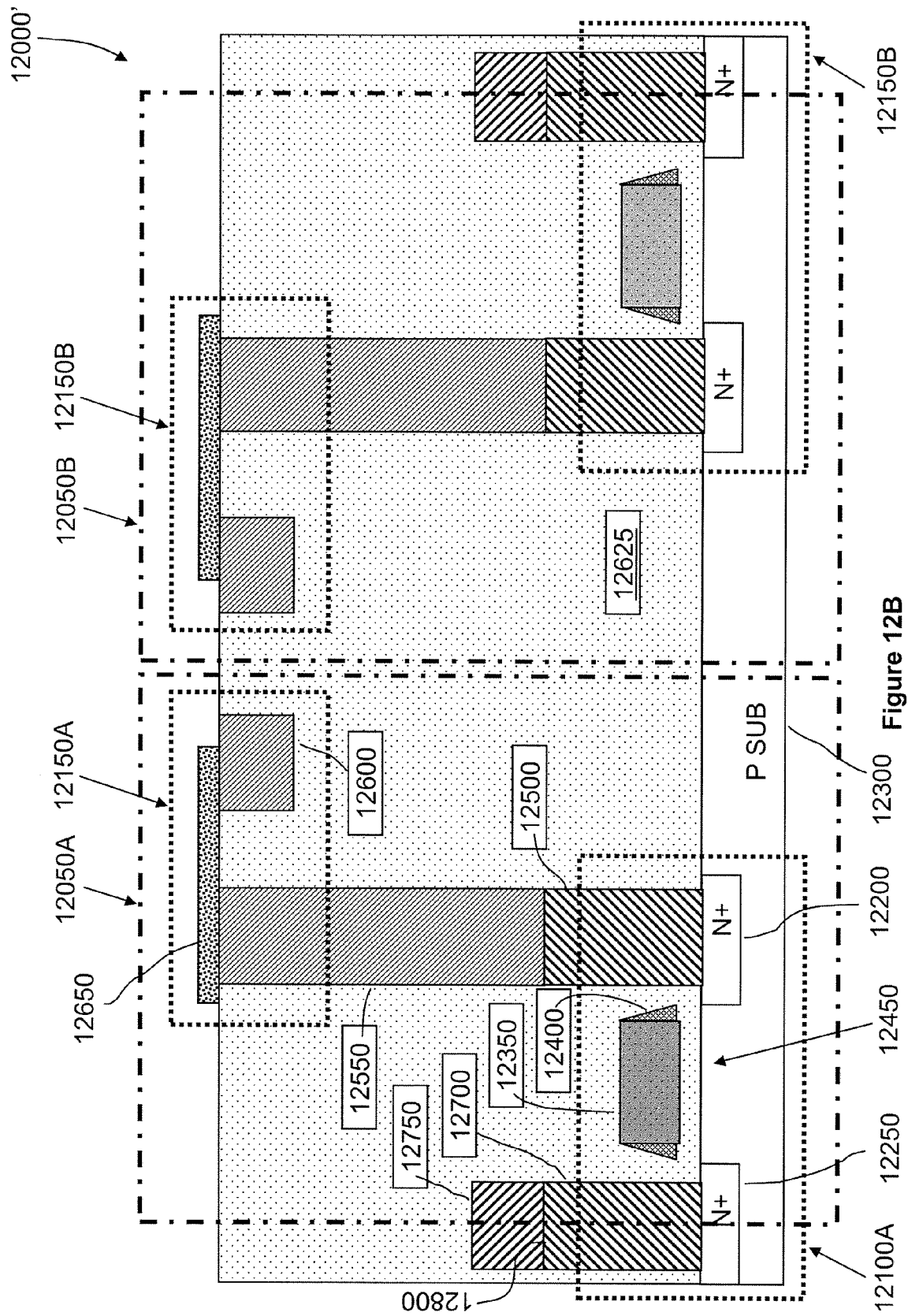
FIG. 12B illustrates a cross section of the memory array cell embodiment illustrated in FIG. 12A.

FIG. 12A illustrates a plan view of memory array 12000 showing four memory cells that use NV NT switches as nonvolatile storage devices at or near the top of the memory array 12000 structure. FIG. 12B illustrates corresponding memory array 12000' cross section taken along segment A1-A1'. Memory cells 12050A and 12050B are mirror images of one another. Memory cell 12050A will be used to describe the cell structure typical of cells in memory array 12000. While memory cell 12050A shows NV NT storage node 12150A as non-insulated NV NT switch 2000 illustrated in FIG. 2A further above and listed in FIG. 8D as NV NT storage node #1, any of the insulated or non-insulated NV NT storage nodes numbered 1-8 and listed in FIG. 8D may be used instead as NV NT storage node 12150A.

Cell select transistor 12100A includes source 12200 and drain 12250 formed in silicon substrate 12300. Gate 12350, fabricated with sidewall spacers 12400, is part of array word line 12350 that forms gate regions and array interconnections and controls channel region 12450 ON and OFF states using well known FET device operating methods. Alternatively, a separate word line conductor (not shown) may be used to interconnect gate regions of select devices such as cell select transistor 12100A illustrated in FIGS. 12A and 12B. Stud 12500, embedded in dielectric 12625, provides a conductive path between source 12200 and stud 12550, which in turn forms a first contact terminal of NV NT switch 12150A. A second contact terminal 12600 of NV NT switch 12150A is segment of secondary word line 12600. NV NT element 12650 contacts the top coplanar surface of contact terminal 12550 and a segment of secondary word line 12600 and also the top surface of coplanar insulator 12625. NV NT switch 12150B is a mirror image of NV NT switch 12150A.

Drain 12250 of cell select transistor 12100A contacts stud 12700, which in turn contacts conductor segment 12750 at contact 12800. Conductor segment 12750 also contacts memory array bit line 12900 at contact 12850 thereby connecting drain diffusion 12250 with bit line 12900. Drain 12250 is shared with an adjacent cell (not visible in FIG. 12A or 12B).

As described further above, NV NT storage nodes 12150A and 12150B may be one of several non-insulated NV NT switches. For example, NV NT switch 2000 illustrated in FIG. 2A and NV NT switch 3000 illustrated in FIG. 3 may be used without a protective dielectric layer for applications where chips are mounted in hermetic packages.

Alternatively, NV NT storage nodes 12150A and 12150B may be one of several insulated NV NT switches. NV switches 6000 illustrated in FIG. 6A, 6020 illustrated in FIG. 6B, 6040 illustrated in FIG. 6C, 6060 illustrated in FIG. 6D, 7000 illustrated in FIG. 7A, and 7050 illustrated in FIG. 7B may be used for example. Other embodiments can also be used. These NV NT switches may be insulated with a single insulator layer, combinations of insulator layers, and combinations of insulator layers and gap regions as illustrated in the respective Figures described further above. Other embodiments cover the NV NT switch with conductor, as described in greater detail herein.

In some embodiments, memory cells such as memory cells 12050A and 12050B forming memory array 12000 are estimated to be approximately $20F^2$ in area, where F is a minimum technology node dimension. It is further assumed that self-aligned vertical studs are used when forming the cell structure. Such stacked contacts and filled via holes (vertical studs) are illustrated in the prior art reference Ryan, J. G. et al., "The evolution of interconnection technology at IBM", Journal of Research and Development, Vol. 39, No. 4, Jul. 1995, pp. 371-381, the entire contents of which are incorporated herein by reference. If vertical studs are not self-aligned, the cell area is estimated to grow by more than 2× in size (footprint), to greater than $40F^2$ as illustrated in FIG. 20B, as described in greater detail below.

Figure 13A:
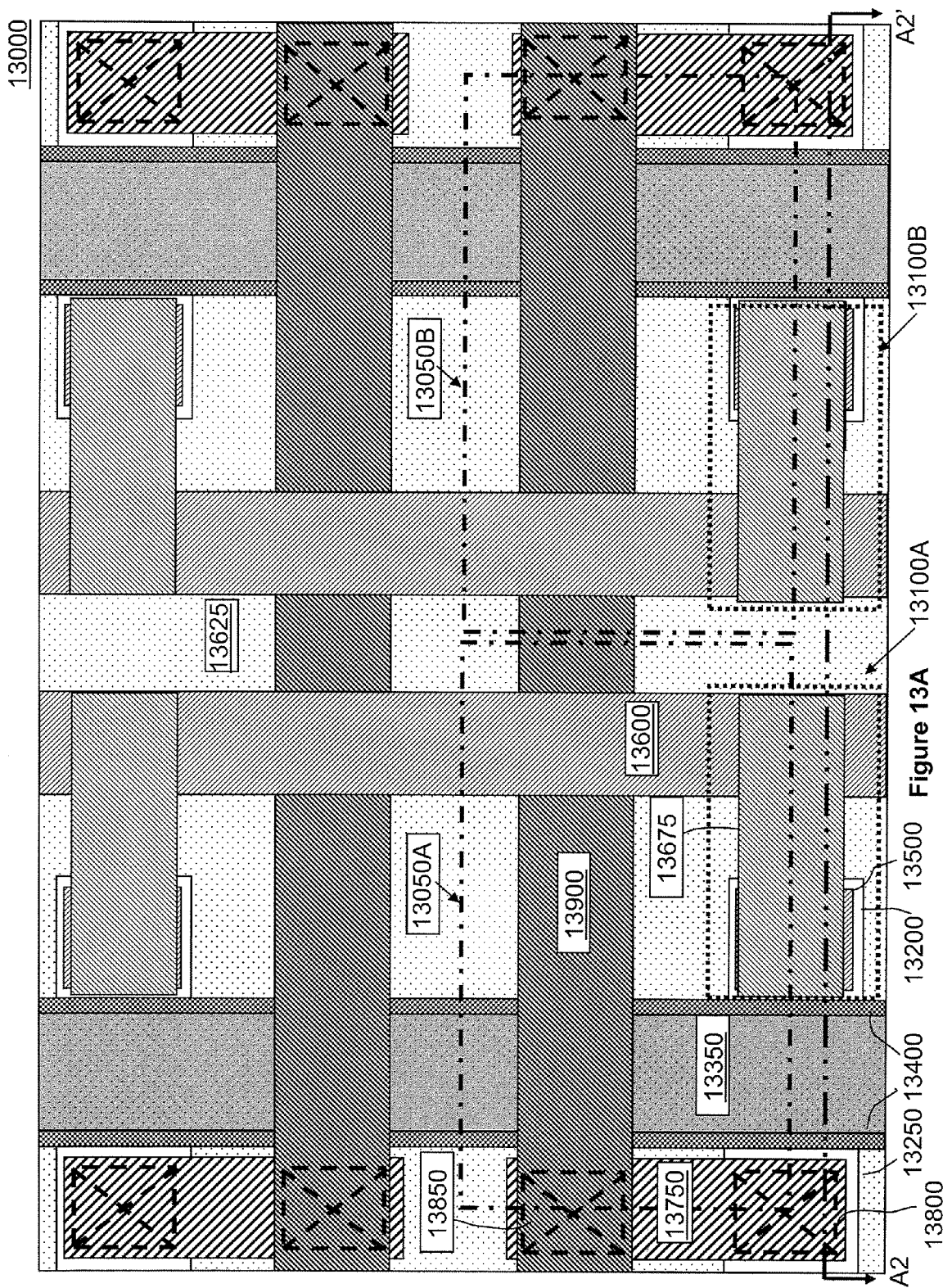
FIG. 13A illustrates a top view of an embodiment of four memory array cells with top/side and bottom contact terminal-type nonvolatile nanotube block switches used as nonvolatile nanotube storage nodes and formed on the top surface of the cell region.
Figure 13B:
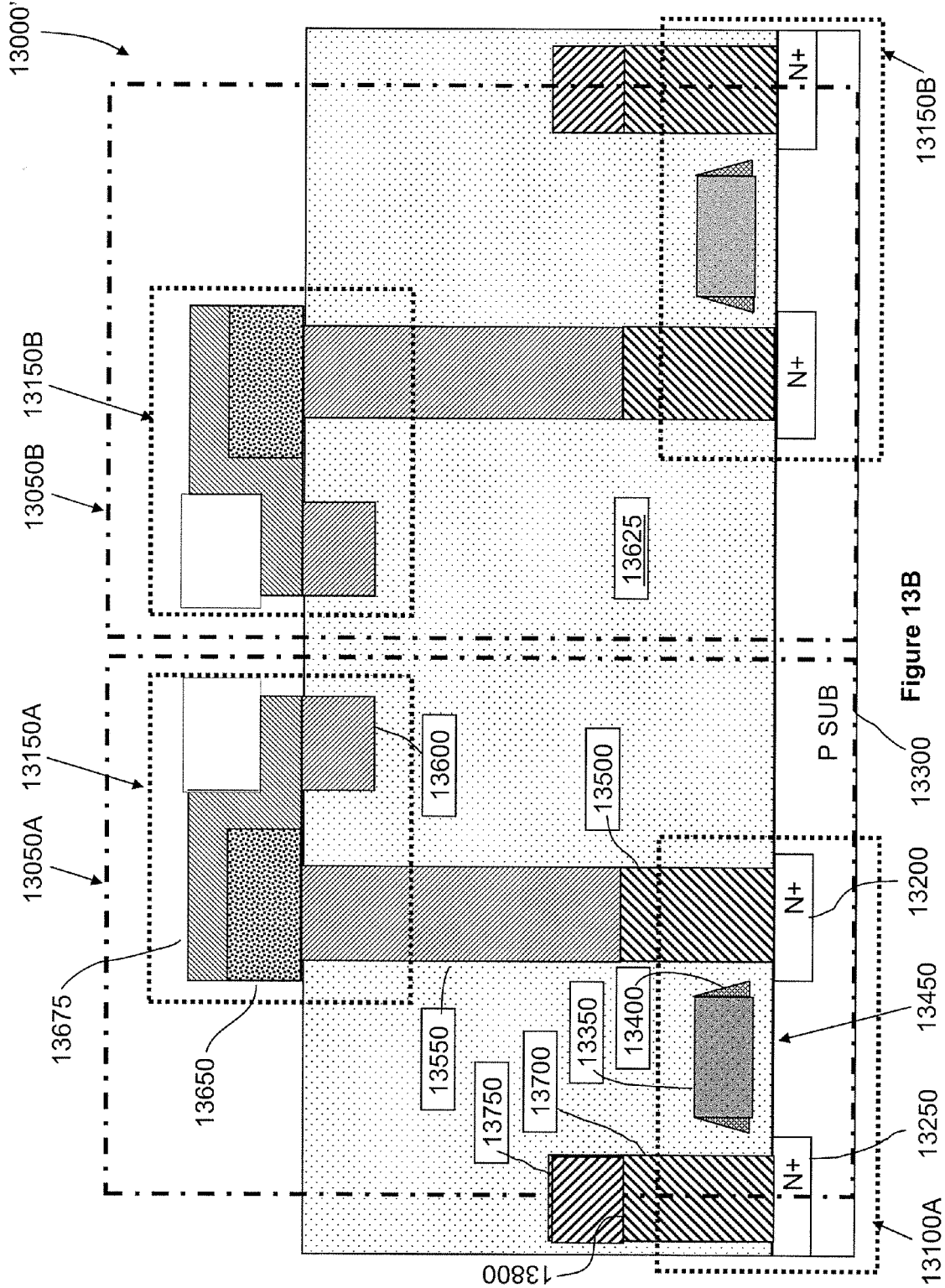
FIG. 13B illustrates a cross section of the memory array cell embodiment illustrated in FIG. 13A.

Memory Arrays Using NV NT Block Switches with Top/Side and Bottom Contacts Placed Above the Array Wiring FIG. 13A illustrates a plan view of memory array 13000 showing four memory cells that use NV NT block switches as nonvolatile storage devices at or near the top of the memory array 13000 structure. FIG. 13B illustrates corresponding memory array cross section 13000' taken along segment A2-A2'. Memory cells 13050A and 13050B are mirror images of one another. Memory cell 13050A will be used to describe the cell structure typical of cells in memory array 13000. While memory cell 13050A shows NV NT storage node 13150A as non-insulated NV NT block switch 4000 illustrated in FIG. 4A further above and listed in FIG. 8D as NV NT storage node #9, any of the insulated or non-insulated NV NT storage nodes numbered 9, 11, or 12 and listed in FIG. 8D may be used instead as NV NT storage node 13150A. NV NT block switch 4000 used to describe memory array 13000 corresponds to NV NT block switch 10450 shown further above in SEM image 10300 illustrated in FIG. 10A.

Cell select transistor 13100A includes source 13200 and drain 13250 formed in silicon substrate 13300. Gate 13350, fabricated with sidewall spacers 13400, is part of array word line 13350 that forms gate regions and array interconnections and controls channel region 13450 ON and OFF states using well known FET device operating methods. Alternatively, a separate word line conductor (not shown) may be used to interconnect gate regions of select devices such as cell select transistor 13100A illustrated in FIGS. 13A and 13B. Stud 13500, embedded in dielectric 13625, provides a conductive path between source 13200 and stud 13550, which in turn forms a first contact terminal to NV NT block 13650 of NV NT block switch 13150A. NV NT block 13650 overlaps both stud 13500 that acts as a bottom contact terminal and a portion of the surface of insulator 13625, also referred further above as overlap length $L_{OL}$. A second contact terminal to the top surface and one side surface of NV NT block 13650 is formed by conductor segment 13675 that also contacts terminal 13600 of NV NT switch 13150A, which is a segment of secondary word line 13600. NV NT block switch 13150B is a mirror image of NV NT block switch 13150A.

Drain 13250 of cell select transistor 13100A contacts stud 13700, which in turn contacts conductor segment 13750 at contact 13800. Conductor segment 13750 also contacts memory array bit line 13900 at contact 13850 thereby connecting drain diffusion 13250 with bit line 13900. Drain 13250 is shared with an adjacent cell (not visible in FIG. 13).

As described further above, NV NT storage nodes 13150A and 13150B may be a non-insulated NV NT block switch. For example, NV NT block switch 4000 illustrated in FIG. 4A may be used without a protective dielectric layer for applications where chips are mounted in hermetic packages. 16 bit memory array 9000 illustrated further above schematically in FIG. 9A, in layout 9002 in FIG. 9B, and SEM image 10300 in FIG. 10A is an example of a fabricated memory array 13000.

Alternatively, NV NT storage nodes 13150A and 13150B may be one of several insulated NV NT block switches. NV block switches 8000 illustrated in FIGS. 8A and 8020 illustrated in FIG. 8B may be used for example. These NV NT block switches may be insulated with a single insulator layer, combinations of insulator layers, and combinations of insulator layers and gap regions as illustrated in the respective Figures described further above.

In some embodiments, memory cells such as memory cells 13050A and 13050B forming memory array 13000 are estimated to be approximately 20 $F^2$ in area, where F is a minimum technology node dimension. It is further assumed that self-aligned vertical studs are used when forming the cell structure. Such stacked contacts and filled via holes (vertical studs) are illustrated further in the incorporated references. If vertical studs are not self-aligned, the cell area is estimated to grow by more than 2× in size (footprint), to greater than $40F^2$ as illustrated further below in FIG. 20B.

Figure 14A:
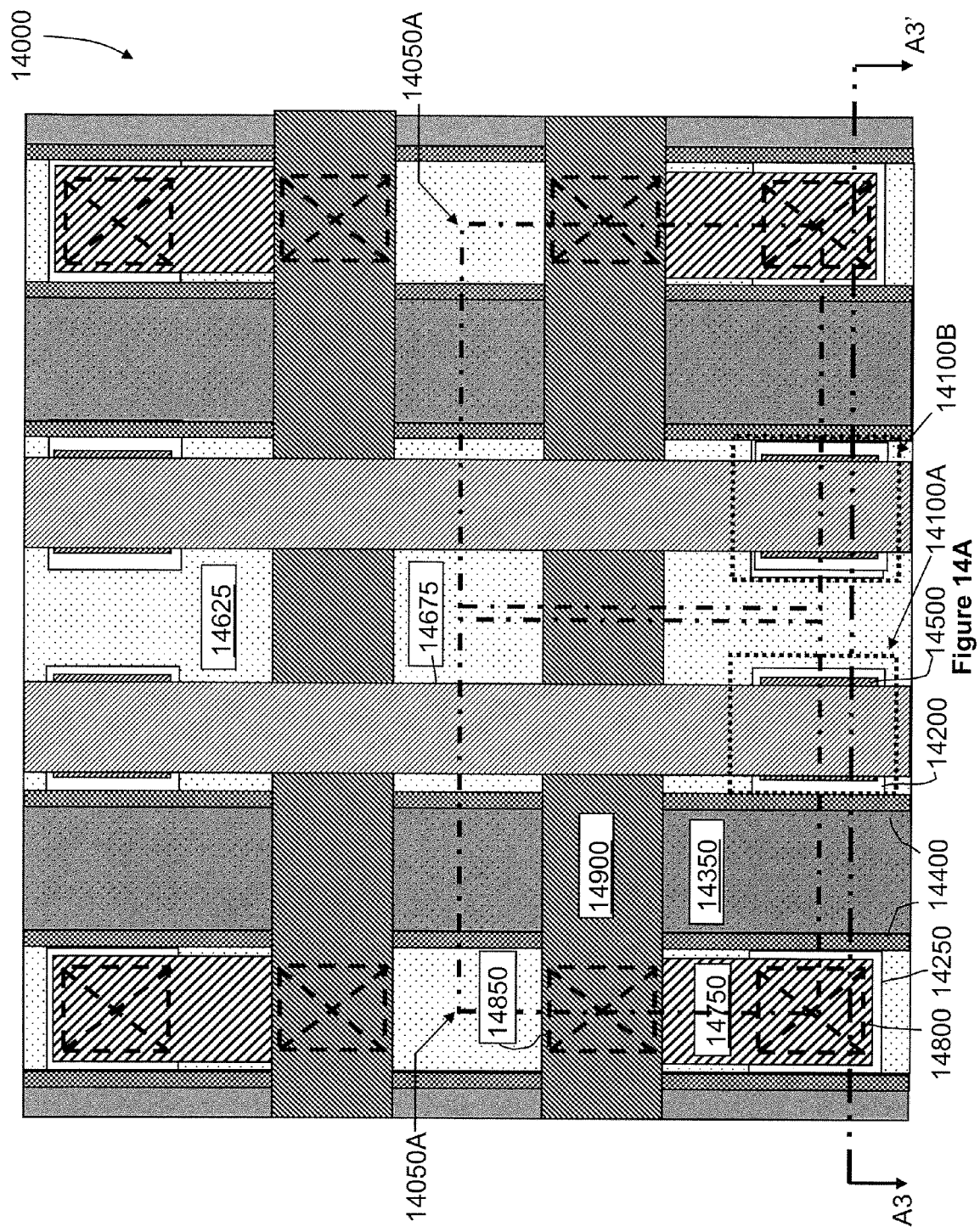
FIG. 14A illustrates a top view of an embodiment of four memory array cells with top and bottom contact terminal-type nonvolatile nanotube block switches used as nonvolatile nanotube storage nodes and formed on the top surface of the cell region.

Memory Arrays Using, NV NT Block Switches with Top and Bottom Contacts Placed Above the Array Wiring FIG. 14A illustrates a plan view of memory array 14000 showing four memory cells that use NV NT block switches as nonvolatile storage devices at or near the top of the memory array 14000 structure. FIG. 14B illustrates corresponding memory array cross section 14000' taken along segment A3-A3'. Memory cells 14050A and 14050B are mirror images of one another. Memory cell 14050A will be used to describe the cell structure typical of cells in NRAM memory array 14000. Memory cell 14050A uses insulated NV NT block switch 5000 illustrated in FIG. 5A further above and listed in FIG. 8D as NV NT storage node #10.

Cell select transistor 14100A includes source 14200 and drain 14250 formed in silicon substrate 14300. Gate 14350, fabricated with sidewall spacers 14400, is part of array word line 14350 that forms gate regions and array interconnections and controls channel region 14450 ON and OFF states using well known FET device operating methods. Alternatively, a separate word line conductor (not shown) may be used to interconnect gate regions of select devices such as cell select transistor 14100A illustrated in FIGS. 14A and 14B. Stud 14500, embedded in dielectric 14625, provides a conductive path between source 14200 and stud 14550, which in turn forms a first bottom contact terminal to NV NT block 14600 of NV NT block switch 14150A. A second top contact terminal 14650 to NV NT block 14600 is used as a top contact terminal and may be used as a mask when defining self-aligned NV NT block 14650 side surfaces as described further in the incorporated patent references. Top contact terminal 14650 contacts secondary word line 14675. NV NT block switch 14150B is a mirror image of NV NT block switch 14150A.

Drain 14250 of cell select transistor 14100A contacts stud 14700, which in turn contacts conductor segment 14750 at contact 14800. Conductor segment 14750 also contacts memory array bit line 14900 at contact 14850 thereby connecting drain diffusion 14250 with bit line 14900. Drain 14250 is shared with an adjacent cell (not visible in FIG. 14A or 14B).

Memory cells such as memory cells 14050A and 14050B forming memory array 14000 with NV NT block switches 14150A and 14150B as NV NT storage nodes form dense cells because of the compact 3-dimensional top and bottom contact NV NT block switch geometry (structure). In some embodiments, memory cell area (footprint) is estimated to be approximately 12-15 $F^2$ in area, where F is a minimum technology node dimension. It is further assumed that self-aligned vertical studs are used when forming the cell structure. Such stacked contacts and filled via holes (vertical studs) are illustrated further in the incorporated references. If vertical studs are not self-aligned, the cell area is estimated in some embodiments to grow by more than 2× in size (footprint), to greater than $30F^2$ as illustrated in FIG. 20B, described in greater detail below.

Figure 15:
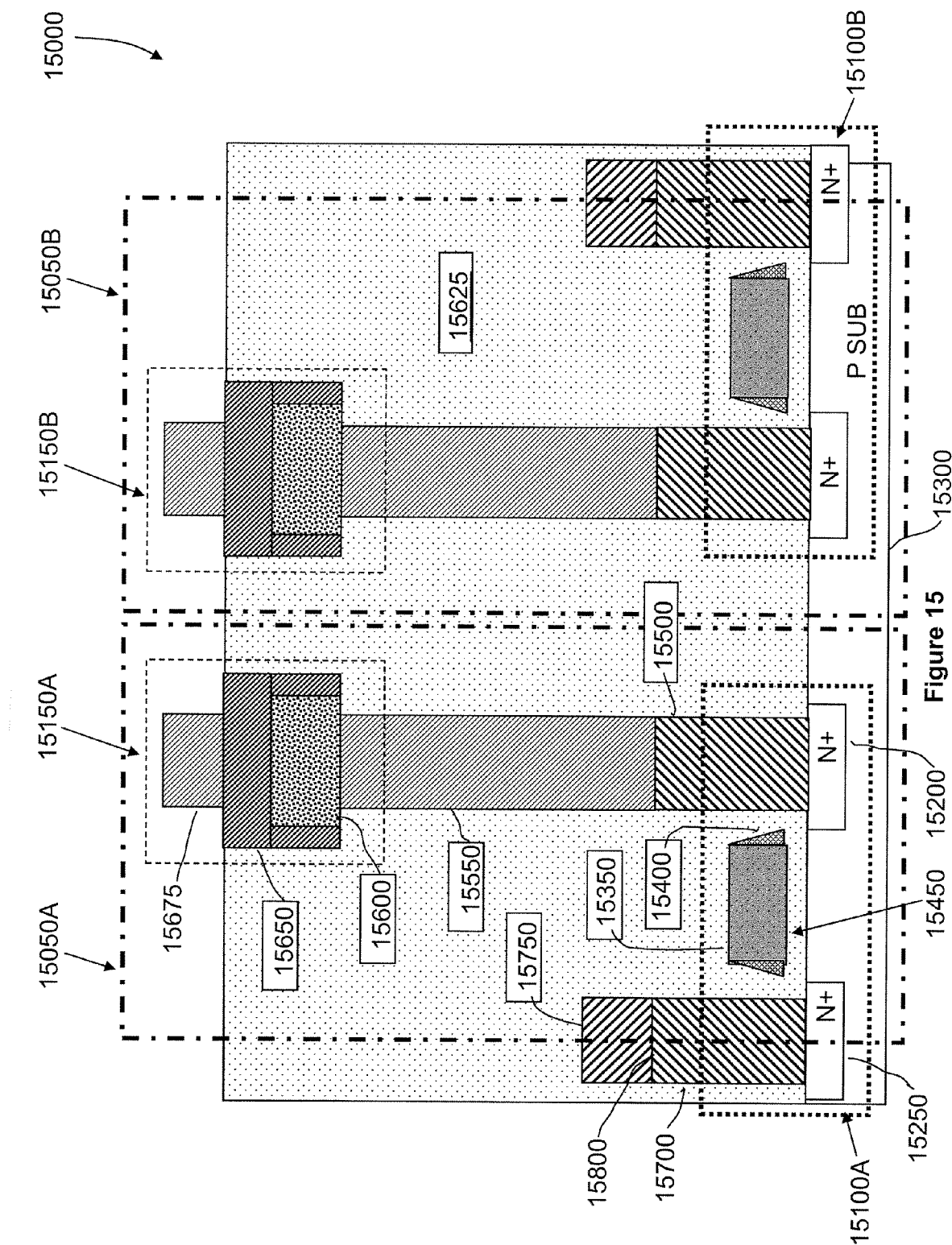
FIG. 15 illustrates a cross section of an embodiment of memory array cells with top and bottom contact terminal-type enclosed nonvolatile nanotube block switches used as nonvolatile nanotube storage nodes and formed on the top surface of the cell region.

Memory Arrays Using Enclosed NV NT Block Switches with Top/All-Sides and Bottom Contacts Placed Above the Array Wiring FIG. 15 illustrates a cross section of memory array 15000 showing two memory cells that use enclosed NV NT block switches as nonvolatile storage devices at or near the top of the memory array 15000 structure. Memory cells 15050A and 15050B are mirror images of one another. Memory cell 15050A will be used to describe the cell structure typical of cells in memory array 15000. Memory cell 15050A replaces insulated NV NT block switch 5000 used in memory cell 14050A and listed in FIG. 8D as NV NT storage node #10 with insulated enclosed NV NT block switch 8050 illustrated in FIG. 8C further above and listed in FIG. 8D as NV NT storage node #13.

Insulators in contact with NV NT block surfaces may leave the electrical characteristics unchanged, may enhance the electrical characteristics, or may even limit the electrical operation of NV NT block switches. In order to facilitate NV NT block switch integration in memory arrays, sensitivity to choice of insulator material may be reduced or eliminated by using an enclosed NV NT block switch that includes a top/all-sides contact terminal which prevents top and all-side surface contacts of the corresponding NV NT block with insulators. Memory cell 15050A is similar to cell 14050A illustrated in FIGS. 14A and 14B in plan view (layout) and cross section, respectively. Therefore, only a cross section of memory array 15000 is shown in FIG. 15. Enclosed NV NT block switch 15150A is a modification of NV NT block switch 14150A in which a conductor in contact with the top surface of NV NT block 15600 also encloses (enrobes) NV NT block 15600 to create top/all-sides contacts as described further above with respect to enclosed NV NT block switch 8050 shown in FIG. 8C. The enveloping (enrobing) conductor may be relatively thin, 5 to 50 nm for example, and is used to form enclosed NV NT block side surface contacts and prevent side surface contacts with insulator material.

Cell select transistor 15100A includes source 15200 and drain 15250 formed in silicon substrate 15300. Gate 15350, fabricated with sidewall spacers 15400, is part of array word line 15350 that forms gate regions and array interconnections and controls channel region 15450 ON and OFF states using well known FET device operating methods. Alternatively, a separate word line conductor (not shown) may be used to interconnect gate regions of select devices such as cell select transistor 15100A illustrated in FIG. 15. Stud 15500, embedded in dielectric 15625, provides a conductive path between source 15200 and stud 15550, which in turn forms a first bottom contact terminal to NV NT block 15600 of enclosed NV NT block switch 15150A. A top/all-sides contact terminal 15650 in contact with the top surface and all side surfaces of NV NT block 15600 forms a second contact and is also in contact with secondary word line 15675 as shown in cross section in FIG. 15. NV NT block switch 15150B is a mirror image of NV NT block switch 15150A.

Drain 15250 of cell select transistor 15100A contacts stud 15700, which in turn contacts conductor segment 15750 at contact 15800. Conductor segment 15750 also contacts a memory array bit line (not shown in FIG. 15) but corresponding to memory array bit line 14900 in FIG. 14A at a contact (not shown) corresponding to contact 14850 in FIG. 14A thereby connecting drain diffusion 15250 with a bit line (not shown) corresponding to bit line 14900 in FIG. 14A. Drain 15250 is shared with an adjacent cell (not visible in FIG. 15).

Memory cells such as memory cells 15050A and 15050B forming memory array 15000 with enclosed NV NT block switches 15150A and 15150B as NV NT storage nodes form cells that may be less dense than cells 14150A and 14150B because of top/all-sides contact terminal 15650 lateral thickness and the separation ($L_{OL}$ as referred to further above) between the edges of bottom contact terminal 15550 and top/all-sides contact terminal 15650, but may be denser than cells 13150A and 13150B for example. In some embodiments, memory cell area (footprint) is estimated to be approximately in the range of 15-20$F^2$ in area, where F is a minimum technology node dimension. It is further assumed that self-aligned vertical studs are used when forming the cell structure. Such stacked contacts and filled via holes (vertical studs) are illustrated further in the incorporated references. If vertical studs are not self-aligned, in some embodiments the cell area is estimated to grow by more than 2× in size (footprint), to greater than 30-40$F^2$ as illustrated in FIG. 20B, described in greater detail below.

Memory Arrays Using NV NT Switches or NV NT Block Switches as Nonvolatile Nanotube Storage Nodes with NV Storage Node Integrated to Enhance Cell/Array Density (Reduce Cell/Array Footprint)

In some embodiments, memory arrays are formed by interconnecting nonvolatile memory cells that include a select transistor such as an NFET, a nonvolatile nanotube storage node such as a NV NT switch or a NV NT block switch, and interconnect means within the cell and interconnect means between the cell and array lines such as word lines, bit lines, and secondary word lines as shown in memory array schematic 9000 illustrated in FIG. 9A. FIG. 8D summarizes various types of nonvolatile nanotube storage nodes 1-13, includes a brief description of each type of NV NT storage node, integration level within an integrated structure, and corresponding Figure numbers.

In order to enhance cell/array density (reduce cell/array footprint), nonvolatile nanotube storage nodes such as NV NT switches or NV NT block switches may be embedded in memory cells above the source of the select NFET transistor and below array bit lines in the integrated structure, such that array bit lines may be positioned above select NFET transistors in order to enhance cell density as illustrated further below with respect to FIGS. 16A-20A and summarized in FIG. 20B further below.

Figure 16A:
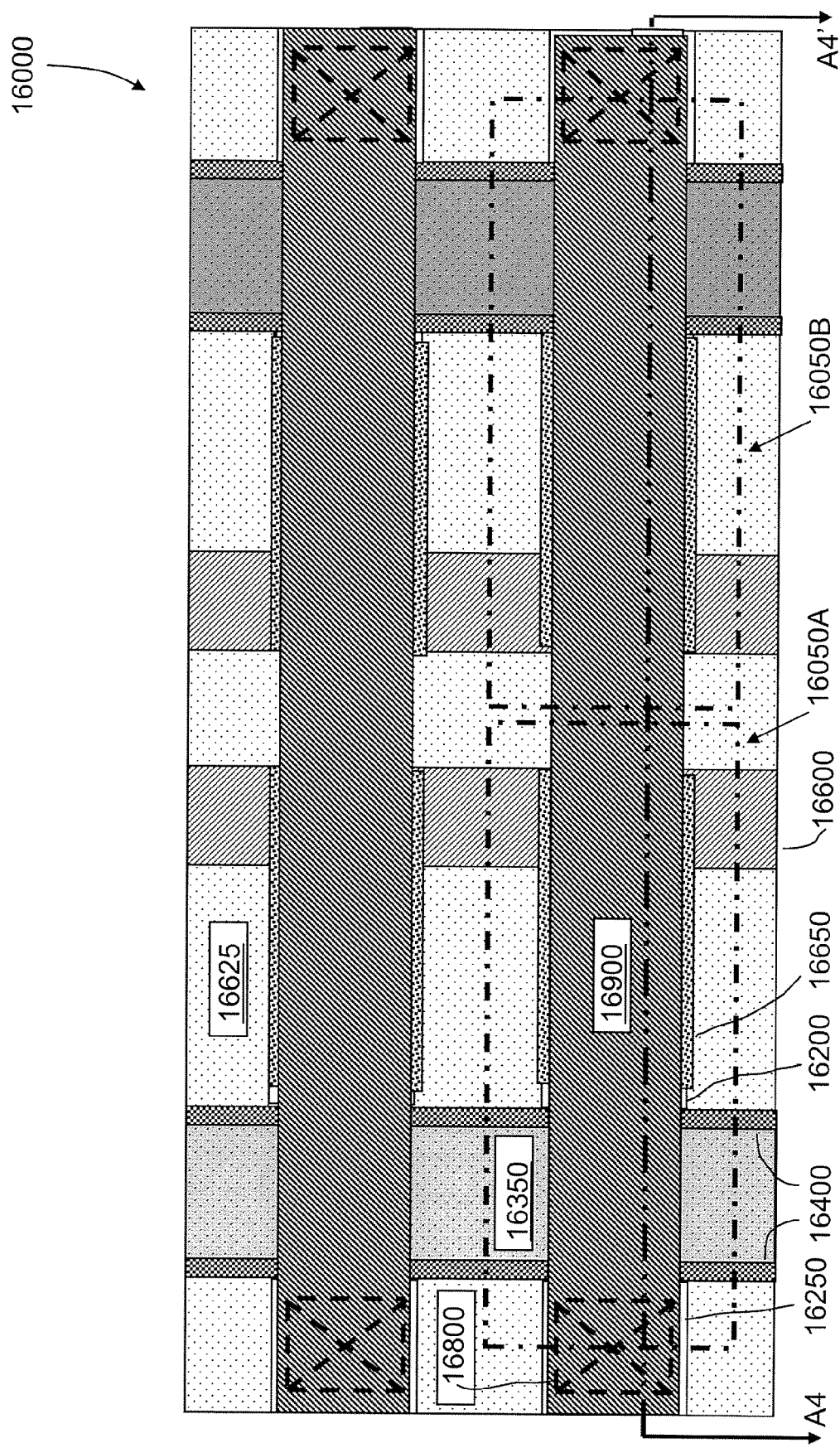
FIG. 16A illustrates a top view of an embodiment of four memory array cells with nonvolatile nanotube switches used as nonvolatile nanotube storage nodes and integrated in the cell region in proximity to a corresponding select transistor and below the bit line.
Figure 16B:
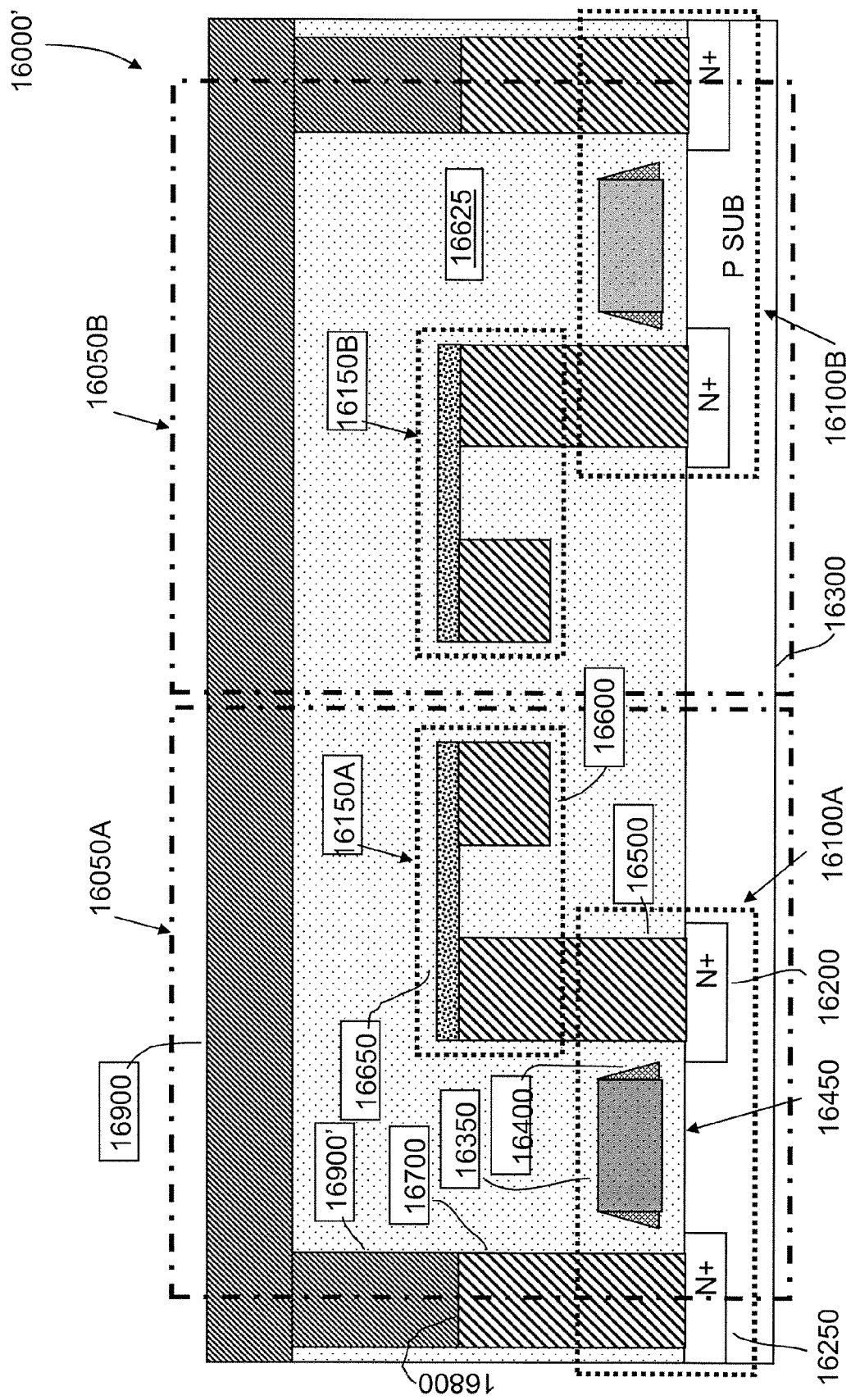
FIG. 16B illustrates a cross section of the memory array cell embodiment illustrated in FIG. 16A.

Memory Arrays Using NV NT Switches Placed Below Array Bit Lines, Near the Select Transistors and in Contact with the Source FIG. 16A illustrates a plan view of memory array 16000 showing four memory cells that use NV NT switches as nonvolatile storage devices embedded in memory array 16000 structure for enhanced cell/array density. FIG. 16B illustrates corresponding memory array 16000' cross section taken along segment A4-A4'. Memory cells 16050A and 16050B are mirror images of one another. Representative memory cell 16050A will be used to describe the cell structure typical of cells in memory array 16000. While memory cell 16050A shows NV NT storage node 16150A as insulated NV NT switch 6000 illustrated in FIG. 6A further above and listed in FIG. 8D as NV NT storage node #3, any of the insulated NV NT storage nodes numbered 3-8 and listed in FIG. 8D may be used instead as NV NT storage node 16150A. Other embodiments can also be used.

Cell select transistor 16100A includes source 16200 and drain 16250 formed in silicon substrate 16300. Gate 16350, fabricated with sidewall spacers 16400, is part of array word line 16350 that forms gate regions and array interconnections and controls channel region 16450 ON and OFF states using well known FET device operating methods. Alternatively, a separate word line conductor (not shown) may be used to interconnect gate regions of select devices such as cell select transistor 16100A illustrated in FIGS. 16A and 16B. Stud 16500, embedded in dielectric 16625, provides a conductive path between source 16200 and a first contact terminal of NV NT switch 16150A also embedded in dielectric 16625, in which stud 16500 may be used as the first contact terminal of NV NT switch 16150A. A second contact terminal 16600 of NV NT switch 16150A is part of secondary word line 16600. NV NT element 16650 contacts the top coplanar surface of contact terminals 16500. NV NT switch 16150B is a mirror image of NV NT switch 16150A.

Drain 16250 of cell select transistor 16100A contacts stud 16700, which in turn contacts stud 16900' at contact 16800. Stud 16900' is in contact with bit line 16900 thereby interconnecting bit line 16900 and drain 16250. Stud 16900' and bit line 16900 may be formed at the same time using preferred methods of fabrication, such as the conductor deposition and chem.-mech polishing (CMP) methods described in U.S. Pat. No. 4,944,836. Drain 16250 is shared with an adjacent cell (not visible in FIG. 16A or 16B).

As described further above, NV NT storage nodes 16150A and 16150B may be one of several insulated NV NT switches. NV switches 6000 illustrated in FIG. 6A, 6020 illustrated in FIG. 6B, 6040 illustrated in FIG. 6C, 6060 illustrated in FIG. 6D, 7000 illustrated in FIG. 7A, and 7050 illustrated in FIG. 7B may be used for example. These NV NT switches may be insulated with a single insulator layer, combinations of insulator layers, or combinations of insulator layers and gap regions as illustrated in the respective Figures described further above.

The plan view of memory array 16000 illustrated in FIG. 16A and the corresponding cross section 16000' illustrated in FIG. 16B show the integrated structure fabricated through the bit line 16900 definition level. Additional insulating (and conductor) layers may be formed above bit line 16900 (not shown) including final chip passivation and chip terminal metal layers (not shown).

In some embodiments, memory cells such as memory cells 16050A and 16050B forming memory array 16000 are estimated to be approximately 12-15$F^2$ in area as illustrated further below in FIG. 20B, where F is a minimum technology dimension.

Figure 17A:
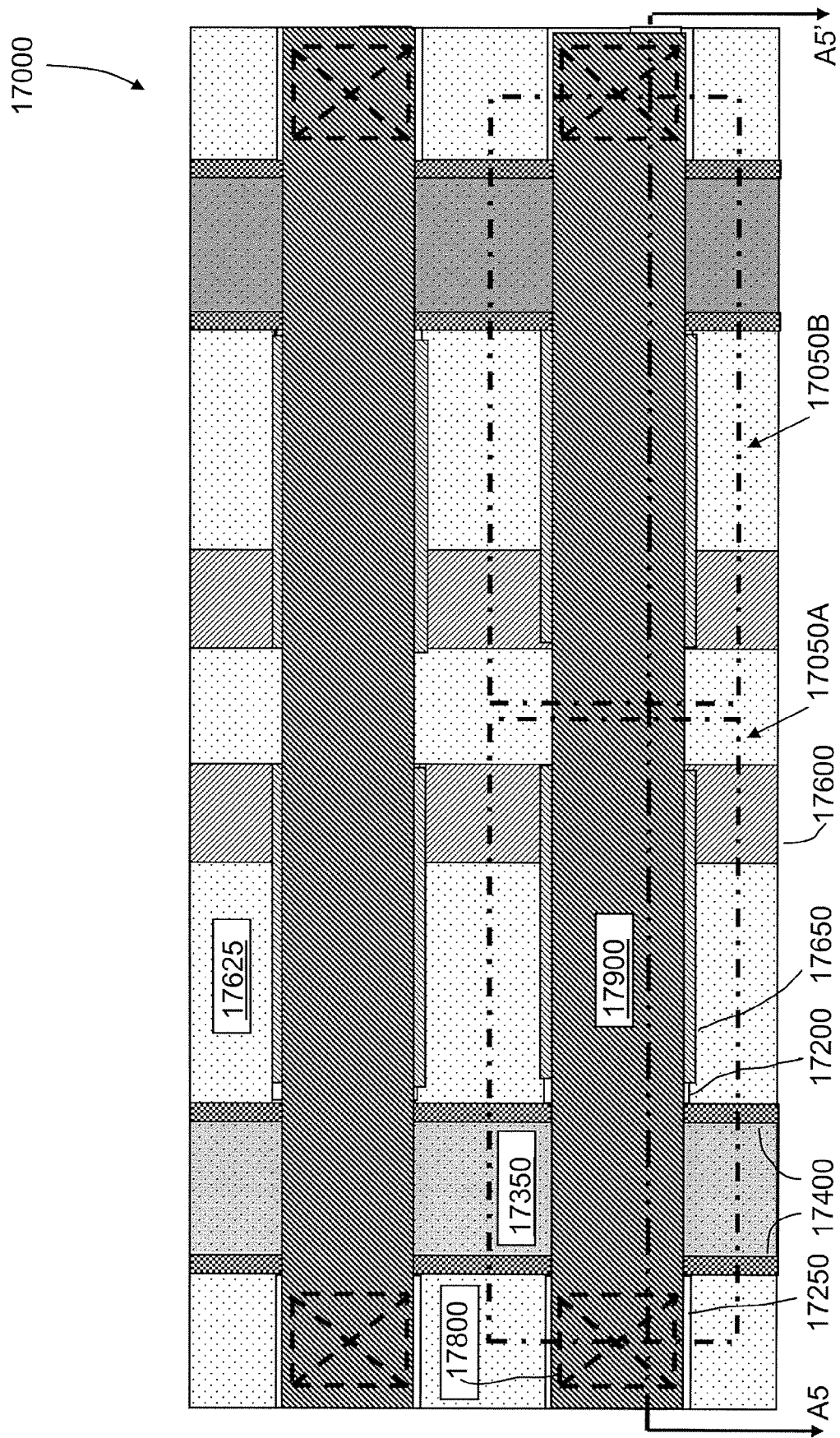
FIG. 17A illustrates a top view of an embodiment of four memory array cells with top/side and bottom contact terminal-type nonvolatile nanotube block switches used as nonvolatile nanotube storage nodes and integrated in the cell region in proximity to a corresponding select transistor and below the bit line.
Figure 17B:
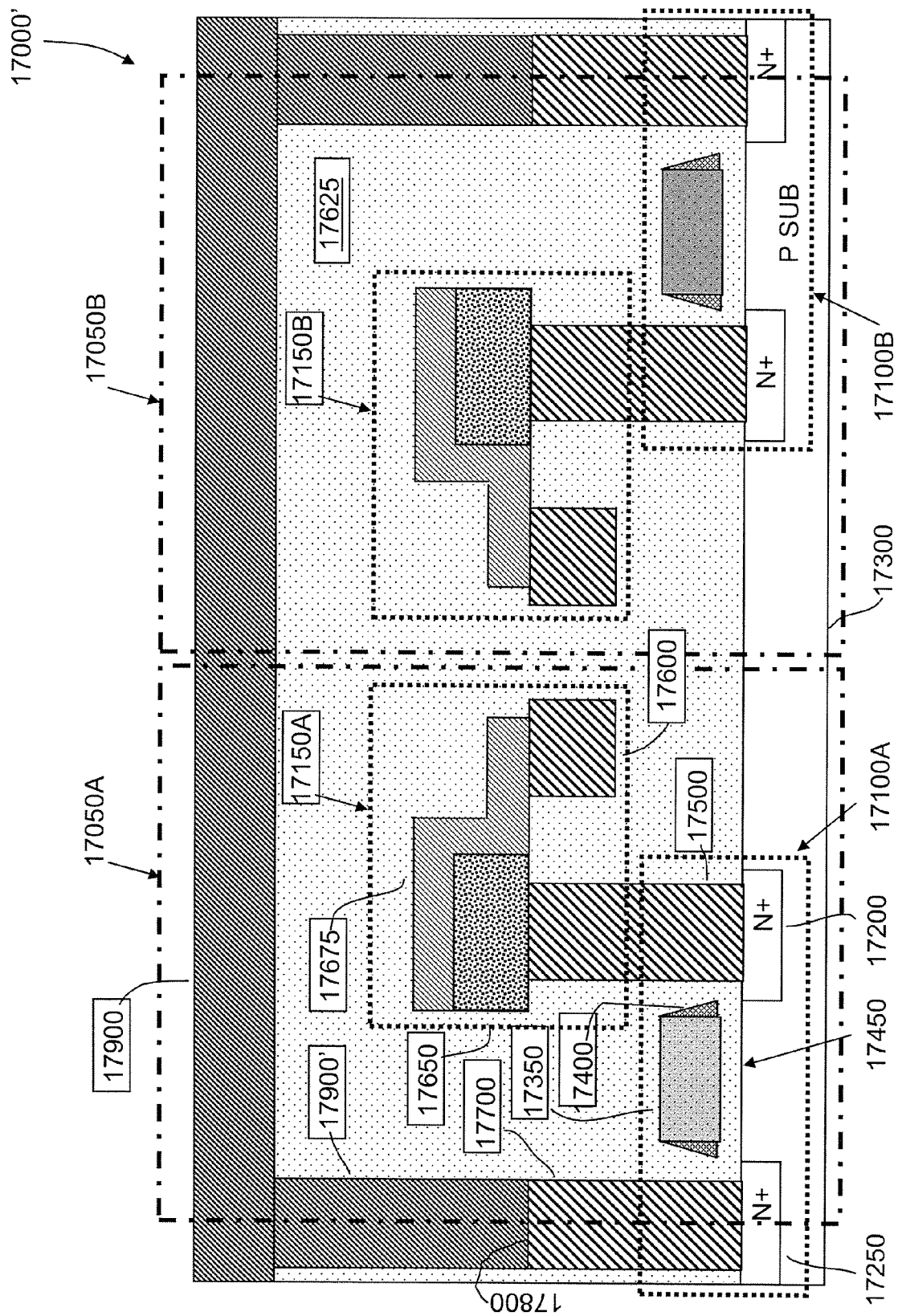
FIG. 17B illustrates a cross section of the memory array cell embodiment illustrated in FIG. 17A.

Memory Arrays Using NV NT Block Switches with Top/Side and Bottom Contacts Placed Below Array Bit Lines, Near the Select Transistors and in Contact with the Source FIG. 17A illustrates a plan view of memory array 17000 showing four memory cells that use NV NT block switches with top/side and bottom contact terminals as nonvolatile storage devices embedded in memory array 17000 structure for enhanced cell/array density. FIG. 17B illustrates corresponding memory array 17000' cross section taken along segment A5-A5'. Memory cells 17050A and 17050B are mirror images of one another. Representative memory cell 17050A will be used to describe the cell structure typical of cells in memory array 17000. While memory cell 17050A shows NV NT storage node 17150A as insulated NV NT block switch 8000 with top/side and bottom contact terminals illustrated in FIG. 8A further above and listed in FIG. 5D as NV NT storage node #11, insulated NV NT storage node 12 listed in FIG. 8D, or other insulator configurations (not shown), may be used instead as NV NT storage node 17150A.

Cell select transistor 17100A includes source 17200 and drain 17250 formed in silicon substrate 17300. Gate 17350, fabricated with sidewall spacers 17400, is part of array word line 17350 that forms gate regions and array interconnections and controls channel region 17450 ON and OFF states using well known FET device operating methods. Alternatively, a separate word line conductor (not shown) may be used to interconnect gate regions of select devices such as cell select transistor 17100A illustrated in FIGS. 17A and 17B. Stud 17500, embedded in dielectric 17625, provides a conductive path between source 17200 and a first contact terminal of NV NT block switch 17150A also embedded in dielectric 17625, in which stud 17500 may be used as the first contact terminal to NV NT block 17650 of NV NT block switch 17150A. A second contact terminal 17675 of NV NT switch 17150A is formed by conductor segment 17675 and forms top/side contacts to NV NT block 17650 and contacts secondary word line 17600. NV NT switch 17150B is a mirror image of NV NT switch 17150A.

Drain 17250 of cell select transistor 17100A contacts stud 17700, which in turn contacts stud 17900' at contact 17800. Stud 17900' is in contact with bit line 17900 thereby interconnecting bit line 17900 and drain 17250. Stud 17900' and bit line 17900 may be formed at the same time as described further above with respect to FIG. 16A-16B and in the incorporated patent references. Drain 17250 is shared with an adjacent cell (not visible in FIG. 17A or 17B).

As described further above, NV NT storage nodes 17150A and 17150B may be one of several insulated NV NT block switches such as NV NT block switch 8000 illustrated in FIG. 8A and NV NT block switch 8020 illustrated in FIG. 8B for example. These NV NT block switches may be insulated with a single insulator layer, combinations of insulator layers, and combinations of insulator layers and gap regions as illustrated in the respective Figures described further above.

The plan view of memory array 17000 illustrated in FIG. 17A and the corresponding cross section 17000' illustrated in FIG. 17B show the integrated structure fabricated through the bit line 17900 definition level. Additional insulating (and conductor) layers may be formed above bit line 17900 (not shown) including final chip passivation and chip terminal metal layers (not shown).

In some embodiments, memory cells such as memory cells 17050A and 17050B forming NRAM memory array 17000 are estimated to be approximately 12-15F$^2$ in area as illustrated further below in FIG. 20B, where F is a minimum technology node dimension.

Figure 18A:
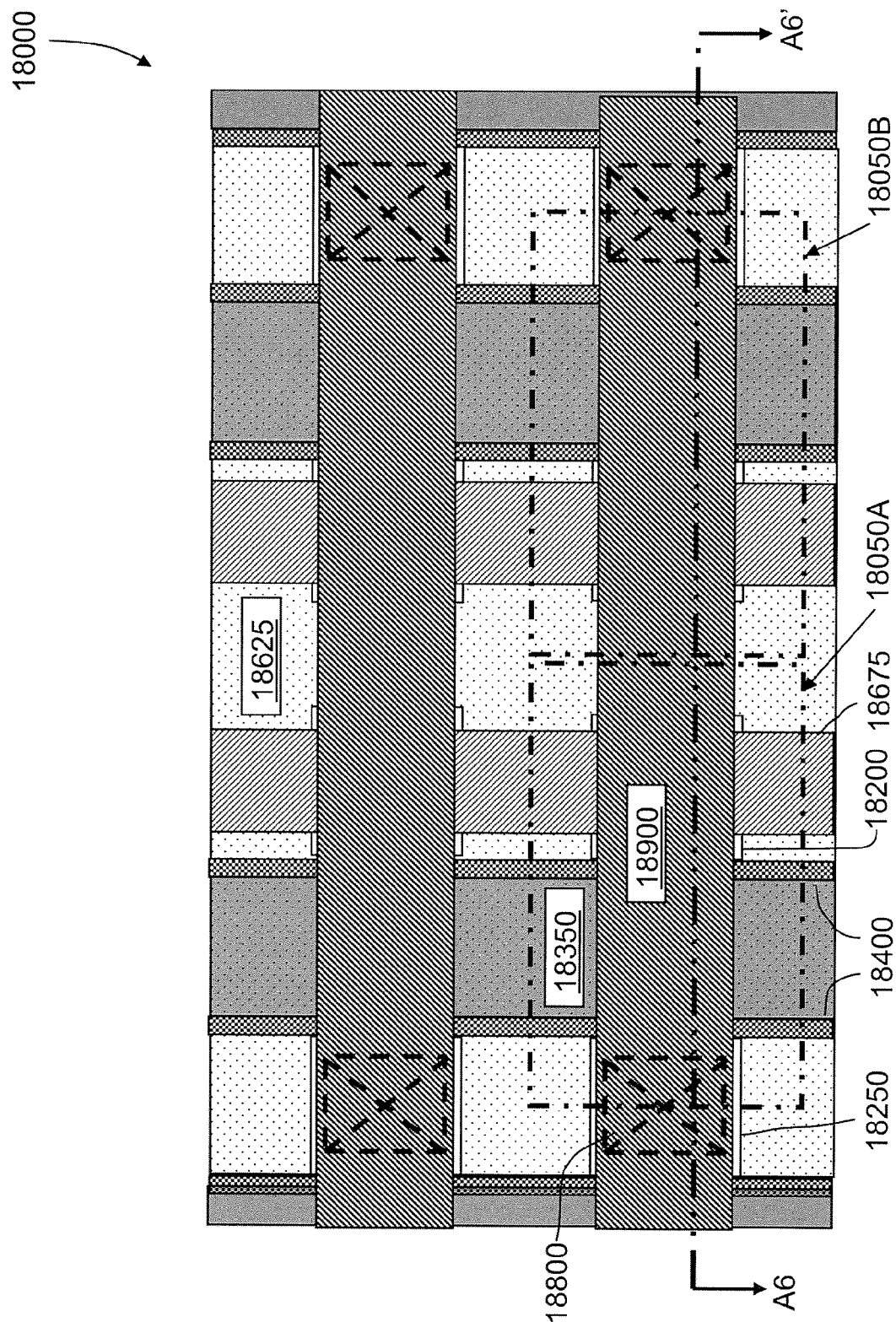
FIG. 18A illustrates a top view of an embodiment of four memory array cells with top and bottom contact terminal-type nonvolatile nanotube block switches used as nonvolatile nanotube storage nodes and integrated in the cell region in proximity to a corresponding select transistor and below the bit line.
Figure 18B:
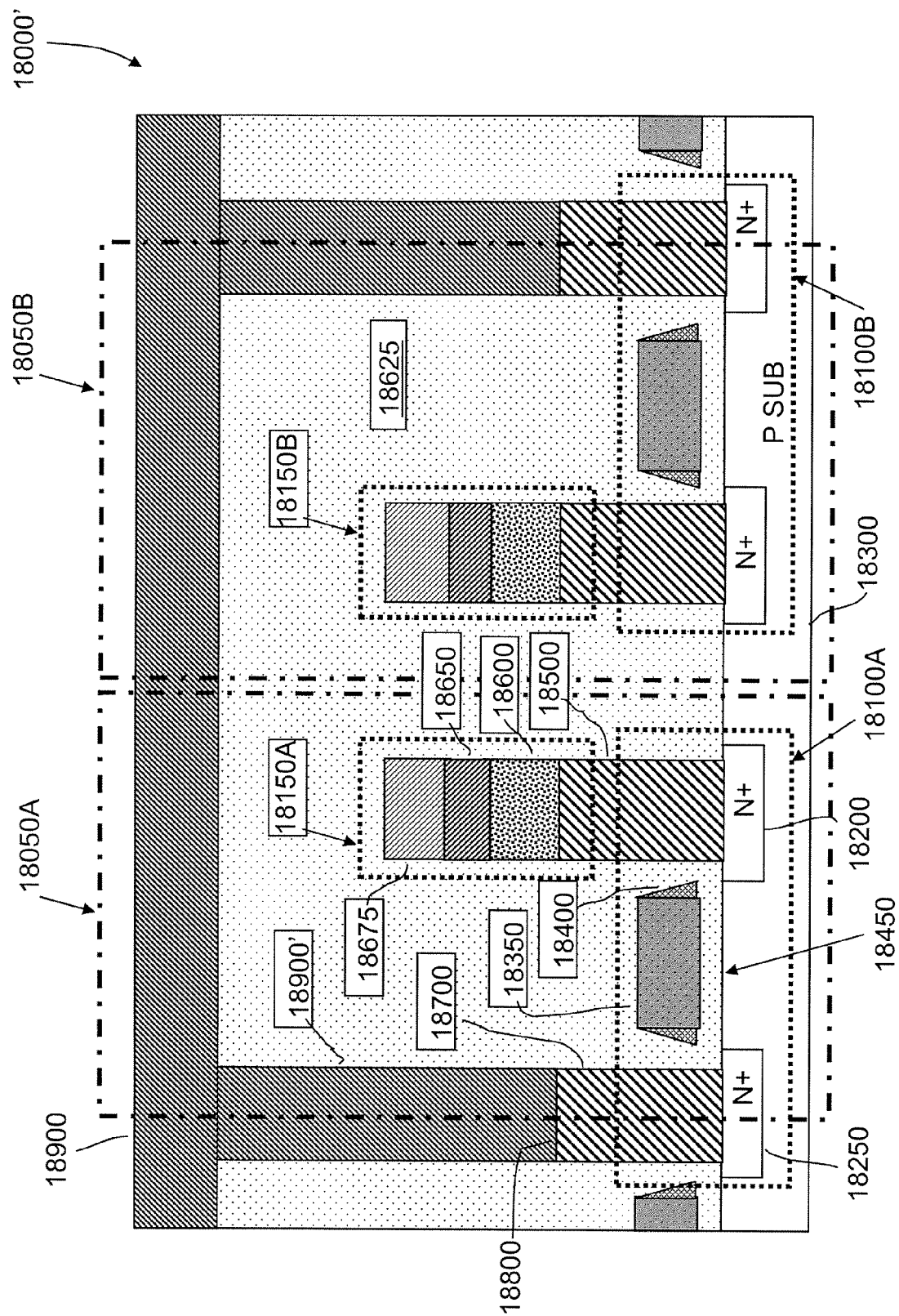
FIG. 18B illustrates a cross section of the memory array cell embodiment illustrated in FIG. 18A.

Memory Arrays Using NV NT Block Switches with Top and Bottom Contacts Placed Below Array Bit Lines, Near the Select Transistor, and in Contact with the Source FIG. 18A illustrates a plan view of memory array 18000 showing four memory cells that use NV NT block switches with top and bottom contact terminals as nonvolatile storage devices embedded in memory array 18000 structure for enhanced cell/array density. FIG. 18B illustrates corresponding memory array 18000' cross section taken along segment A6-A6'. Memory cells 18050A and 18050B are mirror images of one another. Representative memory cell 18050A will be used to describe the cell structure typical of cells in memory array 18000. Memory cell 18050A shows NV NT storage node 18150A as insulated NV NT block switch 5000 with top and bottom contact terminals illustrated in FIG. 5A further above and listed in FIG. 8D as NV NT storage node #10.

Cell select transistor 18100A includes source 18200 and drain 18250 formed in silicon substrate 18300. Gate 18350, fabricated with sidewall spacers 18400, is part of array word line 18350 that forms gate regions and array interconnections and controls channel region 18450 ON and OFF states using well known FET device operating methods. Alternatively, a separate word line conductor (not shown) may be used to interconnect gate regions of select devices such as cell select transistor 18100A illustrated in FIGS. 18A and 18B. Stud 18500, embedded in dielectric 18625, provides a conductive path between source 18200 and a first contact terminal of NV NT block switch 18150A also embedded in dielectric 18625, in which stud 18500 may be used as a bottom contact terminal to NV NT block 18600 of NV NT block switch 18150A. A top contact terminal 18650 in contact with the top surface of NV NT block 18600 forms a second contact and is also in contact with secondary word line 18675. NV NT block switch 18150B is a mirror image of NV NT switch block 18150A.

Drain 18250 of cell select transistor 18100A contacts stud 18700, which in turn contacts stud 18900' at contact 18800. Stud 18900' is in contact with bit line 18900 thereby interconnecting bit line 18900 and drain 18250. Stud 18900' and bit line 18900 may be formed at the same time as described further above with respect to FIGS. 16A-16B and 17A-17B and in the incorporated patent references. Drain 18250 is shared with an adjacent cell (not visible in FIG. 18A or 18B).

As described further above, NV NT storage nodes 18150A and 18150B use NV NT block switches 5000 illustrated further above in FIG. 5A to enhance cell/array density (reduce cell/array footprint). While NV NT storage nodes 18150A and 18150B illustrate NV NT block switches 5000 insulated with a single insulator layer, combinations of insulator layers, and combinations of insulator layers and gap regions as illustrated in the respective Figures described further above may also be used.

The plan view of memory array 18000 illustrated in FIG. 18A and the corresponding cross section 18000' illustrated in FIG. 18B show the integrated structure fabricated through the bit line 18900 definition level. Additional insulating (and conductor) layers may be formed above bit line 18900 (not shown) including final chip passivation and chip terminal metal layers (not shown).

In some embodiments, memory cells such as memory cells 18050A and 18050B forming NRAM memory array 18000 are estimated to be approximately 6-8F$^2$ in area as illustrated further below in FIG. 20B, where F is a minimum technology node dimension.

Figure 19:
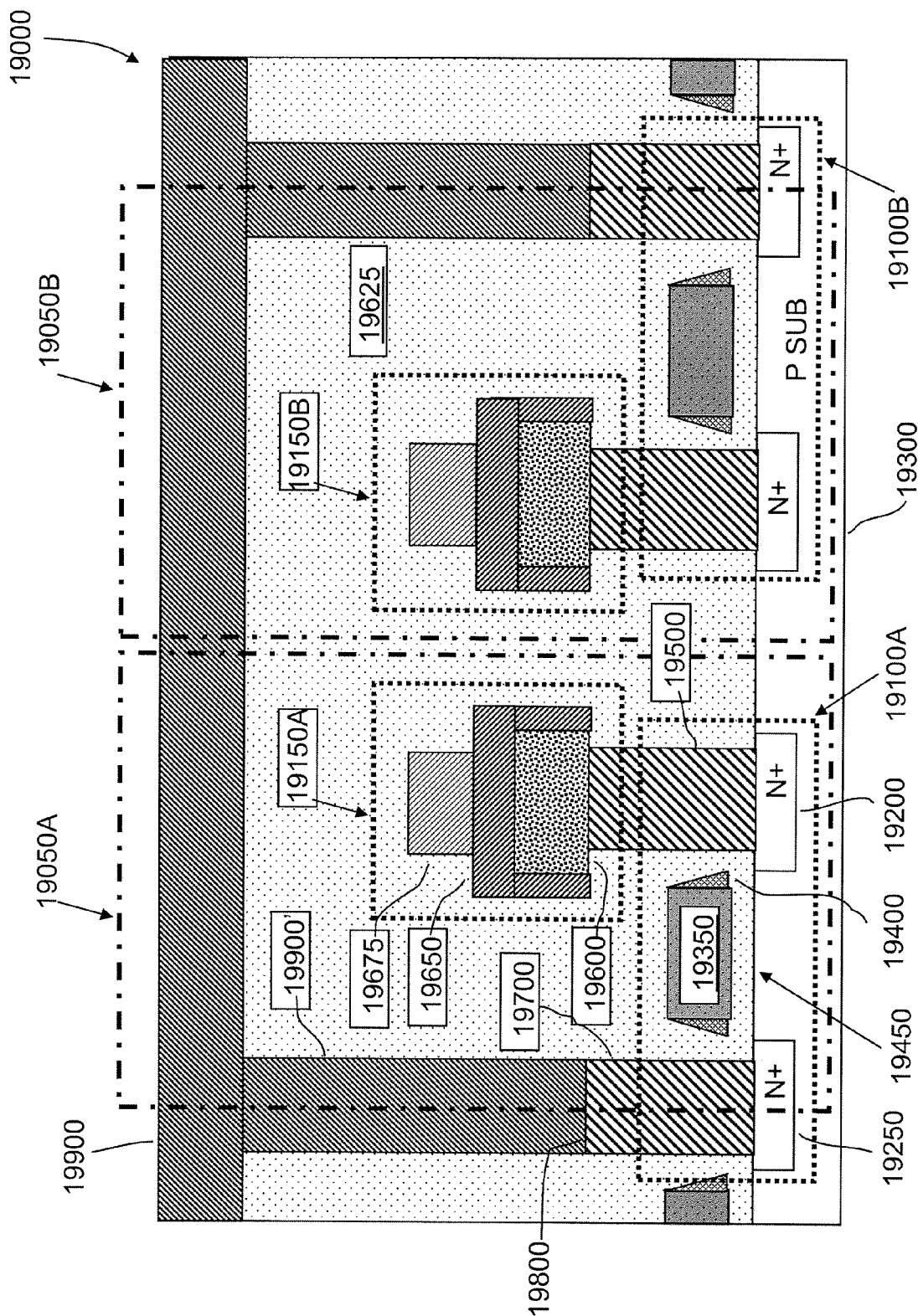
FIG. 19 illustrates a cross section of an embodiment of memory array cells with top and bottom contact terminal-type enclosed nonvolatile nanotube block switches used as nonvolatile nanotube storage nodes and integrated in the cell region in proximity to a corresponding select transistor and below the bit line.

Memory Arrays Using Enclosed (Enrobed) NV NT Block Switches with Top/All-Sides and Bottom Contacts Placed Below Array Bit Lines, Near the Select Transistor, and in Contact with the Source FIG. 19 illustrates a cross section of memory array 19000 showing two cells that use enclosed (enrobed) NV NT block switches as nonvolatile storage devices placed below the bit lines and near the select transistors of memory array 19000 structure. Memory cells 19050A and 19050B are mirror images of one another. Memory cell 19050A will be used to describe the cell structure typical of cells in memory array 19000. Memory cell 19050A replaces insulated NV NT block switch 5000 used in cell 18050A and listed in FIG. 8D as NV NT storage node #10 with insulated enclosed NV NT block switch 8050 illustrated in FIG. 8C further above and listed in FIG. 8D as NV NT storage node #13.

As mentioned above, insulators in contact with NV NT block surfaces may leave the electrical characteristics unchanged, may enhance electrical characteristics, or may even limit the electrical operation of NV NT block switches. In order to facilitate NV NT block switch integration in memory arrays, sensitivity to choice of insulator material may be reduced or eliminated by using an enclosed NV NT block switch that includes a top/all-sides contact terminal that prevents top and all-side surface contacts of the corresponding NV NT block with insulators. Memory cell 19050A is similar to cell 18050A illustrated in FIGS. 18A and 18B in plan view (layout) and cross section, respectively. Therefore, only a cross section of memory array 19000 is shown in FIG. 19. Enclosed NV NT block switch 19150A is a modification of NV NT block switch 18150A in which a conductor in contact with the top surface of NV NT block 19600 also encloses (enrobes) NV NT block 19600 to create top/all-sides contacts as described further above with respect to enclosed NV NT block switch 8050 shown in FIG. 8C. The enveloping (enrobing) conductor may be relatively thin, 5 to 50 nm for example, and is used to form enclosed NV NT block side surface contacts and substantially prevent side surface contacts with insulator material.

Cell select transistor 19100A includes source 19200 and drain 19250 formed in silicon substrate 19300. Gate 19350, fabricated with sidewall spacers 19400, is part of array word line 19350 that forms gate regions and array interconnections and controls channel region 19450 ON and OFF states using well known FET device operating methods. Alternatively, a separate word line conductor (not shown) may be used to interconnect gate regions of select devices such as cell select transistor 19100A illustrated in FIG. 19. Stud 19500, embedded in dielectric 19625, provides a conductive path between source 19200 and a first contact terminal of NV NT block switch 19150A also embedded in dielectric 19625, in which stud 19500 may be used as a bottom contact to NV NT block 19600 of NV NT block switch 19150A. A top/all-sides contact terminal 19650 in contact with the top surface and all-side surfaces of NV NT block 19600 forms a second contact and is also in contact with secondary word line 19675. NV NT block switch 19150B is a mirror image of NV NT block switch 19150A.

Drain 19250 of cell select transistor 19100A contacts stud 19700, which in turn contacts stud 19900' at contact 19800. Stud 19900' is in contact with bit line 19900 thereby interconnecting bit line 19900 and drain 19250. Stud 19900' and bit line 19900 may be formed at the same time as described further above with respect to FIGS. 16A-16B, 17A-17B, and 18A-18B and in the incorporated patent references. Drain 19250 is shared with an adjacent cell (not visible in FIG. 19).

Memory cells such as memory cells 19050A and 19050B forming memory array 19000 with enclosed NV NT block switches 19150A and 19150B as NV NT storage nodes form cells that may in some embodiments be less dense than cells 18150A and 18150B because of top/all-sides contact terminal 19650 lateral thickness and the separation ($L_{OL}$ as referred to further above) between the edges of bottom contact terminal 19500 and top/all-sides contact terminal 19650, but may be denser than cells 16150A and 16150B for example. In some embodiments, memory cell area (footprint) is estimated to be approximately in the range of 12-15$F^2$ in area as illustrated further below in FIG. 20B, where F is a minimum technology node dimension.

Memory Arrays Using NV NT Block Switches with Top and Bottom Contacts Placed Below Array Bit Lines, Near the Select Transistors with Bit Line Contact to the Top Contact and Drain Contact to the Bottom Contact of the Switch FIG. 20A illustrates a cross section of memory array 20000 that uses an alternative placement of NV NT block switch 5000 illustrated in FIG. 5A between a bit line contact and a corresponding drain diffusion. A corresponding secondary word line is connected to a corresponding source of the select NFET device. In some embodiments, the memory array density (footprint) of memory array 20000 is approximately equal to the memory array density (footprint) of memory array 18000 described further above with respect to FIGS. 18A-18B.

FIG. 20A illustrates a cross section of memory array 20000 showing memory cells that use NV NT block switches with top and bottom contact terminals as nonvolatile storage devices embedded in memory array 20000 structure for enhanced cell/array density. Memory cells 20050A and 20050B are mirror images of one another. Representative memory cell 20050A will be used to describe the cell structure typical of all cells in memory array 20000. Memory cell 20050A shows NV NT storage node 20150A as insulated NV NT block switch 5000 with top and bottom contact terminals illustrated in FIG. 5A further above and listed in FIG. 8D as NV NT storage node #10.

Cell select transistor 20100A includes source 20200 and drain 20250 formed in silicon substrate 20300. Gate 20350, fabricated with sidewall spacers 20400, is part of array word line 20350 that forms gate regions and array interconnections and controls channel region 20450 ON and OFF states using well known FET device operating methods. Alternatively, a separate word line conductor (not shown) may be used to interconnect gate regions of select devices such as cell select transistor 20100A illustrated in FIG. 20A. Stud 20500, embedded in dielectric 20625, provides a conductive path between drain 20250 and a first contact terminal of NV NT block switch 20150A also embedded in dielectric 20625, in which stud 20500 may be used as a bottom contact terminal to NV NT block 20600 of NV NT block switch 20150A. A top contact terminal 20650 in contact with the top surface of NV NT block 20600 forms a second contact and is also in contact with stud 20900'. Stud 20900' is in contact with bit line 20900 thereby interconnecting bit line 20900 and top contact terminal 20650 of NV NT block switch 20150A. Stud 20900' and bit line 20900 may be formed at the same time as described further above with respect to FIGS. 16A-16B, 17A-17B, 18A-18B, and 19 and in the incorporated patent references. NV NT switch 20150B is a mirror image of NV NT switch 20150A.

Source 20200 of cell select transistor 20100A contacts stud 20700, which in turn contacts secondary word line 20675 at contact 20800. Source 20200 is shared with an adjacent cell (not visible in FIG. 20A).

As described further above, NV NT storage nodes 20150A and 20150B use NV NT block switches 5000 illustrated further above in FIG. 5A to enhance cell/array density (reduce cell/array footprint). While NV NT storage nodes 20150A and 20150B illustrate NV NT block switches 5000 insulated with a single insulator layer, combinations of insulator layers, and combinations of insulator layers and gap regions as illustrated in the respective Figures described further above may also be used.

The cross sectional view of memory array 20000 illustrated in FIG. 20A shows the integrated structure fabricated through the bit line 20900 definition level. Additional insulating (and conductor) layers may be formed above bit line 20900 (not shown) including final chip passivation and chip terminal metal layers (not shown).

In some embodiments, memory cells such as memory cells 20050A and 20050B forming memory array 20000 are estimated to be approximately 6-8$F^2$ in area, where F is a minimum technology node dimension.

Note that while NV NT block switch 5000 illustrated in FIG. 5A is used as NV NT block switch 20150A and 20150B, enclosed NV NT block switch 8050 illustrated in FIG. 8C may be used instead if reduced contact with insulator 20625 is desired. In such a case, the array area (footprint) may increase in size for the same reasons as described further above with respect to memory array 19000 illustrated in FIG. 19.

Summary of the Relative Memory Array Density (Footprint) of Various Embodiments of NV NT Switches, NV NT Block Switches, and Enclosed NV NT Block Switches Used as Nonvolatile Nanotube Storage Nodes FIG. 20B summarizes cell sizes for some of the exemplary embodiments of memory arrays described further above based on the type and placement of NV NT storage nodes. FIG. 20B also includes corresponding FIG. 8D NV NT storage node numbers for ease of reference with the types of NV NT switches, NV NT block switches, or enclosed NV NT block switches used as NV storage nodes in the various memory arrays.

NV NT storage nodes located at or near the top surface of arrays above word lines (WLs) and bit lines (BLs) that are already connected with NFET select transistors results in less dense implementations. However, NV NT storage nodes located at or near the surface of pre-wired memory arrays offer ease of integration (integration flexibility) including un-insulated chips for mounting in hermetic packages as well as NV NT storage nodes insulated using a wide variety of insulator combinations and gap regions. Such placement results in a short development time for NV NT switches and NV NT block switches integrated with CMOS circuits and NFET select transistors. Cell area (footprint) may be substantially larger than for fully integrated structures as shown in FIG. 20B, however working memory arrays such as 16 bit memory array 9000 described further above with respect to FIGS. 9A-9B, 10A-10B, and 11A-11C may result in faster memory array fabrication and accelerated learning. Note that cell density (footprint) also depends on whether self aligned or non-self aligned studs are used when connecting NV NT storage nodes to select transistor source diffusions.

Fully integrated NV NT storage nodes placed below bit lines result in enhanced cell density (relatively small footprint). FIG. 20B shows various relative cell areas in terms of minimum dimension F. Some embodiments of relatively dense memory cells have an estimated cell area in the range of 6-8 $F^2$, which can be achieved by fully integrating a NV NT block switch with top and bottom contacts as shown in FIG. 20B. For an F=45 nm technology node, cell area is estimated to be in the range of 0.012-0.016 $um^2$; for an F=22 nm technology node, cell area is estimated to be in the range of 0.003-004 $um^2$; and for an F=10 nm technology node, cell area is estimated to be in the range of 0.0006 to 0.0008 $um^2$. NV NT block switches are scalable and dimensions in 22 to 45 nm range have been fabricated. There are no known fundamental barriers to scaling to an F=10 nm technology node, or even smaller.

Relatively Dense Cross Point Switches

Nonvolatile cross point switch matrices may be used to change interconnections in chips after fabrication is complete. NV NT block switches may be used to form relatively dense nonvolatile cross point switches for use in reconfigurable logic such as FPGAs for example. Dense nonvolatile cross point switches using NV NT block switches are described further below with respect to FIGS. 20A-23C.

Figure 21:
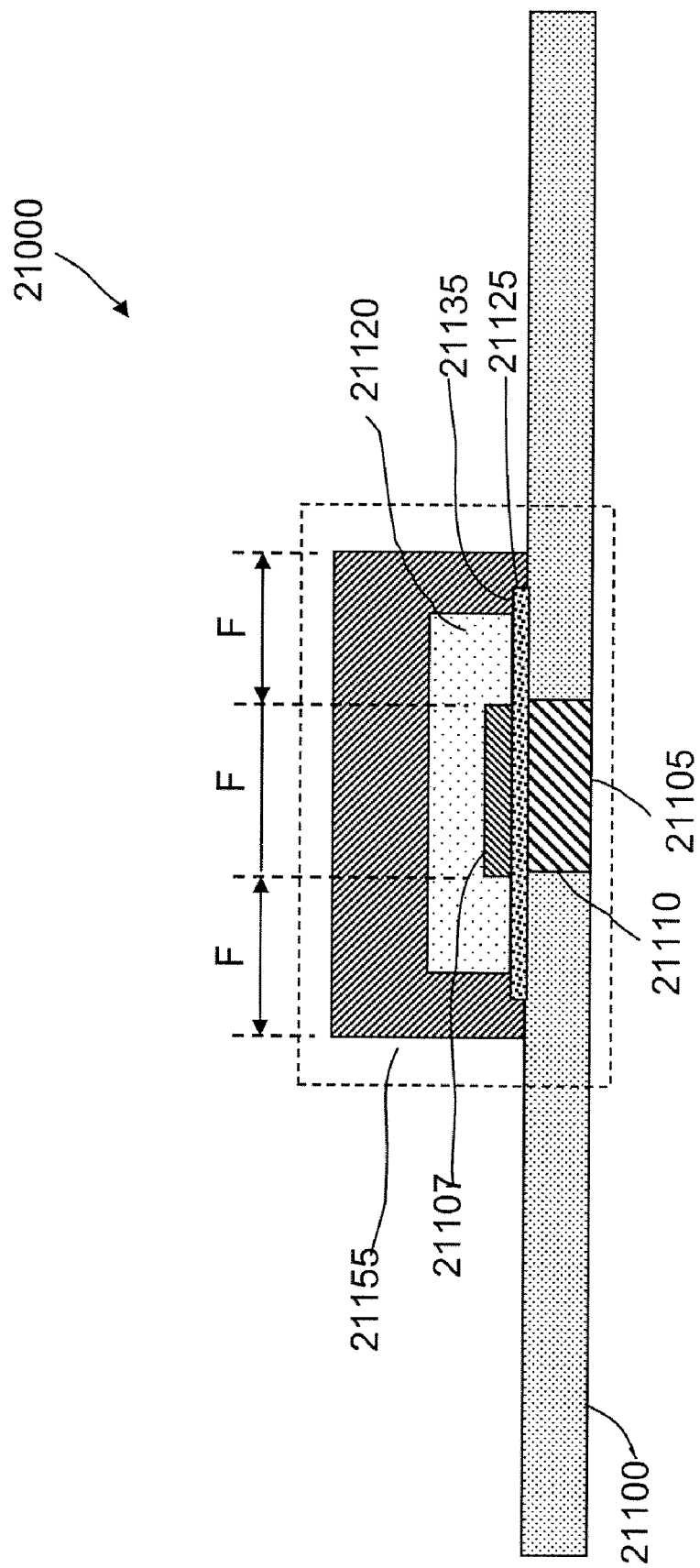
FIG. 21 illustrates a cross section of an embodiment of a cross point switch formed using a nonvolatile nanotube switch in an essentially horizontal orientation with a first center-region contact terminal and a second "picture frame" contact terminal surrounding the first contact.

First-Type of Dense Cross Point Switch Structures with NV NT Block Switches Self Aligned to Array Wiring Nonvolatile nanotube two terminal cross point switches based on a "picture frame" layout and using horizontally-oriented thin nanotube elements are illustrated in FIG. 21 and correspond to two terminal cross point switches described in U.S. patent application Ser. No. 11/280,786. While the "picture frame" embodiment illustrated in FIG. 21 is relatively dense (i.e., many can be fabricated in a small area; have a small footprint), even denser scalable nonvolatile nanotube two terminal switches may be made. Replacing horizontally-oriented (2-D) thin nanotube elements with vertically-oriented (3-D) two terminal nonvolatile nanotube block (NV NT Block) switches, such as those described further above and in U.S. patent application Ser. Nos. 11/835,651, 11/835,759, 11/835,845, 11/835,852, 11/835,856 and 11/835,865, all filed Aug. 8, 2007, entitled "Nonvolatile Nanotube Diodes and Nonvolatile Nanotube Blocks and Systems Using Same and Methods of Making Same," filed concurrently herewith, may result in still denser switches that are useful in many applications such as electronically programmable wiring, nonvolatile memory, logic including array logic, FPGAs, and other applications for example.

FIG. 21 illustrates a picture frame two terminal nonvolatile nanotube switch 21000 cross section including a supporting insulator 21100 on an underlying substrate (not shown) and conductive element 21105 in via hole 21110. Nonvolatile nanotube switch 21000 may be switched between ON and OFF states multiple times. Nanotube element 21125 is in contact with conductive element 21050 that forms one of the two nanotube switch 21000 terminals. An optional conductive element 21107 may be used to enhance the contact between nanotube element 21125 and conductive element 21105. Conductive element 21155 contacts the periphery of nanotube element 21125 in region 21135 thereby forming a second two terminal nanotube switch 21000 terminal. Conductive element 21155 is separated from optional conductive element 21107 and portions of nanotube element 21125 by insulator 21120. In some embodiments, two terminal nanotube switch 21000 dimensions are approximately 3F in the horizontal X direction, and 3F in the approximately orthogonal Y direction (not shown), where F is the minimum lithographically defined dimension at a particular technology node. The minimum separation between adjacent switches is F such that two terminal nanotube switches 21000 may be placed on a periodicity (not shown) of 4F in the X and Y directions. In some embodiments, an individual two terminal nanotube switch 21000 occupies an area of $9F^2$, and $16F^2$ when placed in an array configuration separated from other switches by minimum distance F.

FIG. 22A illustrates a plan view of nonvolatile nanotube block switch matrix 22000 of four vertically-oriented (3-D) two terminal nonvolatile nanotube block switches (22100-1, 22100-2, 22100-3, and 22100-4) in a two-by-two cross point switch array configuration. Representative cross sections X1-X1' and Y1-Y1' through a portion of NV NT block switch 22100-1 as illustrated in FIG. 22A further illustrate elements of NV NT block switches in vertically-oriented (3-D) structures as shown in FIGS. 22B and 22C. Details of first-type two terminal NV NT block switches and methods of fabrication, corresponding to two-terminal nonvolatile nanotube switches 22100-1, 22100-2, 22100-3, and 22100-4 are described further above and in the incorporated patent references. NV NT blocks may be deposited using multiple spin-on layers or by spray on techniques as described in the incorporated patent references, e.g., U.S. patent application Ser. Nos. 11/835,651, 11/835,759, 11/835,845, 11/835,852, 11/835,856 and 11/835,865, entitled "Nonvolatile Nanotube Diodes and Nonvolatile Nanotube Blocks and Systems Using Same and Methods of Making Same," all filed Aug. 8, 2007.

Wire 22050-1 illustrated in FIG. 22A interconnects two terminal NV NT block switches 22100-1 and 22100-2, forming bottom (lower level) contacts with each of these two terminal NV NT block switches having dimensions F×F and separated by a distance F. Wire 22050-2 interconnects two terminal NV NT block switches 22100-3 and 22100-4, forming bottom (lower level) contacts, with each of these two terminal NV NT block switches having dimensions F×F and separated by a distance F.

While F represents minimum feature size to achieve maximum switch array density, dimensions larger than F may be used as needed and non-square cross sections may be used, such as rectangular and circular for example in order to achieve lower ON resistance values or other desired features. For example, a large switch may be fabricated to achieve ON resistance values in the 50 to 100 ohm range to match the characteristic impedance ($Z_O$) of a transmission line. Also, arrays larger than two-by-two, such as 100-by-100 or larger, may be formed for example.

Wire 22600-1 illustrated in FIG. 22A interconnects two terminal NV NT block switches 22100-1 and 22100-3 by contacting top (upper level) contacts, with each of the two terminal NV NT block switches having dimensions F×F and separated by a distance F. Wire 22600-2 interconnects two terminal NV NT block switches 22100-2 and 22100-4 by contacting top (upper level) contacts, with each of the two terminal NV NT block switches having dimensions F×F and separated by a distance F. Wires 22600-1 and 22600-2 are patterned on the surface of insulator 22500 that fills regions between NV NT block switches. While F represents minimum feature size to achieve maximum switch array density, dimensions larger than F may be used.

FIG. 22B illustrates cross section X1-X1' through and along wire 22600-1 in the X direction. The Z direction represents the vertical orientation of two terminal NV NT block switch 22100-1 and also indicates the direction of current flow (vertically) in the ON state. Two terminal NV NT block switch 22100-1 includes bottom (lower level) contact 22050-1' which is a section of wire 22050-1, top (upper level) contact NV NT block 22400-1 which is in contact with wire 22600-1, and NV NT block 22200-1 which is in contact with both bottom (lower level) contact 22050-1' and top (upper level) contact 22400-1. NV NT block 22200-1 may be switched between ON and OFF states multiple times as described further above and in the incorporated patent references, e.g., U.S. patent application Ser. No. 11/280,786 and U.S. patent application Ser. Nos. 11/835,651, 11/835,759, 11/835,845, 11/835,852, 11/835,856 and 11/835,865, entitled "Nonvolatile Nanotube Diodes and Nonvolatile Nanotube Blocks and Systems Using Same and Methods of Making Same," all filed Aug. 8, 2007.

FIG. 22C illustrates cross section Y1-Y1' through and along wire 22050-1 in the Y direction. The Z direction represents the vertical orientation of two terminal NV NT block switch 22100-1 and also indicates the direction (vertically) of current flow in the ON state. Two terminal NV NT block switch 22100-1 includes bottom (lower level) contact 22050-1' which is a section of wire 22050-1, top (upper level) contact NV NT block 22400-1 which is in contact with wire 22600-1, and NV NT block 22200-1 in contact with both bottom (lower level) contact 22050-1' and top (upper level) contact 22400-1. NV NT block 22200-1 may be switched between ON and OFF states multiple times as described further above and in the incorporated patent references. Methods of fabrication of NV NT block switches and array interconnections are described further in incorporated patent references, e.g., U.S. patent application Ser. Nos. 11/835,651, 11/835,759, 11/835, 845, 11/835,852, 11/835,856, and 11/835,865, all filed Aug. 8, 2007, entitled "Nonvolatile Nanotube Diodes and Nonvolatile Nanotube Blocks and Systems Using Same and Methods of Making Same."

Two terminal NV NT block switches 22100-1, 22100-2, 22100-3, and 22100-4 dimensions are approximately F in the horizontal direction, and F in the approximately orthogonal Y direction, where F is the minimum lithographically defined dimension at a particular technology node. The minimum separation with adjacent switches is F such that two terminal NV NT block switches 22100-1, 22100-2, 22100-3, and 22100-4 may be placed on a periodicity of 2F in the X and Y directions as illustrated in FIG. 22A. Individual two terminal NV NT block switches 22100-1, 22100-2, 22100-3, and 22100-4 occupy an area of $1F^2$, and $4F^2$ when placed in an array configuration separated from other switches by minimum distance F. Hence, individual two terminal NV NT block switches 22100-1, 22100-2, 22100-3, and 22100-4 are 9× denser then two terminal switch 21000 illustrated in FIG. 21. In an array configuration with individual switches separated by F in the X and Y direction, arrays of nonvolatile nanotube switches based on two terminal NV NT block switches 22100-1, 22100-2, 22100-3, and 22100-4 with a periodicity of 2F occupy an area of $4F^2$ and are 4× denser than arrays of nonvolatile nanotube switches based on two terminal switch 21000 that in some embodiments require an area of $16F^2$. F may be scaled over a large range of dimensions. F may be 250 nm and larger; less than 100 nm, for example 45 nm and 22 nm; or less than 10 nm. NV NT switches with NV NT block channel lengths $L_{SW-CH}$ in the vertical (Z) direction defined by bottom (lower level) contact to top (upper level) contact spacing of 35 nm have been fabricated as described in the incorporated patent references. $L_{SW-CH}$ may range from <10 nm to greater than 250 nm.

Dimension F is determined by the technology node, 45 nm for example. NV NT block switch dimensions may be F=45 nm, for example, if nanotube fabric density (the number of nanotubes per unit area) is sufficiently high to achieve desired NV NT block switch ON resistance values. However, if the NV NT block switch resistance value is too high when using minimum F×F switch dimensions, then dimensions larger than F may be used to increase the number of nanotubes in NV NT block switch and thereby achieve lower NV NT block switch ON resistance values. Assuming the CMOS driver is driving CMOS circuit capacitive inputs, then input levels to the next logic stage will swing rail-to-rail (between on-chip voltage supply and reference (ground) voltage) regardless of the combined series ON resistance values of the NV NT block switch and FET channel. However, network RC time constant delays due to the combination of series resistance and interconnect capacitance values may require limits on the ON resistance value of the NV NT block switch. For example, if the wiring path requires a short delay time, then the ON resistance of the NV NT block switch may be no more than $\frac{1}{10}^{th}$ of the NMOS and PMOS ON resistances of 1 k to 10 k Ohms in this example, thereby limiting the ON resistance of the NV NT block switch to a resistance range of 100 Ohms to 1 k Ohms. However, if a short delay time is not required, then in this example the ON resistance of the NV NT block switch may be equal to (or even greater) than the NMOS and PMOS ON resistance, in this case in the range of 1 k Ohms to 10 k Ohms. NV NT block switch OFF resistance is typically 1 GOhm and above, with some devices as low as 100 MOhms as described further above and in U.S. patent application Ser. No. 11/280,786 and U.S. patent application Ser. Nos. 11/835, 651, 11/835,759, 11/835,845, 11/835,852, 11/835,856 and 11/835,865, entitled "Nonvolatile Nanotube Diodes and Nonvolatile Nanotube Blocks and Systems Using Same and Methods of Making Same," all filed Aug. 8, 2007.

NV NT block switches 22100-1, 22100-2, 22100-3, and 22100-4 in nonvolatile switch matrix 22000 are in an as-fabricated ON state. In operation, these NV NT block switches are typically switched to an OFF state. Then the application determines which of the NV NT block switches in nonvolatile switch matrix 22000 are switched to the ON state to form interconnected wiring.

In operation, as-fabricated ON NV NT block switches may all be switched from ON to OFF simultaneously by activating all rows, or may be switched one row at a time, or may be switched one NV NT block switch at a time. In this example, switches are switched from ON to OFF one row at a time. NV NT block switches 22100-1 and 22100-3 are switched from ON to OFF by a write 0 (also referred to as erase) operation. First, vertical wires 22050-1 and 22050-2 are set to and held at a reference voltage such as zero volts (ground). Next, horizontal wire 22100-2 is set to zero and held at zero volts and horizontal wire 22100-1 is ramped from a reference voltage such as zero volts (ground) to a write 0 voltage in a range of 4 to 8 volts, for example. The ramp rate may in the 1 to 10 ns range, or much slower, in the 100's of ns or microsecond range, for example, with write 0 current flow per switch in the range of 1 uA to 100 uA as described further above and in the incorporated patent references. While a 2×2 array of NV NT block switches is described in this example, larger N×M switch matrices may be used, where N and M may include hundreds, thousands, and even more NV NT block switches.

In operation, any combination of nonvolatile electrically programmable and re-programmable connections between horizontal and vertical wires may be realized by electrically activating (turning from an OFF state to ON state) any combination of NV NT block switches using a write 1 (also referred to as programming) operation, where NV NT block switch 22100-1, 22100-2, 22100-3, and 22100-4 ON state determines electrical wiring connections (routing) between vertical wires 22050-1 and 22050-2 and horizontal wires 22600-1 and 2260-2. In this example, write 1 operations typically write voltages in the 4 to 8 volt range. The ramp rate may in the sub-10 ns range, or much slower, in the 100's of ns or microsecond range, for example, with write 1 current flow per switch in the range of 1 uA to 100 uA as described further in U.S. patent application Ser. No. 11/280,786 and U.S. Provisional Patent Application No. 60/855,109.

By way of example, NV NT block switch 22100-1 may be in an ON state connecting wires 22600-1 and 22050-1 and NV NT block switch 22100-4 may also be in an ON state connecting wires 22600-2 and 22050-2. NV NT block switches 22100-2 and 22100-3 may be in the OFF state for example. Multiple wires may be connected as well. FIG. 22D illustrated further below shows various interconnections that may be formed using nonvolatile nanotube block switch matrix 22000.

FIG. 22D illustrates nonvolatile electrically programmed wiring (routing) connections for one of four NV NT block switches in an ON state with the remaining three switches in an OFF state. Also shown are nonvolatile electrically programmed wiring (routing) connections for pairs (two of four) NV NT block switches in an ON state with the remaining two switches in an OFF state. Selected (ON) NV NT block switch pairs may be used to form a single contact per vertical and horizontal wire pair, or multiple connections between one vertical wire and two horizontal wires or one horizontal wire and two vertical wires as illustrated in FIG. 22D. Other NV electrically programmed wiring (routing) connections may be formed using combinations of three NV NT block switches in an ON state with one remaining switch in an OFF state (not shown), and also all four NV NT block switches may be in the ON state (not shown). While a 2×2 array of NV NT block switches is described in this example, larger N×M switch matrices may be used, where N and M may include hundreds, thousands, and even more NV NT block switches. Nonvolatile electrically programmed wiring (routing) connections may be re-programmed thousands or more times to change the wiring (routing) configuration.

In operation, after NV NT block switches have been written in an ON or OFF state, electrical signals will flow between wiring (routing) layers through NV NT blocks switches that are in ON state. Voltage levels are kept below write 0 and write 1 operation thresholds. In this example, electronic signals are kept below approximately four volts.

Second-Type of Dense Cross Point Switch Structures with NV NT Block Switches Self Aligned to Array Wiring Nonvolatile nanotube block switch matrix 22000 is illustrated in a plan view in FIG. 22A further above, and nonvolatile nanotube block switch 22100-1, representative of NV NT block switches 22100-1, 22100-2, 22100-3, and 22100-4, is illustrated above in cross section in FIGS. 22B and 22C and shows a first-type of NV NT block switches in which top (upper level) contact 22400-1 forms and upper level contact and also a mask layer that defines the NV NT block 22200-1 etched X and Y dimensions of nonvolatile nanotube block switch 22100-1.

In another embodiment, a second-type of NV NT block switches in which top (upper level) contacts are eliminated and replaced instead with combined top (upper level) contacts and array wires. For example, top (upper level) contact 22400-1 illustrated in FIGS. 22A-22C can be eliminated as illustrated further below in FIG. 23 and replaced with top (upper level) contact 23600-1' which is a region (portion) of array wire 23600-1.

FIG. 23A illustrates a plan view of nonvolatile nanotube block switch matrix 23000 of four vertically-oriented (3-D) two terminal nonvolatile nanotube block switches (23100-1, 23100-2, 23100-3, and 23100-4) in a two-by-two cross point switch array configuration Representative cross sections X2-X2' and Y2-Y2' through a portion of NV NT block switch 23100-1 as illustrated in FIG. 23A further illustrate elements of NV NT block switches in vertically-oriented (3-D) structures shown in FIGS. 23B and 23C. Details of second-type two terminal NV NT block switches and methods of fabrication, corresponding to two-terminal nonvolatile nanotube switches 23100-1, 23100-2, 23100-3, and 23100-4 are based on NV NT block switch fabrication described further in the incorporated patent references. However, instead of also using a top (upper level) contact as an etch mask to device NV NT block surfaces, a separate sacrificial (disposable) etch mask (not shown) in the shape of a top (upper level) contact and based on known industry patterning techniques is used to define the X and Y dimensions of NV NT block regions, such as NV NT block 23200-1 illustrated in FIGS. 23A-23C. NV NT block 23200-1 dimensions are then defined using preferred etch methods of fabrication in the incorporated patent references to form NV NT block 23200-1 as illustrated in FIGS. 23A-23C. NV NT blocks may be deposited using multiple spin-on layers or by spray on techniques as described in the incorporated patent references, e.g., U.S. patent application Ser. Nos. 11/835,651, 11/835,759, 11/835,845, 11/835,852, 11/835,856, and 11/835,865, all filed Aug. 8, 2007, entitled "Nonvolatile Nanotube Diodes and Nonvolatile Nanotube Blocks and Systems Using Same and Methods of Making Same."

Wire 23050-1 illustrated in FIG. 23A interconnects two terminal NV NT block switches 23100-1 and 23100-2 forming bottom (lower level) contacts, with each of these two terminal NV NT block switches having dimensions F×F and separated by a distance F. Wire 23050-2 interconnects two terminal NV NT block switches 23100-3 and 23100-4, forming bottom (lower level) contacts, with each of these two terminal NV NT block switches having dimensions F×F and separated by a distance F. While F represents minimum feature size to achieve maximum switch array density, dimensions larger than F may be used as needed and non-square cross sections may be used, such as rectangular and circular for example as described further above. Also, arrays larger than two-by-two, such as 100-by-100 or larger, may be formed for example.

Wire 23600-1 illustrated in FIG. 23A interconnects two terminal NV NT block switches 23100-1 and 23100-3, while also forming top (upper level) contacts such as top (upper level) contact 23600-1', with each of the two terminal NV NT block switches having dimensions F×F and separated by a distance F. Wire 23600-2 interconnects two terminal NV NT block switches 23100-2 and 23100-4, forming top (upper level) contacts such as top (upper level) contact 23600-1', with each of the two terminal NV NT block switches having dimensions F×F and separated by a distance F. Wires 23600-1 and 23600-2 are patterned on the surface of insulator 23500 that fills regions between two terminal NV NT block switches. While F represents minimum feature size to achieve maximum switch array density, dimensions larger than F may be used as needed and non-square cross sections may be used, such as rectangular and circular for example as described further above. Also, arrays larger than two-by-two, such as 100-by-100 or larger, may be formed for example.

FIG. 23B illustrates cross section X2-X2' through and along wire 23600-1 in the X direction. The Z direction represents the vertical orientation of two terminal NV NT block switch 23100-1 and also indicates a direction (vertical) of current flow in the ON state. Note that current may flow in up or down directions. Two terminal NV NT block switch 23100-1 includes bottom (lower level) contact 23050-1' which is a region formed by wire 23050-1, top (upper level) contact NV NT block 23600-1' which is formed by a region (portion) of wire 23600-1, and NV NT block 23200-1 in contact with both bottom (lower level) contact 23050-1' and top (upper level) contact 23600-1'. NV NT block 23200-1 may be switched between ON and OFF states multiple times as described in the incorporated patent references, e.g., U.S. patent application Ser. No. 11/280,786 U.S. patent application Ser. Nos. 11/835,651, 11/835,759, 11/835,845, 11/835, 852, 11/835,856, and 11/835,865, all filed Aug. 8, 2007, entitled "Nonvolatile Nanotube Diodes and Nonvolatile Nanotube Blocks and Systems Using Same and Methods of Making Same."

FIG. 23C illustrates cross section Y2-Y2' through and along wire 23050-1 in the Y direction. The Z direction represents the vertical orientation of two terminal NV NT block switch 23100-1 and also indicates a direction (vertical) of current flow in the ON state. Note that current may flow in up or down directions. Two terminal NV NT block switch 23100-1 includes bottom (lower level) contact 23050-1' which is a region (section) of wire 23050-1, top (upper level) contact 23600-1' which is formed by a region (section) of wire 23600-1, and NV NT block 23200-1 in contact with both bottom (lower level) contact 23050-1' and top (upper level) contact 23600-1'. NV NT block 23200-1 may be switched between ON and OFF states multiple times as described further above and in the incorporated patent references, e.g., U.S. patent application Ser. No. 11/280,786 and U.S. patent application Ser. Nos. 11/835,759, 11/835,845, 11/835,852, 11/835,856 and 11/835,865, all filed Aug. 8, 2007, entitled "Nonvolatile Nanotube Diodes and Nonvolatile Nanotube Blocks and Systems Using Same and Methods of Making Same," all filed Aug. 8, 2007.

Two terminal NV NT block switches 23100-1, 23100-2, 23100-3, and 23100-4 dimensions are approximately F in the horizontal direction, and F in the approximately orthogonal Y direction, where F is the minimum lithographically defined dimension at a particular technology node. The minimum separation with adjacent switches is F such that two terminal NV NT block switches 23100-1, 23100-2, 23100-3, and 23100-4 may be placed on a periodicity of 2F in the X and Y directions as illustrated in FIG. 23A. Individual two terminal NV NT block switches 23100-1, 23100-2, 23100-3, and 23100-4 occupy an area of $1F^2$, and $4F^2$ when placed in an array configuration separated from other switches by minimum distance F.

In operation, the electrical switching characteristics of NV NT block switches 23100-1, 23100-2, 23100-3, and 23100-4 are approximately the same as described further above with respect to switches 22100-1, 22100-2, 22100-3, and 22100-4.

In operation, FIG. 22D and corresponding NV NT block switch electrical ON and OFF states described further above illustrate various nonvolatile electrically programmed wiring (routing) connections for combinations of NV NT block switches 22100-1, 22100-2, 22100-3, and 22100-4 in NV NT block switch array 22000 in various combinations of ON and OFF states. Combinations of NV NT block switches 23100-1, 23100-2, 23100-3, and 23100-4 in NV NT block switch array 23000 correspond to those illustrated in FIG. 22D as described further above, except that NV NT block switches 23100-1, 23100-2, 23100-3, and 23100-4 correspond to NV NT block switches 22100-1, 22100-2, 22100-3, and 22100-4, respectively; V-wires 23050-1 and 23050-2 correspond to V-wires 22050-1 and 22050-2, respectively; and H-wires 23600-1 and 23600-2 correspond to H-wires 22600-1 and 22600-2, respectively.

INCORPORATED PATENT REFERENCES

This application is related to the following applications, the entire contents of which are incorporated herein by reference, and which are referred to above as the "incorporated patent references:"

U.S. patent application Ser. No. 10/128,118, now U.S. Pat. No. 6,706,402, filed on Apr. 23, 2002 and entitled "Nanotube Films and Articles;"

U.S. patent application Ser. No. 10/776,572, now U.S. Pat. No. 6,924,538, filed on Feb. 11, 2004 and entitled "Devices Having Vertically-Disposed Nanofabric Articles and Methods of Making the Same;"

U.S. patent application Ser. No. 10/864,186, now U.S. Pat. No. 7,115,901, filed on Jun. 9, 2004 and entitled "Non-Volatile Electromechanical Field Effect Devices and Circuits Using Same and Methods of Forming Same;"

U.S. patent application Ser. No. 10/917,794, now U.S. Pat. No. 7,115,960, filed on Aug. 13, 2004 and entitled "Nanotube-Based Switching Elements;"

U.S. patent application Ser. No. 10/918,085, now U.S. Pat. No. 6,990,009, filed on Aug. 13, 2004 and entitled "Nanotube-Based Switching Elements with Multiple Controls;"

U.S. patent application Ser. No. 09/915,093, now U.S. Pat. No. 6,919,592, filed on Jul. 25, 2001 and entitled "Electromechanical Memory Array Using Nanotube Ribbons and Method for Making Same;"

U.S. patent application Ser. No. 09/915,173, now U.S. Pat. No. 6,643,165, filed on Jul. 25, 2001 and entitled "Electromechanical Memory Having Cell Selection Circuitry Constructed With Nanotube Technology;"

U.S. patent application Ser. No. 09/915,095, now U.S. Pat. No. 6,574,130, filed on Jul. 25, 2001 and entitled "Hybrid Circuit Having Nanotube Electromechanical Memory;"

U.S. patent application Ser. No. 10/033,323, now U.S. Pat. No. 6,911,682, filed on Dec. 28, 2001 and entitled "Electromechanical Three-Trace Junction Devices;"

U.S. patent application Ser. No. 10/033,032, now U.S. Pat. No. 6,784,028, filed on Dec. 28, 2001 and entitled "Methods of Making Electromechanical Three-Trace Junction Devices;"

U.S. patent application Ser. No. 10/128,118, now U.S. Pat. No. 6,706,402, filed on Apr. 23, 2002 and entitled "Nanotube Films and Articles;"

U.S. patent application Ser. No. 10/128,117, now U.S. Pat. No. 6,835,591, filed Apr. 23, 2002 and entitled "Methods of Nanotube Films and Articles;"

U.S. patent application Ser. No. 10/341,005, filed on Jan. 13, 2003 and entitled "Methods of Making Carbon Nanotube Films, Layers, Fabrics, Ribbons, Elements and Articles;"

U.S. patent application Ser. No. 10/341,055, filed Jan. 13, 2003 and entitled "Methods of Using Thin Metal Layers to Make Carbon Nanotube Films, Layers, Fabrics, Ribbons, Elements and Articles;"

U.S. patent application Ser. No. 10/341,054, filed Jan. 13, 2003 and entitled "Methods of Using Pre-formed Nanotubes to Make Carbon Nanotube Films, Layers, Fabrics, Ribbons, Elements and Articles;"

U.S. patent application Ser. No. 10/341,130, filed Jan. 13, 2003 and entitled "Carbon Nanotube Films, Layers, Fabrics, Ribbons, Elements and Articles;"

U.S. patent application Ser. No. 10/776,059, now U.S. Patent Publication No. 2004/0181630, filed Feb. 11, 2004 and entitled "Devices Having Horizontally-Disposed Nanofabric Articles and Methods of Making the Same;"

U.S. patent application Ser. No. 10/936,119, now U.S. Patent Publication No. 2005/0128788, filed Sep. 8, 2004 and entitled "Patterned Nanoscopic Articles and Methods of Making the Same;"

U.S. Provisional Patent Application No. 60/855,109, entitled "Nonvolatile Nanotube Blocks," filed on Oct. 27, 2006;

U.S. Provisional Patent Application No. 60/840,586, entitled "Nonvolatile Nanotube Diode," filed on Aug. 28, 2006;

U.S. Provisional Patent Application No. 60/836,437, entitled "Nonvolatile Nanotube Diode," filed on Aug. 8, 2006;

U.S. Provisional Patent Application No. 60/836,343, entitled "Scalable Nonvolatile Nanotube Switches as Electronic Fuse Replacement Elements," filed on Aug. 8, 2006;

U.S. patent application Ser. No. 11/280,786, entitled "Two-Terminal Nanotube Devices and Systems and Methods of Making Same," filed on Nov. 15, 2005;

U.S. patent application Ser. No. 11/274,967, entitled "Memory Arrays Using Nanotube Articles With Reprogrammable Resistance," filed on Nov. 15, 2005;

U.S. patent application Ser. No. 11/280,599, entitled "Non-Volatile Shadow Latch Using a Nanotube Switch," filed on Nov. 15, 2005;

U.S. Pat. No. 4,944,836, entitled "Chem-Mech Polishing for Producing Coplanar Metal/Insulator Films on a Substrate", Issued Jul. 31, 1990; and U.S. Pat. No. 4,256,514, entitled "Method for Forming a Narrow Dimensioned Region on a Body", Issued Mar. 17, 1981.

The invention may be embodied in other specific forms without departing from the spirit or essential characteristics thereof. The present embodiments are therefore to be considered in respects as illustrative and not restrictive.

What is claimed is:

1. A covered nanotube switch, comprising:
    (a) a nanotube element comprising a nanotube fabric, the nanotube element having a top surface, a bottom surface, and a plurality of side surfaces;
    (b) first and second conductive terminals in contact with the nanotube element, wherein the first conductive terminal is disposed on and substantially covering the entire top surface of the nanotube element, and wherein the second conductive terminal contacts at least a portion of the bottom surface of the nanotube element; and
    (c) control circuitry in electrical communication with and capable of applying electrical stimulus to the first and second conductive terminals,
        wherein the nanotube element is capable of switching between a plurality of electronic states in response to a corresponding plurality of electrical stimuli applied by the control circuitry to the first and second conductive terminals, and
        wherein, for each different electronic state of the plurality of electronic states, the nanotube element provides an electrical pathway of corresponding different resistance between the first and second conductive terminals.

2. The covered nanotube switch of claim 1, wherein the first conductive terminal is also disposed on and substantially covers at least one side surface of the plurality of side surfaces.

3. The covered nanotube switch of claim 1, wherein the first conductive terminal is also disposed on and substantially covers the plurality of side surfaces.

4. The covered nanotube switch of claim 3, further comprising an insulator layer in contact with the bottom surface of the nanotube element, the insulator layer and the second conductive terminal together substantially covering the entire bottom surface of the nanotube element.

5. The covered nanotube switch of claim 1, further comprising an insulator layer in contact with at least one of the bottom surface of the nanotube element and one of the side surfaces of the nanotube element.

6. The covered nanotube switch of claim 5, wherein the insulator layer comprises one of $SiO_2$, SiN, and $Al_2O_3$.

7. The covered nanotube switch of claim 1, further comprising a passivation layer overlying at least the first conductive terminal, the passivation layer substantially sealing the first and second conductive terminals and the nanotube element to the environment.

8. The covered nanotube switch of claim 7, wherein the passivation layer comprises one of $SiO_2$, SiN, $Al_2O_3$, polyimide, phosphosilicate glass oxide, polyvinylidine fluoride, polypropylene carbonate, and polyethylene carbonate.

9. The covered nanotube switch of claim 1, wherein the second conductive terminal contacts substantially the entire bottom surface of the nanotube element.

10. The covered nanotube switch of claim 1, wherein the first and second conductive terminals each comprise a conductive material independently selected from the group consisting of Ru, Ti, Cr, Al, Al(Cu), Au, Pd, Pt, Ni, Ta, W, Cu, Mo, Ag, In, Ir, Pb, Sn, TiAu, TiCu, TiPd, PbIn, TiW, RuN, RuO, TiN, TaN, $CoSi_x$, and $TiSi_x$.

11. A covered nanotube switch, comprising:
    (a) a nanotube element comprising a nanotube fabric, the nanotube element having top and bottom surfaces;

(b) first and second conductive terminals in contact with the nanotube element and in spaced relation to each other;
(c) a first insulator layer in contact with the top surface of the nanotube element;
(d) a second insulator layer in contact with the bottom surface of the nanotube element,
   wherein the first and second conductive terminals and the first and second insulator layers together substantially surround the nanotube element; and
(e) control circuitry in electrical communication with and capable of applying electrical stimulus to the first and second conductive terminals,
   wherein the nanotube element is capable of switching between a plurality of electronic states in response to a corresponding plurality of electrical stimuli applied by the control circuitry to the first and second conductive terminals, and
   wherein, for each different electronic state of the plurality of electronic states, the nanotube element provides an electrical pathway of corresponding different resistance between the first and second conductive terminals.

12. The covered nanotube switch of claim 11, wherein at least a portion of the first insulator layer is separated from the top surface of the nanotube element by a gap.

13. The covered nanotube switch of claim 12, further wherein at least a portion of the second insulator layer is separated from the bottom surface of the nanotube element by a gap.

14. The covered nanotube switch of claim 11, wherein the first and second conductive terminals contact the bottom surface of the nanotube element and wherein the first insulator layer contacts the entire top surface of the nanotube element.

15. The covered nanotube switch of claim 11, wherein the first and second conductive terminals contact the top surface of the nanotube element.

16. The covered nanotube switch of claim 11, wherein the first conductive terminal contacts the bottom surface of the nanotube element and the second conductive terminal contacts the top surface of the nanotube element.

17. The covered nanotube switch of claim 11, wherein the first and second insulator layers each comprise an insulative material independently selected from the group consisting of $SiO_2$, SiN, and $Al_2O_3$.

18. The covered nanotube switch of claim 11, wherein the first and second conductive terminals each comprise a conductive material independently selected from the group consisting of Ru, Ti, Cr, Al, Al(Cu), Au, Pd, Pt, Ni, Ta, W, Cu, Mo, Ag, In, Ir, Pb, Sn, TiAu, TiCu, TiPd, PbIn, TiW, RuN, RuO, TiN, TaN, $CoSi_x$, and $TiSi_x$.

19. A covered nanotube switch, comprising:
(a) a nanotube element comprising a nanotube fabric, the nanotube element having top and bottom surfaces;
(b) first and second conductive terminals in contact with the nanotube element and in spaced relation to each other;
(c) a first insulator layer arranged over and in spaced relation to the top surface of the nanotube element;
(d) a second insulator layer arranged under and in spaced relation to the bottom surface of the nanotube element,
   wherein the first and second conductive terminals and the first and second insulator layers together substantially surround the nanotube element; and
(e) control circuitry in electrical communication with and capable of applying electrical stimulus to the first and second conductive terminals,
   wherein the nanotube element is capable of switching between a plurality of electronic states in response to a corresponding plurality of electrical stimuli applied by the control circuitry to the first and second conductive terminals, and
   wherein, for each different electronic state of the plurality of electronic states, the nanotube element provides an electrical pathway of corresponding different resistance between the first and second conductive terminals.

20. The covered nanotube switch of claim 19, wherein the first and second insulator layers each comprise an insulative material independently selected from the group consisting of $SiO_2$, SiN, and $Al_2O_3$.

21. The covered nanotube switch of claim 19, wherein the first and second conductive terminals each comprise a conductive material independently selected from the group consisting of Ru, Ti, Cr, Al, Al(Cu), Au, Pd, Pt, Ni, Ta, W, Cu, Mo, Ag, In, Ir, Pb, Sn, TiAu, TiCu, TiPd, PbIn, TiW, RuN, RuO, TiN, TaN, $CoSi_x$, and $TiSi_x$.

* * * * *